(12) United States Patent
Akaiwa et al.

(10) Patent No.: US 11,626,496 B2
(45) Date of Patent: Apr. 11, 2023

(54) HIGH VOLTAGE FIELD EFFECT TRANSISTORS WITH SELF-ALIGNED SILICIDE CONTACTS AND METHODS FOR MAKING THE SAME

(71) Applicant: SANDISK TECHNOLOGIES LLC, Addison, TX (US)

(72) Inventors: Jun Akaiwa, Yokkaichi (JP); Hiroshi Nakatsuji, Yokkaichi (JP); Masashi Ishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/348,305

(22) Filed: Jun. 15, 2021

(65) Prior Publication Data

US 2022/0399447 A1 Dec. 15, 2022

(51) Int. Cl.
| | | |
|---|---|---|
| H01L 29/417 | (2006.01) | |
| H01L 29/78 | (2006.01) | |
| H01L 29/40 | (2006.01) | |
| H01L 29/45 | (2006.01) | |
| H01L 27/092 | (2006.01) | |
| H01L 21/8238 | (2006.01) | |
| H01L 29/66 | (2006.01) | |

(52) U.S. Cl.
CPC ........... *H01L 29/41783* (2013.01); *H01L 21/823814* (2013.01); *H01L 21/823871* (2013.01); *H01L 21/823892* (2013.01); *H01L 27/0922* (2013.01); *H01L 29/401* (2013.01); *H01L 29/45* (2013.01); *H01L 29/6659* (2013.01); *H01L 29/7835* (2013.01)

(58) Field of Classification Search
CPC ....... H01L 29/41783; H01L 21/823814; H01L 21/823871; H01L 21/823892; H01L 27/0922; H01L 29/401; H01L 29/45; H01L 29/6659; H01L 29/7835
See application file for complete search history.

(56) References Cited

U.S. PATENT DOCUMENTS

| | | |
|---|---|---|
| 9,859,422 B2 | 1/2018 | Nishikawa et al. |
| 10,115,735 B2 | 10/2018 | Amano et al. |
| 10,224,407 B2 | 3/2019 | Chowdhury et al. |
| 10,256,099 B1 | 4/2019 | Akaiwa et al. |
| 10,355,017 B1 | 7/2019 | Nakatsuji et al. |
| 10,355,100 B1 | 7/2019 | Ueda et al. |
| 10,770,459 B2 | 9/2020 | Iwata et al. |

(Continued)

OTHER PUBLICATIONS

Agrawal, A. et al., "Barrier Height Reduction to 0.15eV and Contact Resistivity Reduction to 9.1 x 10-9 Ω-cm2 Using Ultrathin TiO2-x Interlayer between Metal and Silicon," 2013 Symposium on VLSI Technology Digest of Technical Papers, 2 pages, (2013).

(Continued)

*Primary Examiner* — David Vu
(74) *Attorney, Agent, or Firm* — The Marbury Law Group PLLC

(57) ABSTRACT

A field effect transistor includes a source region and a drain region formed within and/or above openings in a dielectric capping mask layer overlying a semiconductor substrate and a gate electrode. A source-side silicide portion and a drain-side silicide portion are self-aligned to the source region and to the drain region, respectively.

8 Claims, 46 Drawing Sheets

(56) References Cited

U.S. PATENT DOCUMENTS

| | | |
|---|---|---|
| 10,910,020 B1 | 2/2021 | Kodate et al. |
| 11,004,974 B1 | 5/2021 | Takimoto |
| 2016/0163702 A1 | 6/2016 | Wu et al. |
| 2016/0260712 A1 | 9/2016 | Yagishita |
| 2016/0351709 A1 | 12/2016 | Nishikawa et al. |
| 2017/0077096 A1* | 3/2017 | Wu .................... H01L 27/0922 |
| 2018/0247954 A1 | 8/2018 | Amano et al. |
| 2018/0248013 A1 | 8/2018 | Chowdhury et al. |
| 2018/0331118 A1 | 11/2018 | Amano |
| 2019/0296012 A1 | 9/2019 | Iwata et al. |

OTHER PUBLICATIONS

Ang, K.W. et a., "Effective Schottky Barrier Height modulation using dielectric dipoles for source/drain specific contact resistivity improvement," Electron Devices Meeting (IEDM) '88 Dec. 2012, Technical Digest, p. 439, DOI: 10.1109/IEDM.2012.6479068 (2012).

Nam, J.H. et al., Germanium on Insulator (GOI) Structure Locally Grown on Silicon Using Hetero Epitaxial Lateral Overgrowth, Proceedings of 2013 IEEE SOI-3D-Subthreshold Microelectronics Technology Unified Conference (S3S), p. 98, 7-10 (Abstract) Oct. 2013, Monterey, California, USA. DOI: 10.1109/S3S30572.2013.

Yu, H. et al., "Contact resistivities of metal-insulator-semiconductor contacts and metal-semiconductor contacts," Applied Physics Letters, vol. 108, No. 17: 171602 (2016).

Yu, H. et al., "MIS or MS? Source/Drain Contact Scheme Evaluation for 7nm Si CMOS Technology and Beyond," Conference: 16th International Workshop on Junction Technology, DOI: 10.1109/IWJT.2016.7486665 (2016).

U.S. Appl. No. 16/809,798, filed Mar. 5, 2020, SanDisk Technologies LLC.

U.S. Appl. No. 16/901,091, filed Jun. 15, 2020, SanDisk Technologies LLC.

U.S. Appl. No. 17/007,761, filed Aug. 28, 2020, SanDisk Technologies LLC.

U.S. Appl. No. 17/007,823, filed Aug. 31, 2020, SanDisk Technologies LLC.

U.S. Appl. No. 17/063,084, filed Oct. 5, 2020, SanDisk Technologies LLC.

U.S. Appl. No. 17/063,145, filed Oct. 5, 2020, SanDisk Technologies LLC.

U.S. Appl. No. 17/063,182, filed Oct. 5, 2020, SanDisk Technologies LLC.

U.S. Appl. No. 17/188,271, filed Mar. 1, 2021, SanDisk Technologies LLC.

U.S. Appl. No. 17/348,328, filed Jun. 15, 2021, SanDisk Technologies LLC.

Notice of Allowance and Fee(s) Due for U.S. Appl. No. 17/348,328, dated Oct. 3, 2022, 13 pages.

Togo, M. et al., "Transistors With Stepped Contact via Structures and Methods of Forming the Same," U.S. Appl. No. 17/362,121, filed Jun. 29, 2021.

* cited by examiner

HIGH VOLTAGE FIELD EFFECT TRANSISTORS WITH SELF-ALIGNED SILICIDE CONTACTS AND METHODS FOR MAKING THE SAME

FIELD

The present disclosure relates generally to the field of semiconductor devices and specifically to high voltage field effect transistors including self-aligned silicide contacts and methods of making the same.

BACKGROUND

Prior art high voltage field effect transistors often suffer from surface breakdown voltage. Such transistors often have a complex extended low doped drain (LDD) structure to improve surface breakdown characteristics at the expense of process complexity and increased cost.

SUMMARY

According to an aspect of the present disclosure, a semiconductor structure including a first field effect transistor is provided. The first field effect transistor comprises: a first doped well located within a substrate and embedding a first source region and a first drain region; a first gate dielectric, a first gate electrode, and a dielectric capping mask overlying the first doped well, wherein the dielectric capping mask comprises a vertically-extending portion that laterally surrounds the first gate electrode, a top portion that overlies a peripheral region of a top surface of the first gate electrode, and a horizontally-extending portion that contacts a top surface of the first gate dielectric outside an area of the first gate electrode; a source-side opening extending through the first gate dielectric and the horizontally-extending portion of the dielectric capping mask and overlying the first source region; a drain-side opening extending through the first gate dielectric and the horizontally-extending portion of the dielectric capping mask and overlying the first drain region; a first source-side metal-semiconductor alloy portion contacting a top surface of the first source region and located within the source-side opening; and a first drain-side metal-semiconductor alloy portion contacting a top surface of the first drain region and located within the drain-side opening.

According to another aspect of the present disclosure, a method of forming a semiconductor structure is provided, which comprises: forming a first doped well within a substrate in a first device region; forming a gate dielectric layer over the first doped well; forming a first gate electrode over the gate dielectric layer; forming a dielectric capping mask layer over the first gate electrode and the gate dielectric layer; patterning the dielectric capping mask layer and the gate dielectric layer, wherein a patterned portion of the gate dielectric layer comprises a first gate dielectric and a patterned portion of the dielectric capping mask layer comprises a dielectric capping mask including a source-side opening and a drain-side opening located on opposite sides of the first gate electrode; forming a first source region and a first drain region by implanting dopants into portions of the first doped well located underneath the source-side opening and the drain-side opening; and forming a source-side metal-semiconductor alloy portion and a drain-side metal-semiconductor alloy portion within the source-side opening and the drain-side opening, respectively.

According to yet another aspect of the present disclosure, a semiconductor structure including a first field effect transistor is provided. The first field effect transistor comprises: a first doped well located within a substrate; a first gate dielectric, a first gate electrode, and a first sidewall spacer that overlie the first doped well; a dielectric capping mask comprising a vertically-extending portion that laterally surrounds the first gate electrode, a top portion that overlies a peripheral region of a top surface of the first gate electrode, and a horizontally-extending portion that overlies the first doped well outside an area of the first gate dielectric, wherein the dielectric capping mask comprises a source-side opening and a drain-side opening; a raised first source region located within the source-side opening in the dielectric capping mask and providing a first p-n junction with the first doped well; and a raised first drain region located within the drain-side opening in the dielectric capping mask and providing a second p-n junction with the first doped well.

According to still another aspect of the present disclosure, a method of forming a semiconductor structure is provided, which comprises: forming a first doped well within a substrate; forming a first gate dielectric, a first gate electrode, and a first sidewall spacer over the first doped well in a first device region; forming a dielectric capping mask layer over the first gate electrode and the gate dielectric layer; patterning the dielectric capping mask layer, wherein a patterned portion of the continuous gate dielectric layer comprises a dielectric capping mask including a source-side opening and a drain-side opening located on opposite sides of the first gate electrode; and forming a first source region and a first drain region by selectively growing first portions of a semiconductor material within the source-side opening and the drain-side opening, respectively.

According to an embodiment of the present disclosure, a semiconductor structure including a first field effect transistor is provided. The first field effect transistor comprises: a first doped well located within a substrate and embedding a first buried source region and a first buried drain region; a first gate dielectric and a first gate electrode overlying the first doped well; a dielectric capping mask layer including a vertically-extending portion that laterally surrounds the first gate electrode, a top portion that overlies a peripheral region of a top surface of the first gate electrode, and a horizontally-extending portion that contacts a top surface of the first doped well and comprises a source-side opening overlying the first buried source region and a drain-side opening overlying the first buried drain region; a first source-side metal-semiconductor alloy portion electrically connected to the first buried source region, and having a larger horizontal cross-sectional area than the first buried source region; and a first drain-side metal-semiconductor alloy portion electrically connected to the first buried drain region, and having a larger horizontal cross-sectional area than the first buried drain region.

According to another aspect of the present disclosure, a method of forming a semiconductor structure is provided, which comprises: forming a first doped well within a substrate; forming a first gate dielectric, a first gate electrode, and a first sidewall spacer over the first doped well within a first device region; forming a dielectric capping mask layer on physically exposed surfaces of the first gate electrode, the first sidewall spacer, and the first doped well; forming a source-side opening and a drain-side opening through a horizontally-extending portion of the dielectric capping mask layer that contacts the first doped well; forming a first buried source region and a first buried drain region by implanting dopants through the source-side opening and through the drain-side opening; forming a first raised source region and a first raised drain region by selectively growing first portions of a semiconductor material through, laterally over, and above, the source-side opening and the drain-side opening, respectively; and forming a first source-side metal-semiconductor alloy portion and a first drain-side metal-semiconductor alloy portion by depositing first portions of a metallic material on the first raised source region and the first raised drain region and inducing formation of first metal-semiconductor alloy portions.

DETAILED DESCRIPTION

Figure 1:
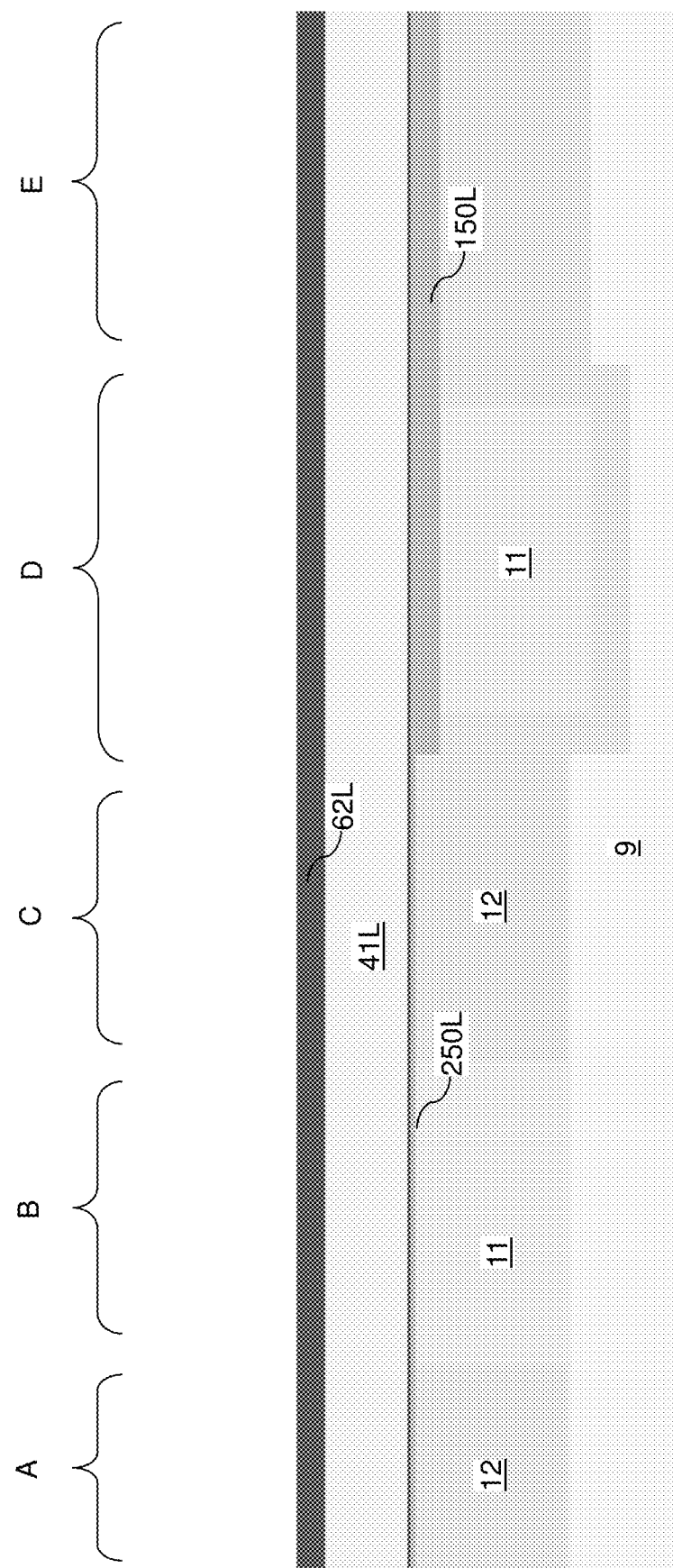
FIG. 1 is a vertical cross-sectional view of a first exemplary structure after formation of doped wells, gate dielectric layers, a first gate electrode material layer, and a dielectric pad layer according to a first embodiment of the present disclosure.

Embodiments of the present disclosure are directed to field effect transistors including self-aligned silicide contacts and methods of making the same, the various aspects of which are now described in detail. A high voltage NMOS transistor with self-aligned silicide contact regions may have a different structure from the low voltage and high voltage PMOS transistors, which leads to a lower contact resistance and lower junction leakage for the high voltage NMOS transistor. The transistors may be used in a driver (i.e., peripheral) circuit of a memory device, such as a three-dimensional memory device, for example a three-dimensional NAND memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

Referring to FIG. 1, a first exemplary structure according to a first embodiment of the present disclosure is illustrated. The first exemplary structure may include plural device regions, which can include, for example, device region A, device region B, device region C, device region D, and/or device region E. Device region A may be used to form a capacitor and/or resistor, device region B may be used to form a low voltage NMOS transistor, device region C may be used to form a low voltage PMOS transistor, device region D may be used to form a high voltage NMOS transistor, device region E may be used to form a high voltage PMOS transistor. The high voltage transistors may operate at a higher voltage and may contain a thicker gate dielectric than the low voltage transistors. The first exemplary structure includes a semiconductor substrate. As used herein, a "semiconductor substrate" refers to a substrate that includes at least one semiconductor material portion, i.e., at least one portion of a semiconductor material.

The semiconductor substrate includes a semiconductor material layer 9, and various doped wells (11, 12) formed by implantation of electrical dopants therein. In one embodiment, the semiconductor substrate can be a bulk semiconductor substrate consisting of the semiconductor material layer 9 (e.g., single crystal silicon wafer), or can be a semiconductor-on-insulator (SOI) substrate including a buried insulator layer (such as a silicon oxide layer) underlying the semiconductor material layer 9, and a handle substrate underlying the buried insulator layer. In one embodiment, the semiconductor material layer 9 may include a first single crystalline semiconductor material having a doping of a first conductivity type, which may be p-type or n-type. The semiconductor material layer 9 may include electrical dopants of the first conductivity type at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed.

The semiconductor material of the semiconductor material layer 9 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor material layer 9 can be in a range from 0.5 mm to 2 mm in case the semiconductor material layer 9 is a bulk semiconductor substrate. In case the semiconductor material layer 9 is a semiconductor-on-insulator substrate, the thickness of the top semiconductor material layer within the semiconductor material layer 9 may be in a range from 100 nm to 1,000 nm, although lesser and greater thicknesses can also be employed.

The doped wells (11, 12) include first doped wells 11 having a doping of the first conductivity type, and second doped wells 12 having a doping of a second conductivity type that is the opposite of the first conductivity type. For example, the first conductivity type can be p-type and the second conductivity type can be n-type, or vice versa. For example, the first doped wells 11 may comprise p-type wells to form NMOS transistors in device regions B and D, and the second type wells 12 may comprise n-type wells to form PMOS transistors in device regions C and E. Generally, the atomic concentration of electrical dopants within each of the doped wells (11, 12) can be optimized to provide suitable device characteristic for the semiconductor devices to be subsequently formed. For example, at least one, or each, of the doped wells (11, 12) may be employed to provide a body region for a respective set of field effect transistors, and the atomic concentration of electrical dopants in the doped wells (11, 12) can be selected to provide optimal level of on-current and off-current for the field effect transistors to be subsequently formed. In an illustrative example, each of the doped wells (11, 12) may include electrical dopants of a respective conductivity type at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed.

While the present disclosure is described employing an embodiment in which a particular type of doped well (11 or 12) is formed within each device region (A, B, C, D, E), embodiments are expressly contemplated herein in which the type of doped wells (11, 12) for each device region (A, B, C, D, E) is independently selected or one or more device regions lack a doped well.

Gate dielectric layers (150L, 250L) can be formed on the top surface of the semiconductor substrate, such as on the top surfaces of the doped wells (11, 12). For example, a first gate dielectric layer 150L having a first thickness and a first dielectric material composition can be formed over a first subset of the doped wells (11, 12) in the high voltage transistor device regions D and E, and a second gate dielectric layer 250L having a second thickness and a second dielectric material composition can be formed over a second subset of the doped wells (11, 12) in the low voltage transistor regions B and C and in the capacitor device region A. The first gate dielectric layer 150L may be thicker than the second gate dielectric layer 250L. In one embodiment, the first gate dielectric layer 150L may include silicon oxide having a thickness in a range from 6 nm to 60 nm, such as from 12 nm to 30 nm, and the second gate dielectric layer may include silicon oxide and/or a dielectric metal oxide material (such as aluminum oxide, lanthanum oxide, hafnium oxide, etc.) having a thickness in a range from 1 nm to 6 nm, such as from 2 nm to 4 nm.

A first gate electrode material layer 41L can be deposited over the first gate dielectric layer 150L and the second gate dielectric layer 250L. The first gate electrode material layer 41L includes a first gate electrode material, which may include a semiconductor material such as polysilicon, or may include a metallic material such as an elemental transition metal or a metallic nitride material. In one embodiment, the first gate electrode material layer 41L may include, and/or may consist essentially of, undoped polysilicon. The first gate electrode material layer 41L can have a thickness in a range from 30 nm to 200 nm, such as from 60 nm to 100 nm, although lesser and greater thicknesses may also be employed.

A dielectric pad layer 62L can be formed over the first gate electrode material layer 41L. The dielectric pad layer 62L includes a dielectric material that may be employed as a stopping material during a subsequently planarization process. For example, the dielectric pad layer 62L may include silicon nitride, and may have a thickness in a range from 20 nm to 100 nm, although lesser and greater thicknesses may also be employed.

In an illustrative example, a first doped well 11 can be formed within a substrate in a first device region such as device region D, and a second doped well 12 can laterally surround, and can form a p-n junction at an interface with, the first doped well 11. The second doped well 12 can have contact the first gate dielectric layer 150L in a second device region, such as device region E.

Figure 2:
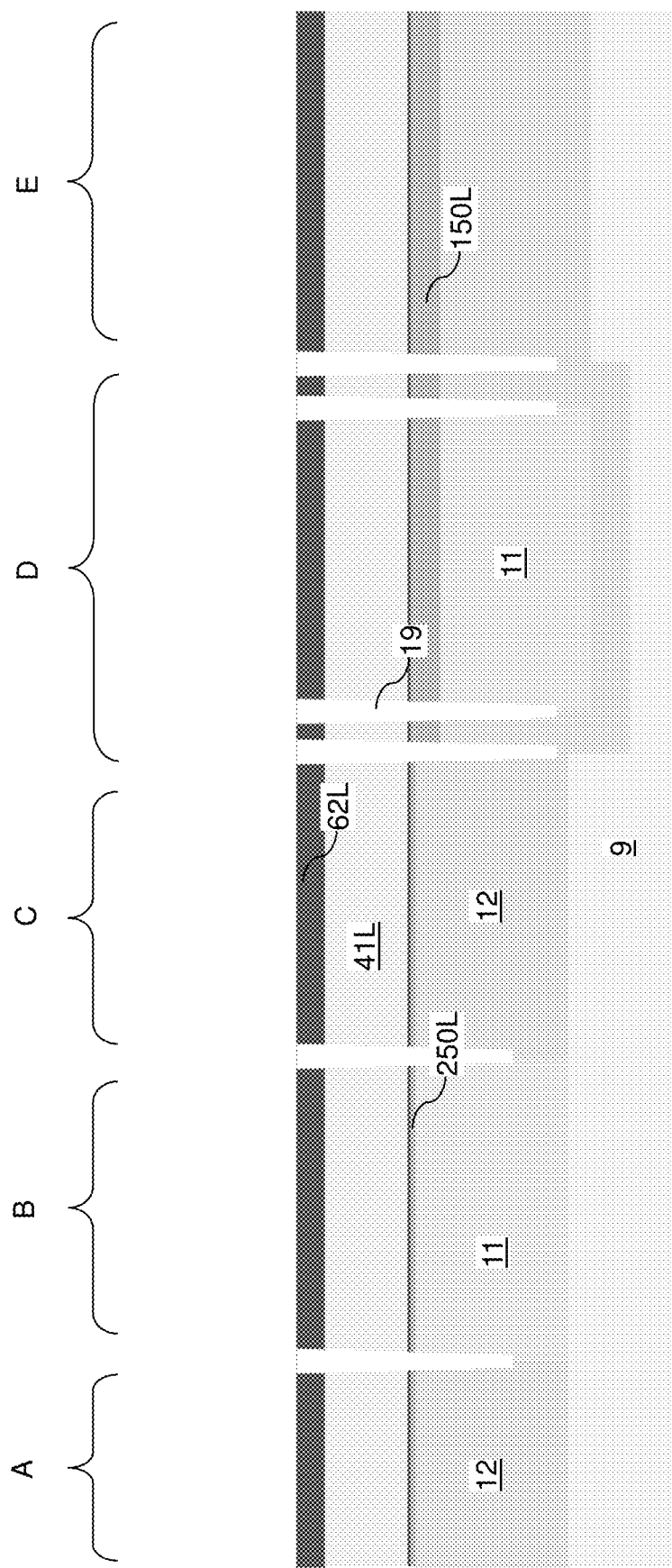
FIG. 2 is a vertical cross-sectional view of the first exemplary structure after formation of shallow trenches according to the first embodiment of the present disclosure.

Referring to FIG. 2, a photoresist layer (not shown) can be applied over the dielectric pad layer 62L, and can be lithographically patterned to form moat-shaped openings therethrough. In one embodiment, each moat-shaped opening may laterally surround a respective device area, such as an area for a combination of a body region, a source region, and a drain region of a field effect transistor.

An anisotropic etch process can be performed to transfer the pattern of the openings in the photoresist layer through the dielectric pad layer 62L, the first gate electrode material layer 41L, the gate dielectric layers (150L, 250L), and an upper region of the semiconductor substrate that include the doped wells (11, 12). Shallow isolation trenches 19 can be formed in volumes from which materials of the dielectric pad layer 62L, the first gate electrode material layer 41L, the gate dielectric layers (150L, 250L), and the doped wells (11, 12) are etched. The photoresist layer can be subsequently removed, for example, by ashing.

Figure 3:
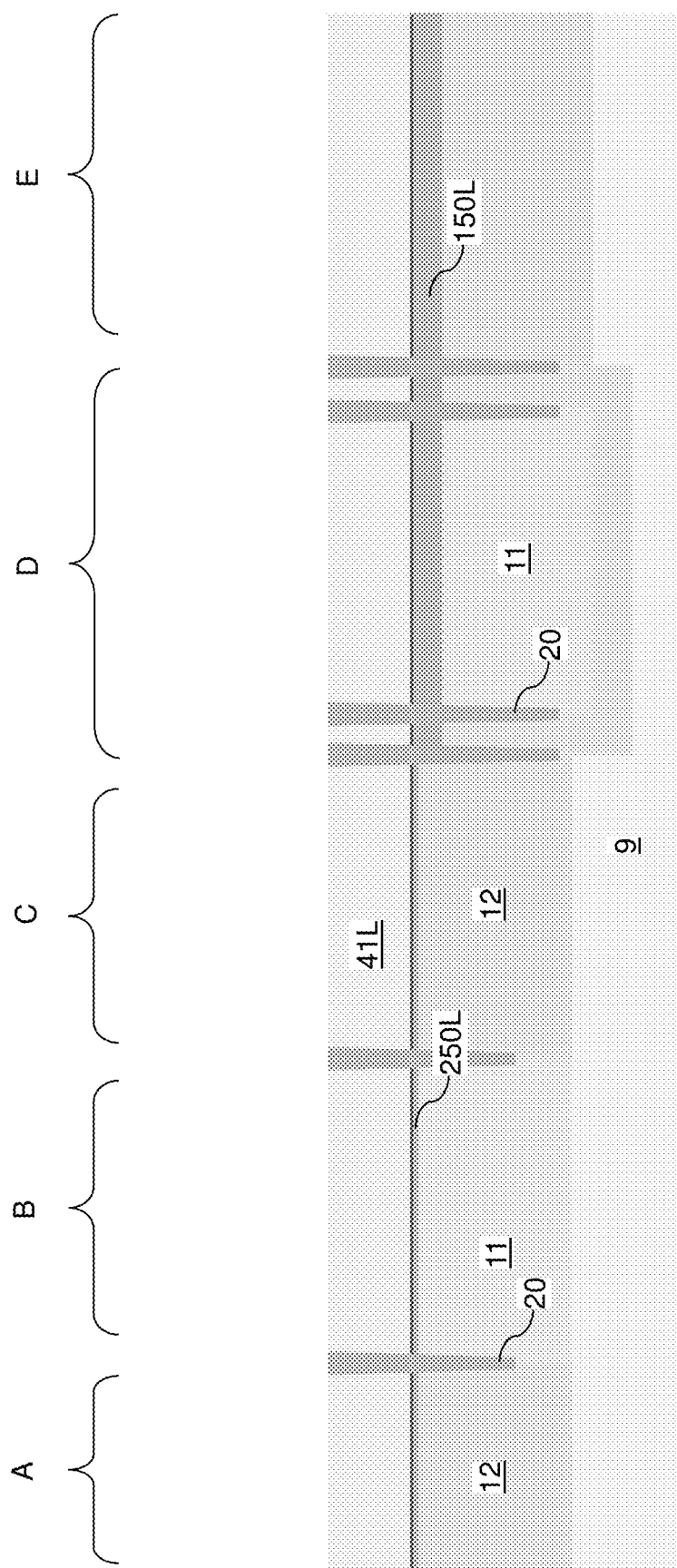
FIG. 3 is a vertical cross-sectional view of the first exemplary structure after formation of shallow trench isolation structures according to the first embodiment of the present disclosure.

Referring to FIG. 3, a dielectric fill material such as undoped silicate glass or a doped silicate glass can be deposited in the shallow isolation trenches 19. Excess portions of the dielectric fill material that overlie the top surface of the dielectric pad layer 62L can be removed by a planarization process such as a chemical mechanical polishing (CMP) process. Remaining portions of the dielectric fill material can be vertically recessed below the horizontal plane including the top surface of the dielectric pad layer 62L by a recess etch process, which may include an isotropic etch process such as a wet etch process. The recess depth may be in about the same as the thickness of the dielectric pad layer 62L. Remaining portions of the dielectric fill material filling the shallow isolation trenches 19 comprise shallow trench isolation structures 20. The dielectric pad layer 62L can be subsequently removed selective to the materials of the shallow trench isolation structures 20 and the first gate electrode material layer 41L. For example, if the dielectric pad layer 62L comprises silicon nitride, a wet etch process employing hot phosphoric acid can be performed to remove the dielectric pad layer 62L.

Figure 4:
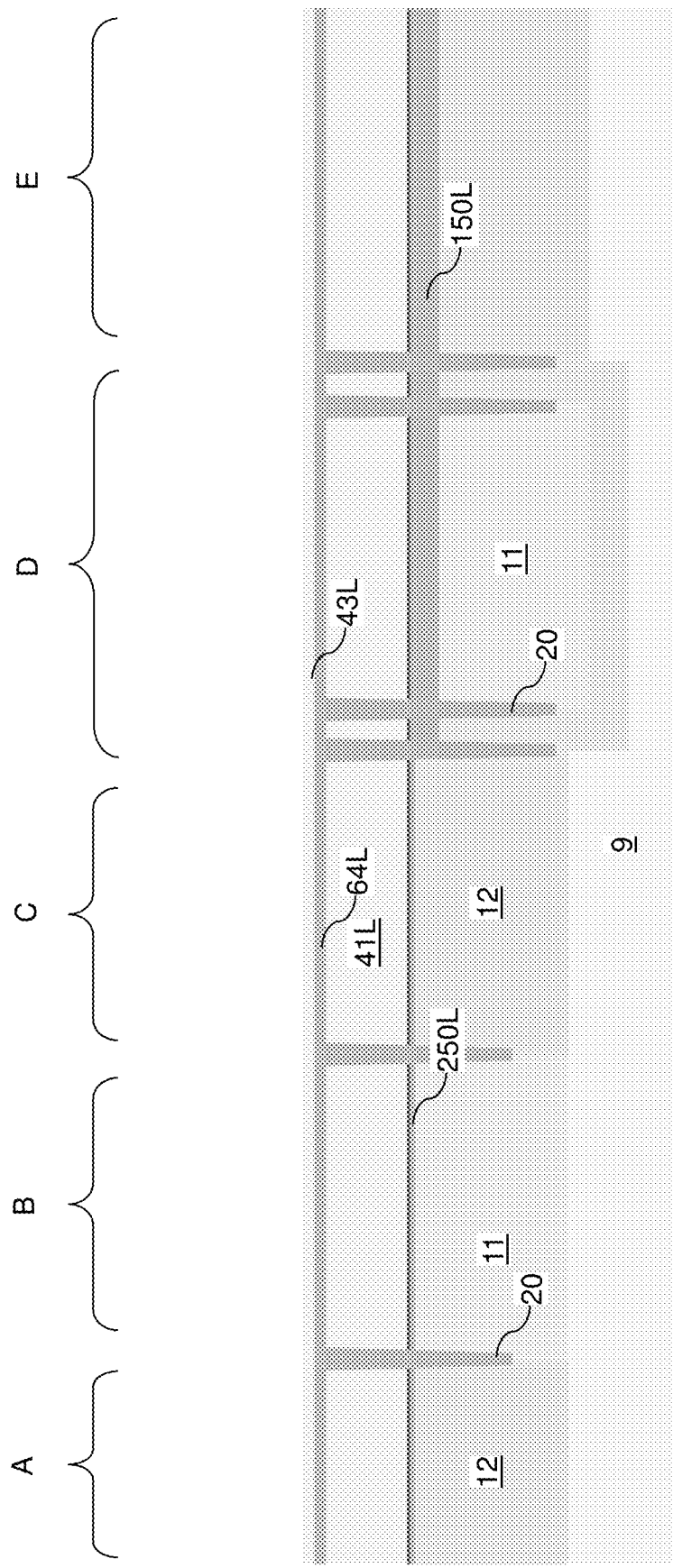
FIG. 4 is a vertical cross-sectional view of the first exemplary structure after deposition of a node dielectric layer and a second gate electrode material layer according to the first embodiment of the present disclosure.

Referring to FIG. 4, a node dielectric layer 64L and a second gate electrode material layer 43L may be optionally deposited. The node dielectric layer 64L, if employed, includes a dielectric material that may be employed as a node dielectric for a capacitor to be formed in device region A. In one embodiment, the node dielectric layer 64L may include silicon oxide, or a dielectric material having a dielectric constant of 7.9 or higher, such as silicon nitride, or a dielectric metal oxide having a dielectric constant greater than 7.9, such as aluminum oxide, hafnium oxide, lanthanum oxide, etc. The thickness of the node dielectric layer 64L can be in a range from 3 nm to 10 nm, although lesser and greater thicknesses may also be employed.

The second gate electrode material layer 43L includes a second gate electrode material, which may include a semiconductor material such as polysilicon, or may include a metallic material such as an elemental transition metal or a metallic nitride material. In one embodiment, the second gate electrode material layer 43L may include, and/or may consist essentially of, undoped polysilicon. The second gate electrode material layer 43L can have a thickness in a range from 10 nm to 100 nm, such as from 20 nm to 50 nm, although lesser and greater thicknesses may also be employed.

Figure 5:
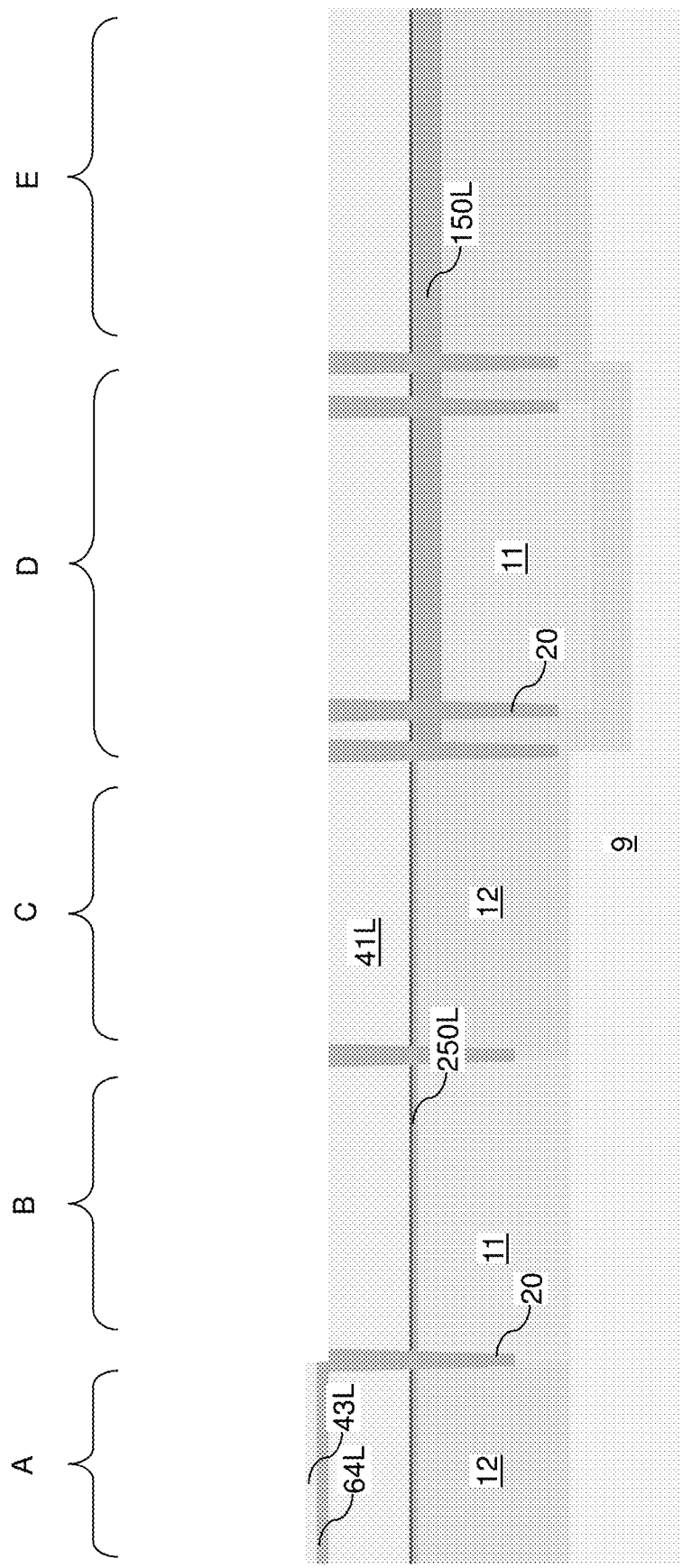
FIG. 5 a vertical cross-sectional view of the first exemplary structure after patterning the second gate electrode material layer and the node dielectric layer according to the first embodiment of the present disclosure.

Referring to FIG. 5, a photoresist layer (not shown) can be applied over the second gate electrode material layer 43L, and can be lithographically patterned to cover a capacitor region, such as device region A. Etch processes may be performed to etch unmasked portions of the second gate electrode material layer 43L and the node dielectric layer 64L. The patterned photoresist layer may be employed as an etch mask during the etch processes. The photoresist layer can be subsequently removed, for example, by ashing.

Figure 6:
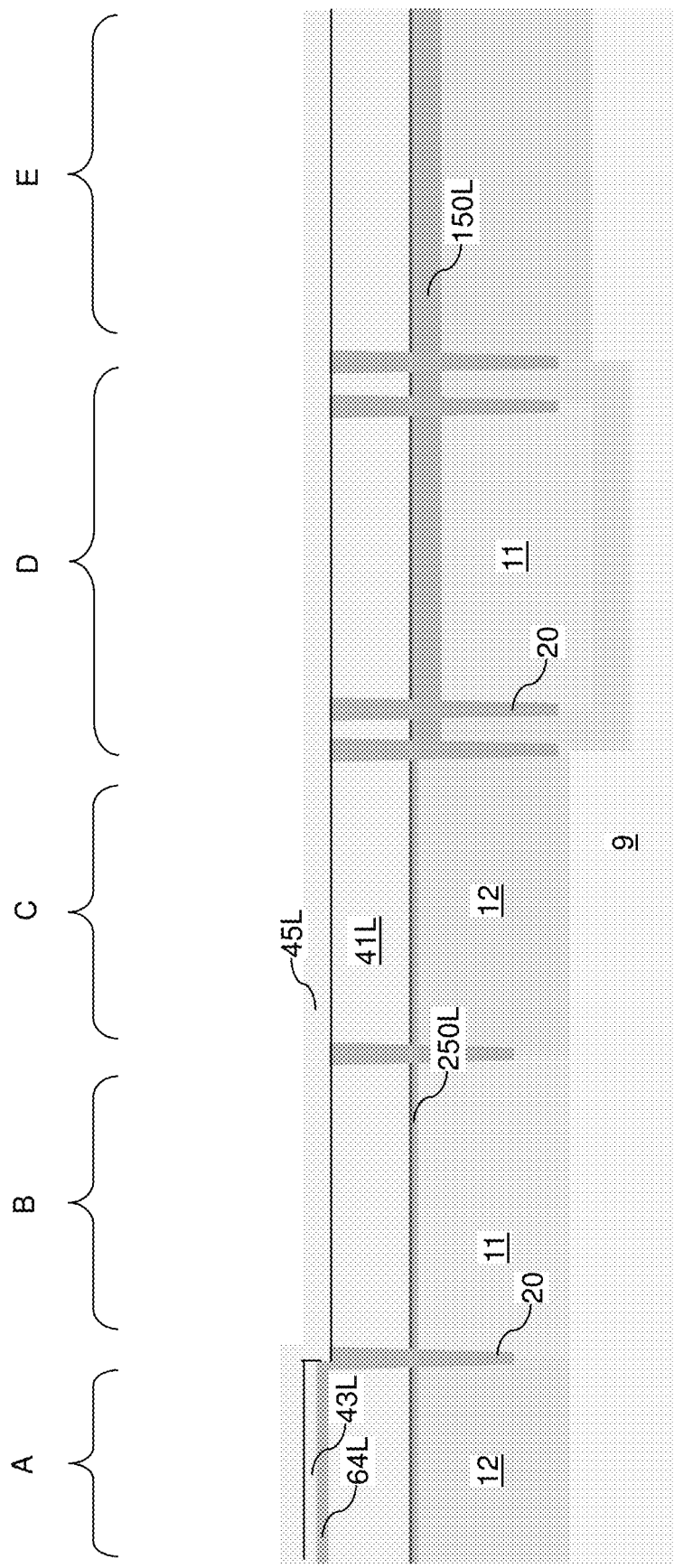
FIG. 6 is a vertical cross-sectional view of the first exemplary structure after deposition of a third gate electrode material layer according to the first embodiment of the present disclosure.

Referring to FIG. 6, a third gate electrode material layer 45L can be deposited on the physically exposed surfaces of the first gate electrode material layer 41L and on the physically exposed surfaces of the second gate electrode material layer 43L. The third gate electrode material layer 45L includes a third gate electrode material, which may include a semiconductor material such as polysilicon, or may include a metallic material such as an elemental transition metal or a metallic nitride material. In one embodiment, the third gate electrode material layer 45L may include, and/or may consist essentially of, undoped polysilicon. The third gate electrode material layer 45L can have a thickness in a range from 10 nm to 100 nm, such as from 20 nm to 50 nm, although lesser and greater thicknesses may also be employed.

Figure 7:
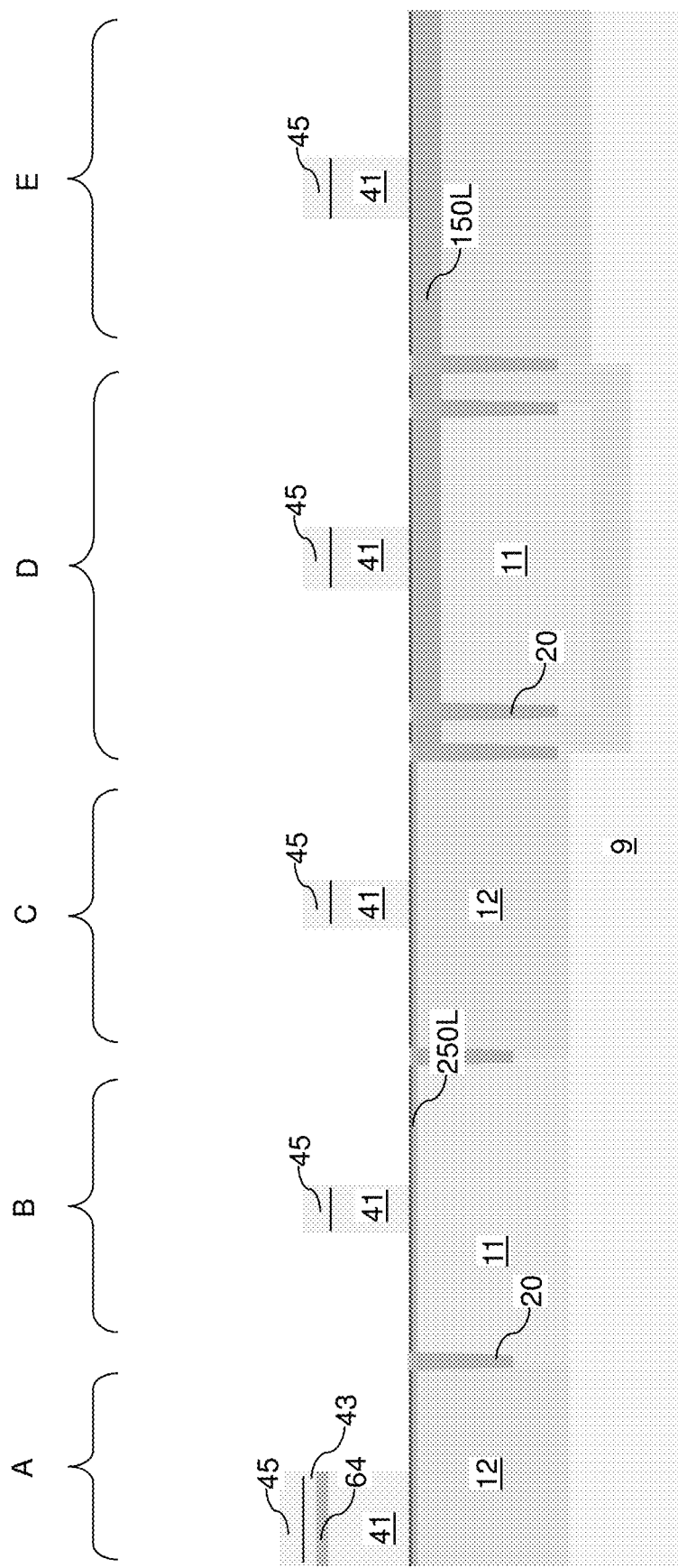
FIG. 7 is a vertical cross-sectional view of the first exemplary structure after formation of gate electrodes and capacitor electrodes according to the first embodiment of the present disclosure.

Referring to FIG. 7, a photoresist layer (not shown) can be applied over the third gate electrode material layer 45L, and can be lithographically patterned to form a pattern of gate electrodes and capacitor plates. In each device region (B, C, D, E) in which field effect transistors are to be formed, the photoresist layer can be patterned into a pattern of gate electrodes for the field effect transistors to be subsequently formed. In a capacitor region, such as the device region A, in which a capacitor structure is to be subsequently formed, the photoresist layer can be patterned into a pattern of a capacitor plate.

An anisotropic etch process can be performed to transfer the pattern in the photoresist layer through the gate electrode material layers (45L, 43L, 41L) and the node dielectric layer 64L. Each continuous set of patterned portions of the gate electrode material layers (45L, 41L) in device regions (B, C, D, E) in which field effect transistors are to be formed constitutes a gate electrode (41, 45). Each gate electrode (41, 45) may include a bottom gate electrode portion 41 and a top gate electrode portion 45. A patterned portion of the second and third gate electrode material layers (43L, 45L) in the device region A in which a capacitor structure is to be subsequently formed, constitutes a top electrode (43, 45) of a capacitor structure. A patterned portion of the first gate electrode material layer 41L in the device region A in which the capacitor structure is to be subsequently formed constitutes a bottom electrode 41 of the capacitor structure. In one embodiment, the anisotropic etch process that transfers the pattern in the photoresist layer through the gate electrode material layers (45L, 43L, 41L) can be selective to the materials of the gate dielectric layers (150L, 250L). Each remaining patterned portion of the node dielectric layer 64L comprises a node dielectric (i.e., a capacitor dielectric) 64. A contiguous set of a bottom electrode 41, a node dielectric 64, and a top electrode (43, 45) comprises a capacitor structure (41, 64, 43, 45) in device region A. The photoresist layer can be subsequently removed, for example, by ashing.

In an illustrative example, the various gate electrodes (41, 45) may include first gate electrodes (41, 45) that are formed in the high voltage transistor device regions (such as device regions D and E) over the first gate dielectric layer 150L, and second gate electrodes (41, 45) that are formed in low voltage transistor device regions (such as device regions B and C) over the second gate dielectric layer 250L. The first gate electrodes may be wider than the second gate electrodes.

Figure 8:
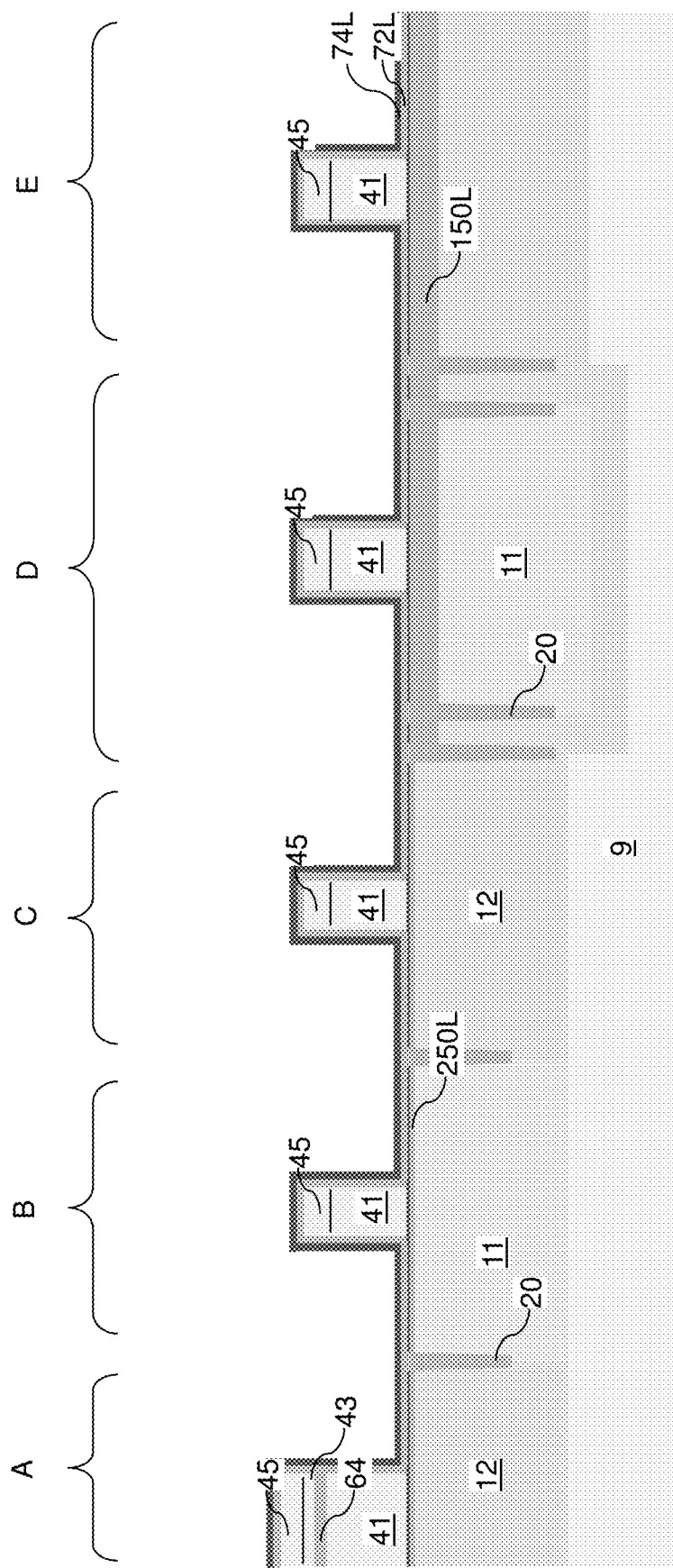
FIG. 8 is a vertical cross-sectional view of the first exemplary structure after formation of dielectric gate liner layers according to the first embodiment of the present disclosure.

Referring to FIG. 8, at least one dielectric gate liner (e.g., spacer) layer (72L, 74L) can be optionally deposited by a conformal deposition process. For example, the at least one dielectric gate liner layer (72L, 74L) may include a first dielectric gate liner layer 72L and a second dielectric gate liner layer 74L. In one embodiment, the first dielectric gate liner layer 72L may include a silicon oxide liner having a thickness in a range from 2 nm to 20 nm, and the second dielectric gate liner layer 74L may include a silicon nitride liner having a thickness in a range from 2 nm to 20 nm.

Figure 9:
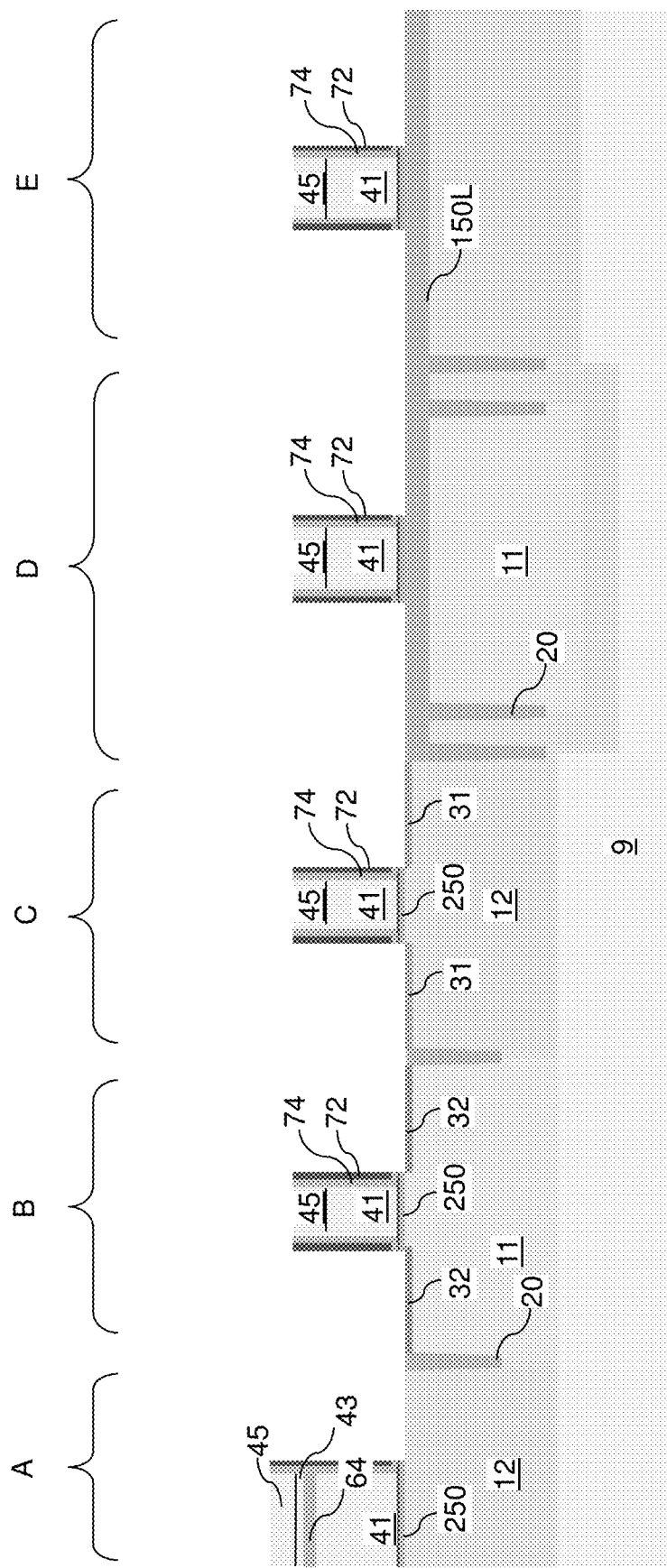
FIG. 9 is a vertical cross-sectional view of the first exemplary structure after formation of dielectric gate liners and source/drain extension regions according to the first embodiment of the present disclosure.

Referring to FIG. 9, an anisotropic etch process (such as a sidewall spacer reactive ion etch process) can be performed to etch horizontally-extending portions of the at least one dielectric gate liner layer (72L, 74L). Remaining patterned vertically-extending portions of the first dielectric gate liner layer 72L comprise first dielectric gate liners (e.g., sidewall spacers) 72, and remaining patterned vertically-extending portions of the second dielectric gate liner layer 74L comprise second dielectric gate liners (e.g., sidewall spacers) 74. Each of the first dielectric gate liners 72 and the second dielectric gate liners 74 laterally surrounds a respective gate electrode (41, 45) or a capacitor structure (41, 64, 43, 45). In one embodiment, the second gate dielectric layer 250L can be patterned into gate dielectrics 250, which have the second thickness and are also referred to as second-thickness gate dielectrics 250. The first gate dielectric layer 150L may be partially etched.

Masked ion implantation processes can be performed to implant dopants of the first conductivity type and dopants of the second conductivity type into respective low voltage transistor device regions B and C. For example, a first ion implantation mask layer (such as a first patterned photoresist layer) can be formed above the first exemplary structure to cover all device regions other than a low voltage PMOS device region C in which a first-conductivity type field effect transistor including source/drain regions having a doping of the first conductivity type is to be subsequently formed. The first ion implantation mask layer can include an opening within the device region C. A first ion implantation process can be performed to form first-conductivity-type source/drain extension regions 31 having a doping of the first conductivity type (e.g., p-type) in an upper portion of a second doped well 12 having a doping of the second conductivity type (e.g., n-type). The first-conductivity-type source/drain extension regions 31 can include dopants of the first conductivity type at an average atomic concentration in a range from $1.0 \times 10^{17}/cm^3$ to $1.0 \times 10^{20}/cm^3$, such as from $3.0 \times 10^{18}/cm^3$ to $3.0 \times 10^{19}/cm^3$, although lesser and greater average atomic concentrations can also be employed. The first ion implantation mask layer can be subsequently removed.

A second ion implantation mask layer (such as a second patterned photoresist layer) can be formed above the first exemplary structure to cover all device regions other than the low voltage NMOS device region B in which a second-conductivity type field effect transistor including source/drain regions having a doping of the second conductivity type (e.g., n-type) is to be subsequently formed. The second ion implantation mask layer can include an opening within the device region B. A second ion implantation process can be performed to form second-conductivity-type source/drain extension regions 32 having a doping of the second conductivity type (e.g., n-type) in an upper portion of a first doped well 11 having a doping of the first conductivity type. The second-conductivity-type source/drain extension regions 32 can include dopants of the second conductivity type at an average atomic concentration in a range from $1.0 \times 10^{17}/cm^3$ to $1.0 \times 10^{20}/cm^3$, such as from $3.0 \times 10^{18}/cm^3$ to $3.0 \times 10^{19}/cm^3$, although lesser and greater average atomic concentrations can also be employed. The second ion implantation mask layer can be subsequently removed. Alternatively, the order of ion implantation steps may be reversed and regions 32 may be formed prior to regions 31.

Figure 10:
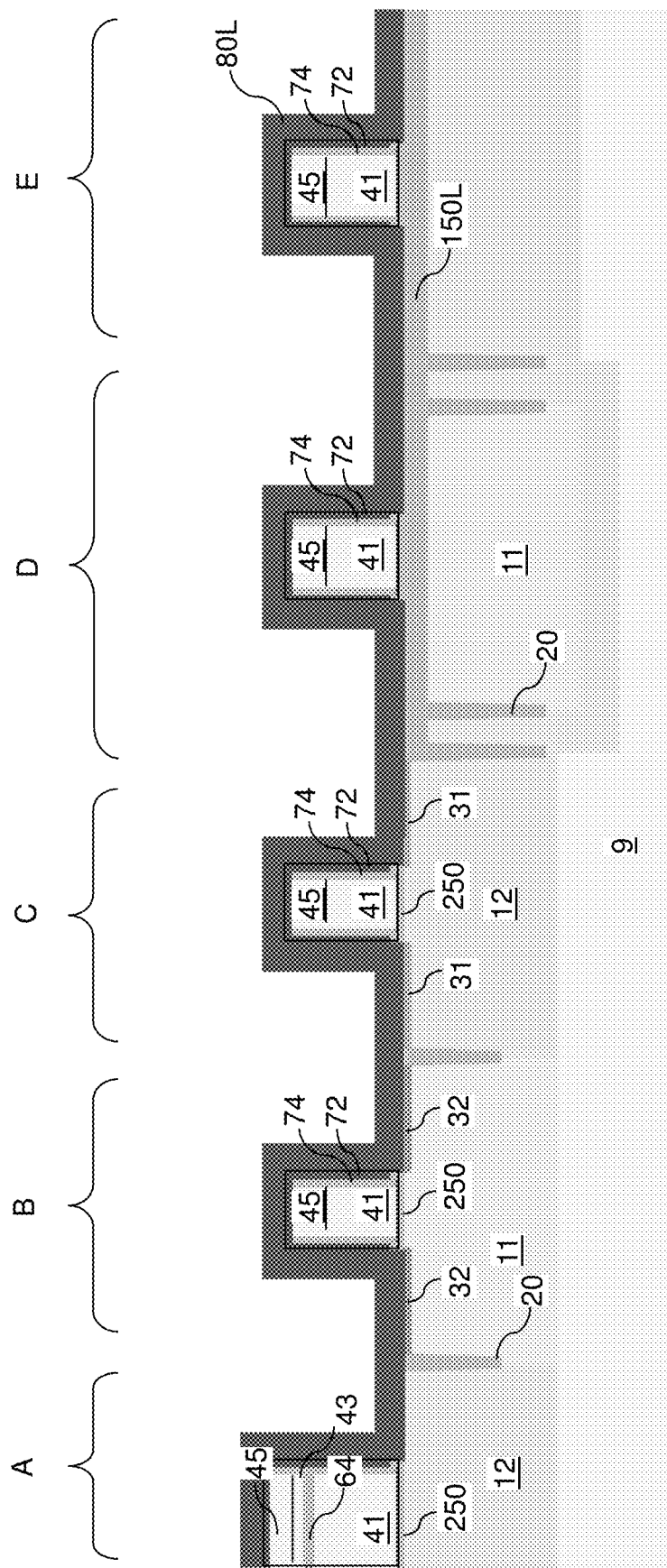
FIG. 10 is a vertical cross-sectional view of the first exemplary structure after formation of a dielectric capping mask layer according to the first embodiment of the present disclosure.

Referring to FIG. 10, a dielectric capping mask layer 80L can be formed over the gate electrodes (41, 45), the capacitor structure (41, 64, 43, 45), and the dielectric gate liners (72, 74) by a conformal deposition process, such as a chemical vapor deposition process. The dielectric capping mask layer 80L includes a dielectric material such as silicon nitride, silicon oxide, or a dielectric metal oxide. In one embodiment, the dielectric capping mask layer 80L includes silicon nitride. The thickness of the dielectric capping mask layer 80L can be in a range from 10 nm to 200 nm, such as from 20 nm to 100 nm, although lesser and greater thicknesses may also be employed. The thickness of the dielectric capping mask layer 80L can be less than the height of a gate electrode (41, 45). Thus, a top surface of a horizontally-extending portion of the dielectric capping mask layer 80L that does not overlie a gate electrode (41, 45) can be located within a horizontal plane including a top surface of the gate electrode (41, 45).

Figure 11:
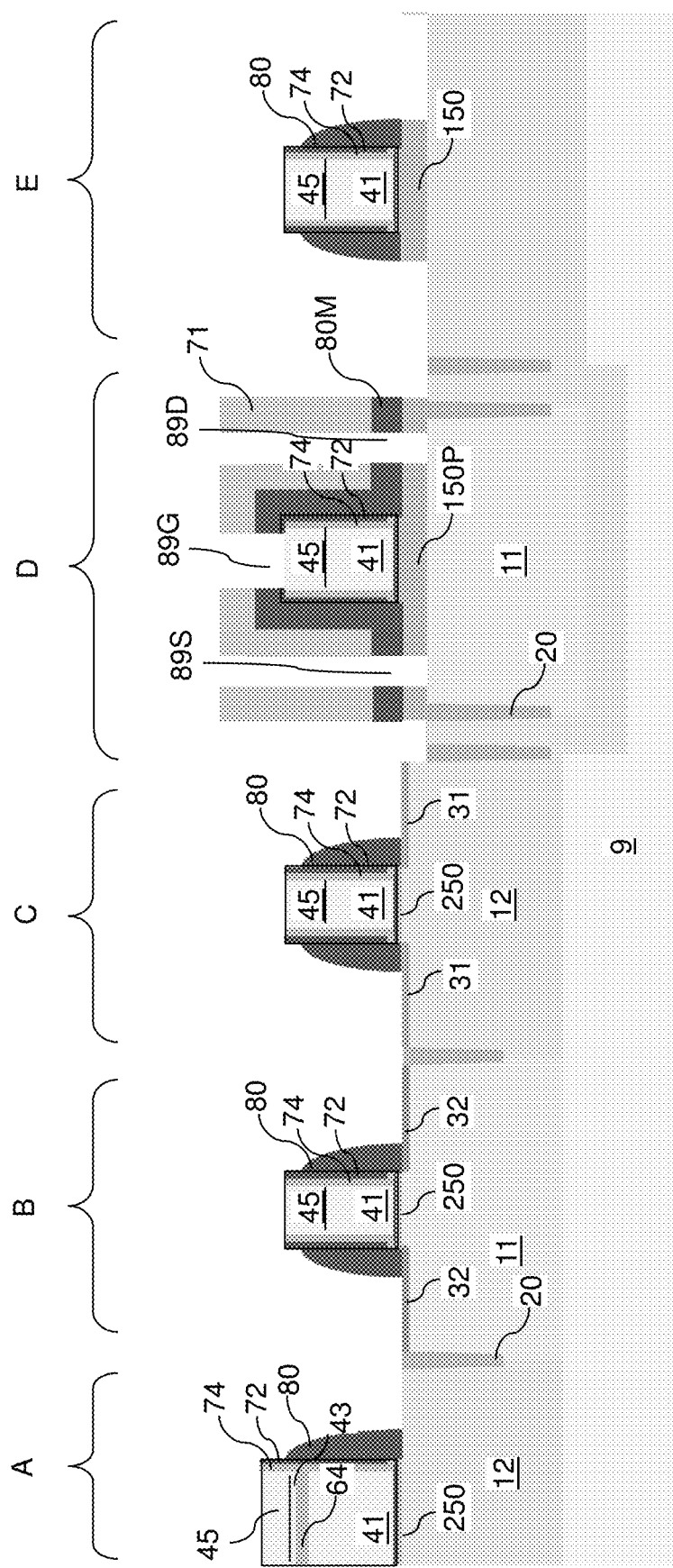
FIG. 11 is a vertical cross-sectional view of the first exemplary structure after formation of sidewall spacers, a dielectric capping mask, and gate dielectrics according to the first embodiment of the present disclosure.

Referring to FIG. 11, a photoresist layer 71 can be applied over the first exemplary structure, and can be lithographically patterned to cover the high voltage NMOS device region D without covering the other device regions (A, B, C, E). The photoresist layer 71 can be patterned to form openings therein. The openings in the photoresist layer 71 can be formed above the gate electrode (41, 45) and above areas of in which NMOS source region and drain region are to be subsequently formed. Further, the photoresist layer 71 can be patterned not to cover areas in which well contact semiconductor regions are to be subsequently formed within the first device region. In one embodiment, the areas in which the source region and the drain region are to be subsequently formed can be located above the area of an underlying first doped well 11, and the areas in which the well contact semiconductor regions are to be subsequently formed within the area of an underlying second doped well 12.

In one embodiment, the patterned photoresist layer 71 overlies a predominant portion of the device region D and does not overlie an adjacent high voltage device region E. As used herein, a predominant portion refers to a portion that is at least 50% of the entirety of a volume. A shallow trench isolation structure 20 may laterally surround the first doped well 11, and may be laterally surrounded by a portion of the second doped well 12. The portion of the second doped well 12 may be laterally surrounded by another shallow trench isolation structure 20.

An anisotropic etch process can be performed to remove horizontally-extending unmasked portions of the dielectric capping mask layer 80L and the first gate dielectric layer 150L. The patterned photoresist layer 71 can be employed as an etch mask during the anisotropic etch process. A remaining portion of the dielectric capping mask layer 80L that underlies the patterned photoresist layer 71 comprises a dielectric capping mask 80M. The dielectric capping mask comprises openings therein, which include a source-side opening 89S located on one side of a gate electrode (41, 45) within the device region D in which the patterned photoresist layer 71 is present, a drain-side opening 89D located on another side of the gate electrode (41, 45) within the device region D, and a gate-side opening 89G located above the gate electrode (41, 45) of the high voltage NMOS device region D.

Each vertically-extending remaining portion of the dielectric capping mask layer 80L located in the remaining regions A, B, C and E comprises a sidewall spacer 80. Each sidewall spacer 80 laterally surrounds a respective gate electrode (41, 45) or a respective capacitor structure (41, 64, 43, 45).

A patterned portion of the first gate dielectric layer 150L underlying the dielectric capping mask 80M comprises a first gate dielectric 150P, which is also referred to as a first-thickness gate dielectric 150P. The first gate dielectric 150P includes an opening that underlies, and is vertically coincident with, the source-side opening 89S in the dielectric capping mask 80M, and include another opening that underlies, and is vertically coincident with, the drain-side opening 89D in the dielectric capping mask 80M. As used herein, a sidewall of a first element and a sidewall of a second element are vertically coincident if the sidewall of the first element and the sidewall of the second element overlie or underlie each other, and are located within a same vertical plane, which may, or may not, have a curvature in a horizontal cross-sectional view. The first gate dielectric 150P underlies a first gate electrode (41, 45) and the dielectric capping mask 80M.

A patterned portion of the first gate dielectric layer 150L underlying a combination of a gate electrode (41, 45) (which is herein referred to as a second gate electrode) and a sidewall spacer 80 in the high voltage PMOS device region E comprises a second gate dielectric 150, which is also referred to as an additional first-thickness gate dielectric. Generally, patterned portions of the first gate dielectric layer 150L comprises a first gate dielectric 150P and a second gate dielectric 150, and patterned portions of the dielectric capping mask layer 80L comprise a dielectric capping mask 80M including a source-side opening 89S and a drain-side opening 89D located on opposite sides of the first gate electrode (41, 45) in region D, and sidewall spacers 80 in regions A, B, C and E.

In one embodiment, a surface (such as a top surface) of the second doped well 12 is physically exposed upon patterning the dielectric capping mask layer 80L and the gate dielectric layer 150L, for example, in the second device region (such as device region E) which contains including the second gate dielectric 150, the second gate electrode (41, 45) and the sidewall spacer 80.

In one embodiment, an outer sidewall of the first gate dielectric 150P can be vertically coincident with an outer sidewall of the dielectric capping mask 80M. The source-side opening vertically extends through the stack of the first gate dielectric 150P and the dielectric capping mask 80M. In one embodiment, a first inner sidewall of the first gate dielectric 150P laterally surrounds the source-side opening 89S and is vertically coincident with a first inner sidewall of the dielectric capping mask 80M that laterally surrounds the source-side openings 89S. In one embodiment, a second inner sidewall of the first gate dielectric 150P laterally surrounds the drain-side opening 89D and is vertically coincident with a second inner sidewall of the dielectric capping mask 80M that laterally surrounds the drain-side opening 89D. In one embodiment, the top portion of the dielectric capping mask 80M comprises an opening within an area of the first gate electrode (41, 45).

Figure 12:
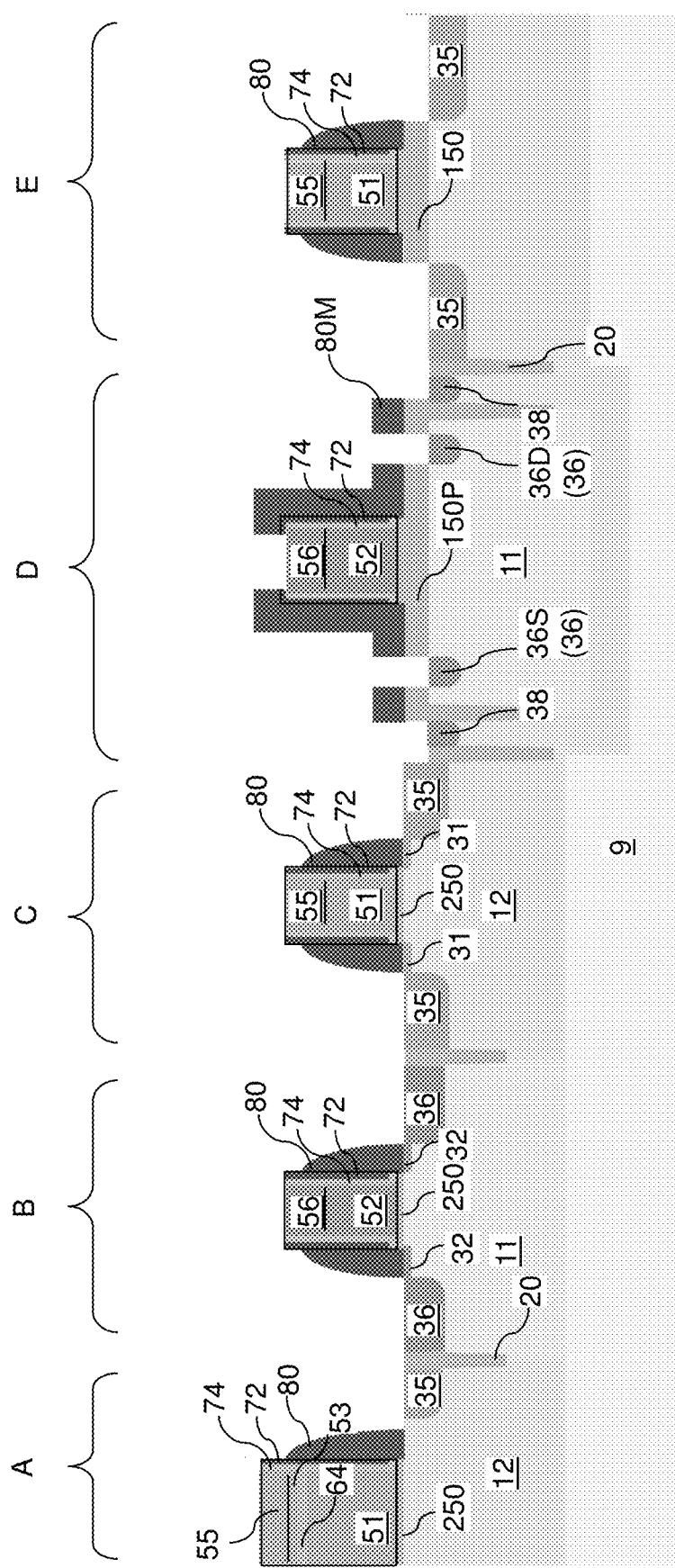
FIG. 12 is a vertical cross-sectional view of the first exemplary structure after formation of source/drain regions according to the first embodiment of the present disclosure.

Referring to FIG. 12, masked ion implantation processes can be performed to implant dopants of the first conductivity type and dopants of the second conductivity type into respective regions. For example, a third ion implantation mask layer (such as a third patterned photoresist layer) can be formed above the first exemplary structure to cover the NMOS device regions B and D, but expose the capacitor and PMOS device regions A, C and E in which the capacitor structure and the first-conductivity type field effect transistors are to be subsequently formed. The third ion implantation mask layer can include openings within the device regions (such as device region A, device region C, and device region E) in which the capacitor structure and the first-conductivity type field effect transistors are to be subsequently formed. A third ion implantation process can be performed to form first-conductivity-type source/drain regions 35 having a doping of the first conductivity type in upper portions of the second doped well 12 having a doping of the second conductivity type. The first-conductivity-type source/drain regions 35 may incorporate segments of volumes of the first-conductivity-type source/drain extension regions 31 formed at the processing steps of FIG. 9. In case the gate electrodes (41, 45) that are not masked by the third ion implantation mask layer include a semiconductor material, the unmasked gate electrodes (41, 45) can be converted into first-conductivity-type (e.g., p-type) doped semiconductor gate electrodes (51, 55) including doped semiconductor materials having a doping of the first conductivity type. Specifically, each unmasked bottom gate electrode portion 41 may be converted into a first-conductivity-type bottom gate electrode portion 51, and each unmasked top gate electrode portion 45 may be converted into a first-conductivity-type top gate electrode portion 55. The bottom electrode 41 of the capacitor structure can be converted into a first-conductivity-type bottom electrode 51, and the top electrode (43, 45) of the capacitor structure can be converted into a first-conductivity-type top electrode (53, 55). The first source/drain regions 35 can include dopants of the first conductivity type at an average atomic concentration in a range from $1.0 \times 10^{19}/cm^3$ to $2.0 \times 10^{21}/cm^3$, such as from $2.0 \times 10^{20}/Cm^3$ to $1.0 \times 10^{21}/cm^3$, although lesser and greater average atomic concentrations can also be employed. The third ion implantation mask layer can be subsequently removed, for example, by ashing.

A fourth ion implantation mask layer (such as a fourth patterned photoresist layer) can be formed above the first exemplary structure to cover the capacitor and PMOS device regions A, C and E, and exposed the NMOS device regions B and D in which the second-conductivity type field effect transistors are to be subsequently formed. The fourth ion implantation mask layer can include openings within the device regions B and D in which the second-conductivity type field effect transistors are to be subsequently formed. A fourth ion implantation process can be performed to form second-conductivity-type source/drain regions 36 having a doping of the second conductivity type in upper portions of the first doped wells 11 having a doping of the first conductivity type. The second-conductivity-type source/drain regions 36 may include a first source region 36S that is formed under the source-side opening in the dielectric capping mask 80M, and a first drain region 36D that is formed under the drain-side opening in the dielectric capping mask 80M in the high voltage PMOS device region D. The second-conductivity-type source/drain regions 36 may incorporate segments of volumes of the second-conductivity-type source/drain extension regions 32 formed at the processing steps of FIG. 9. Well contact semiconductor regions 38 can be formed within physically exposed portions of the second doped well 12 within the first device region D. In case the gate electrodes (41, 45) that are not masked by the fourth ion implantation mask layer include a semiconductor material, the unmasked gate electrodes (41, 45) can be converted into second-conductivity-type doped semiconductor gate electrodes (52, 56) including doped semiconductor materials having a doping of the second conductivity type. Specifically, each unmasked bottom gate electrode portion 41 may be converted into a second-conductivity-type bottom gate electrode portion 52, and each unmasked top gate electrode portion 45 may be converted into a second-conductivity-type top gate electrode portion 56. The second source/drain regions 36 and the well contact semiconductor regions 38 can include dopants of the second conductivity type at an average atomic concentration in a range from $1.0 \times 10^{19}/cm^3$ to $2.0 \times 10^{21}/cm^3$, such as from $2.0 \times 10^{20}/cm^3$ to $1.0 \times 10^{21}/cm^3$, although lesser and greater average atomic concentrations can also be employed. The fourth ion implantation mask layer can be subsequently removed, for example, by ashing.

Generally, the first source region 36S and the first drain region 36D can be formed in the first device region (such as the high voltage NMOS device region D) by implanting dopants of the second conductivity type into portions of the first doped well 11 located underneath the source-side opening 89S and the drain-side opening 89D. A second doped well 12 can laterally surround and can form a p-n junction at an interface with the first doped well 11 in the first device region (such as device region D). A well contact semiconductor region 38 can be formed in an upper region of the second doped well 12 by implanting dopants of the first conductivity type therein. Thus, the well contact semiconductor region 38 overlies the second doped well 12. The first field effect transistor formed in the first device region can comprise a first high voltage field effect transistor (e.g., high voltage NMOS transistor) in a triple-well configuration that has a first doped well 11 that is surrounded by a second doped well 12 that can be independently biased through the well contact semiconductor region 38.

According to an aspect of the present disclosure, a first gate dielectric 150P, a first gate electrode (52, 56), and a dielectric capping mask 80M overlying the first doped well 11 can be formed in a first device region, such as device region D. The dielectric capping mask 80M comprises a vertically-extending portion that laterally surrounds the first gate electrode (52, 56), a top portion that overlies a peripheral region of a top surface of the first gate electrode (52, 56), and a horizontally-extending portion that contacts a top surface of the first gate dielectric 150P outside an area of the first gate electrode (52, 56). A source-side opening 89S extends through the first gate dielectric 150P and the horizontally-extending portion of the dielectric capping mask 80M and overlies the first source region 36S, and a drain-side opening 89D extends through the first gate dielectric 150P and the horizontally-extending portion of the dielectric capping mask 80M and overlies the first drain region 36D.

Figure 13:
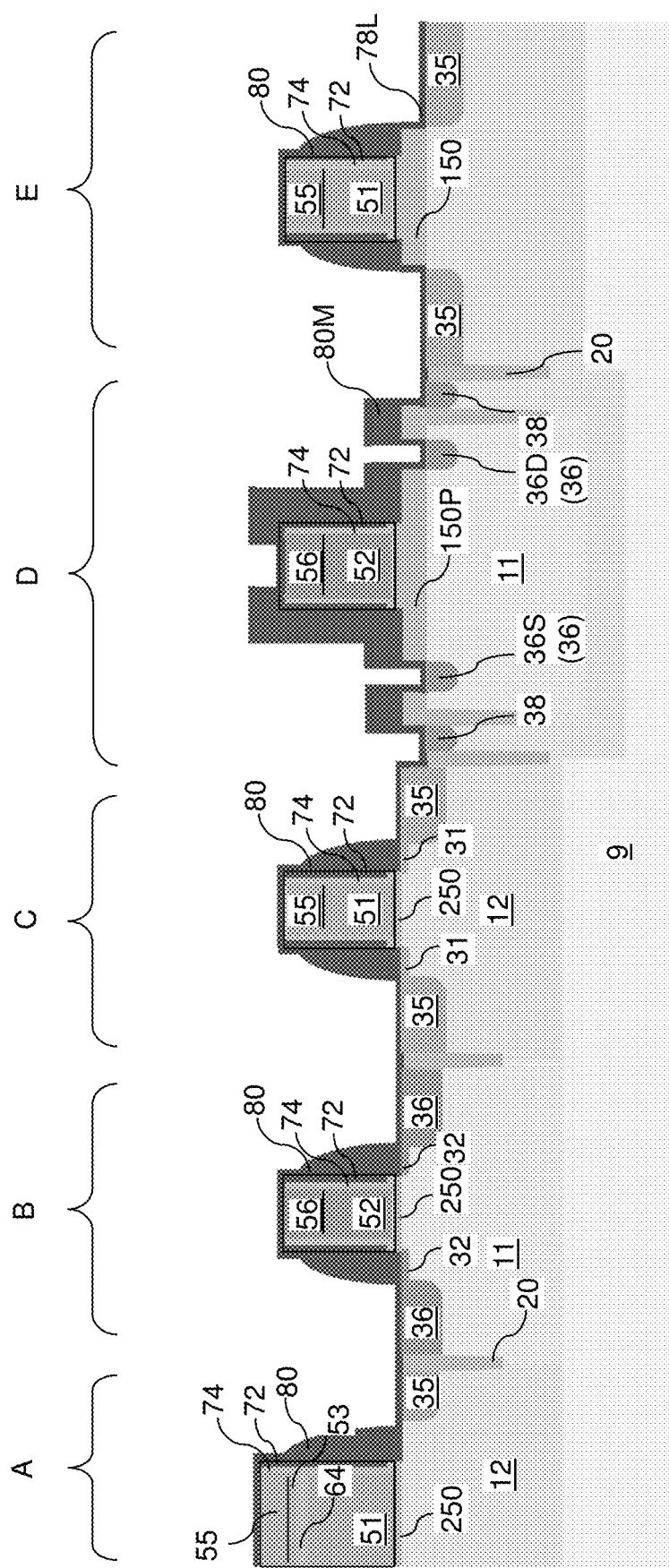
FIG. 13 is a vertical cross-sectional view of the first exemplary structure after formation of a dielectric spacer material layer according to the first embodiment of the present disclosure.

Referring to FIG. 13, a dielectric spacer material layer 78L can be formed on the physically exposed surfaces of the source/drain regions (35, 36), the well contact semiconductor regions 38, the dielectric capping mask 80M, and the sidewall spacers 80. The dielectric spacer material layer 78L includes a dielectric material that may be different from, or may be the same as, the material of the dielectric capping mask 80M. The dielectric spacer material layer 78L may comprise silicon oxide, silicon nitride, or a dielectric metal oxide such as aluminum oxide, lanthanum oxide, or hafnium oxide. The thickness of the dielectric spacer material layer 78L can be less than one half of the lateral dimension of the first source region 36S and can be less than one half of the lateral dimension of the drain-side opening 89D. For example, the dielectric spacer material layer 78L may have a thickness in a range from 2 nm to 40 nm, such as from 4 nm to 20 nm, although lesser and greater thicknesses may also be employed.

Figure 14:
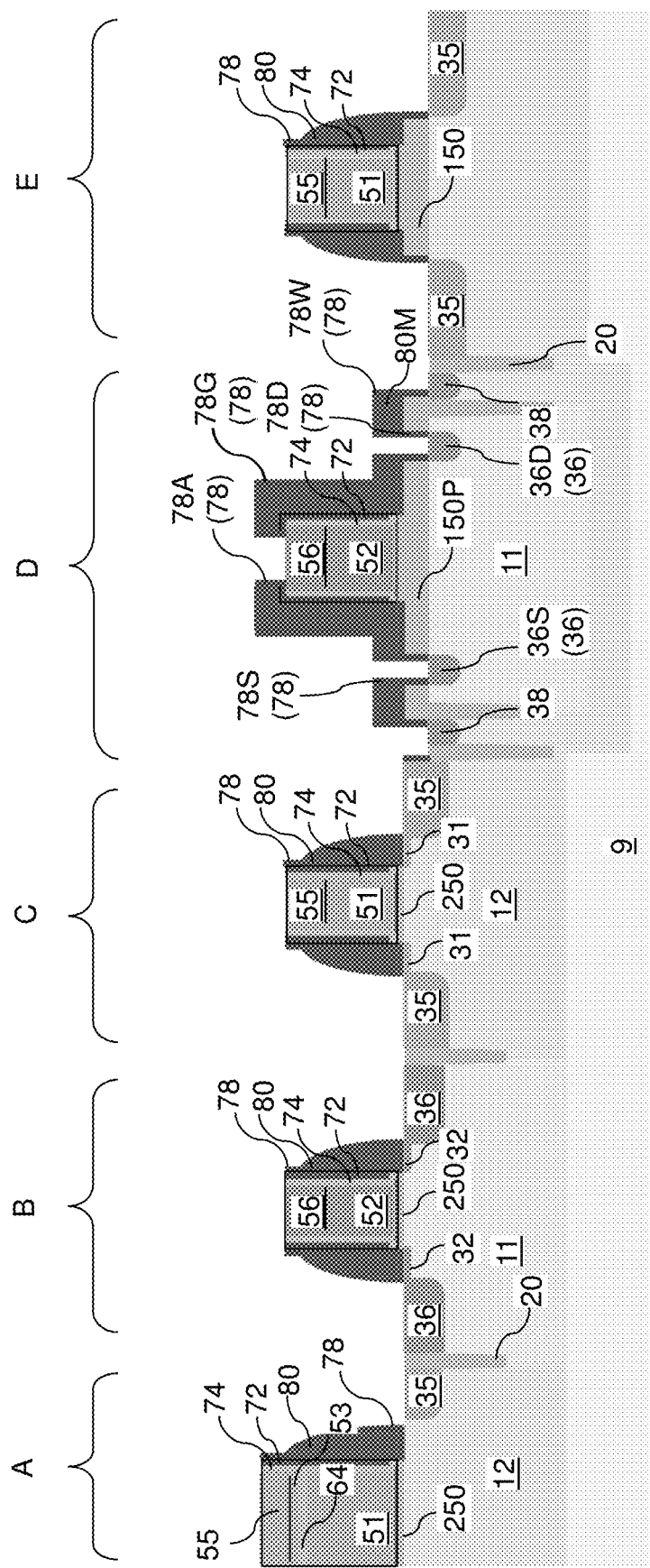
FIG. 14 is a vertical cross-sectional view of the first exemplary structure after formation of dielectric spacers according to the first embodiment of the present disclosure.

Referring to FIG. 14, an anisotropic etch process can be performed to remove horizontally-extending portions of the dielectric spacer material layer 78L. Horizontally-extending portions of the dielectric spacer material layer 78L are removed from within the source-side opening 89S and the drain-side opening 89D, from above the well contact semiconductor regions 38, from above the various source/drain regions (35, 36), and from above the gate electrodes {(51, 55), (52, 56)} and the capacitor structure (51, 64, 53, 55). Remaining portion of the dielectric spacer material layer 78L comprise various dielectric spacers 78. The dielectric spacers 78 can include a source-side dielectric spacer 78S that includes a remaining portion of the dielectric spacer material layer 78L in the source-side opening 89S, a drain-side dielectric spacer 78D that includes a remaining portion of the dielectric spacer material layer 78L in the drain-side opening 89D, a well contact dielectric spacer 78W that includes a remaining portion of the dielectric spacer material layer 78L formed on an outer sidewall of the dielectric capping mask 80M and on an outer sidewall of the first gate dielectric 150P, an annular dielectric spacer 78A that is a remaining portion of the dielectric spacer material layer 78L and contacts a sidewall of an opening within a top portion of the dielectric capping mask 80M, and gate-side dielectric spacers 78G that are remaining portions of the dielectric spacer material layer 78L and laterally surround a vertical sidewall of the dielectric capping mask 80M or a sidewall of a sidewall spacer 80. The various dielectric spacers 78 may have a same material composition and a same lateral thickness.

Figure 15:
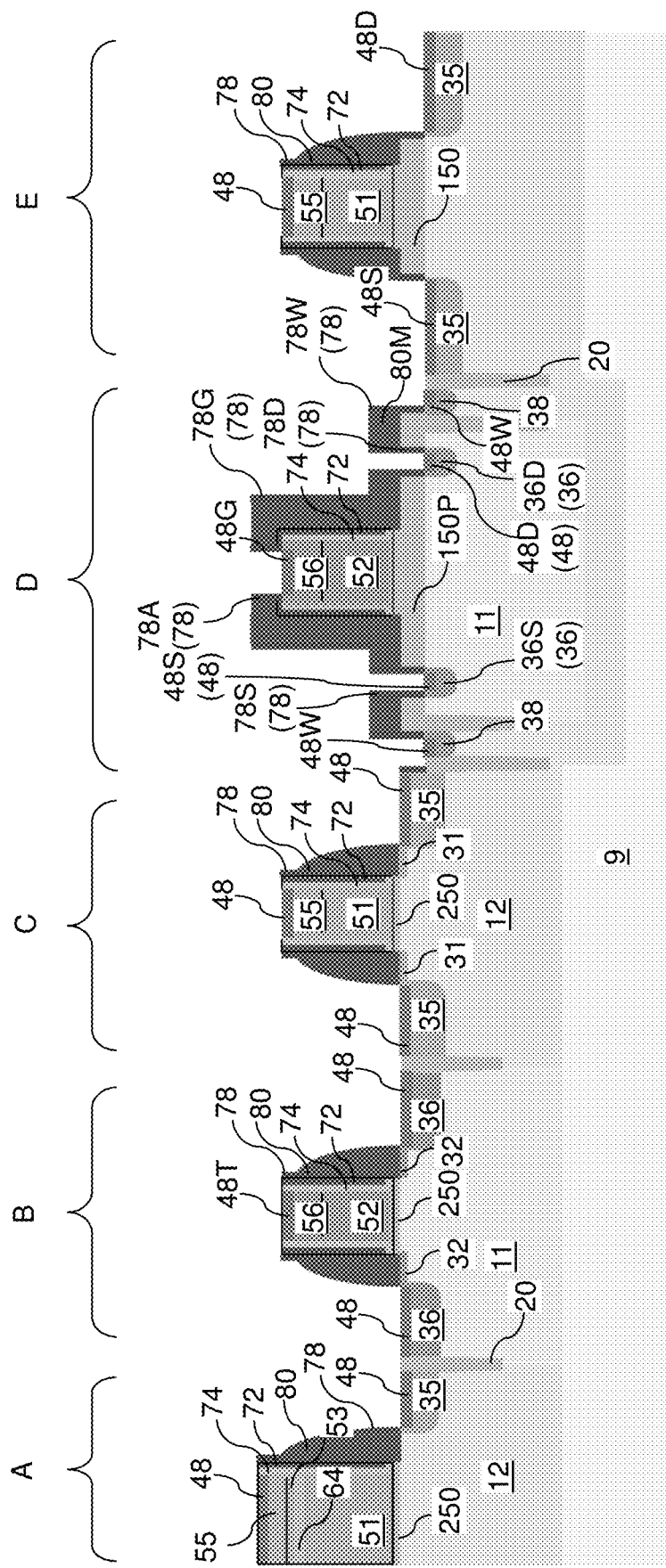
FIG. 15 is a vertical cross-sectional view of the first exemplary structure after formation of metal-semiconductor alloy portions according to the first embodiment of the present disclosure.

Referring to FIG. 15, at least one metal or metal alloy that forms a metal-semiconductor alloy (such as a metal silicide) upon reaction with a semiconductor material can be deposited over the first exemplary structure. The at least one metal or metal alloy may include titanium, tantalum, tungsten, cobalt, nickel, platinum, or alloys thereof, such as Ni—Pt alloy. A thermal anneal process can be performed to induce formation of a metal-semiconductor alloy between the at least one elemental metal and the underlying semiconductor material portions to form various metal-semiconductor alloy portions, such as metal silicide portions 48. The metal silicide portions 48 may comprise nickel platinum silicide. The underlying semiconductor material portions include the well contact semiconductor regions 38, the source/drain regions (35, 36), the gate electrodes {(51, 55), (52, 56)}, and the top electrode (53, 55) of the capacitor structure.

The metal-semiconductor alloy portions 48 may comprise source-side metal-semiconductor alloy portions 48S that are formed on source regions (which are a first subset of the source/drain regions (35, 36)), drain-side metal-semiconductor alloy portions 48D that are formed on drain regions (which are a second subset of the source/drain regions (35, 36)), well contact metal-semiconductor alloy portions 48W that are formed on the well contact semiconductor regions 38, gate contact metal-semiconductor alloy portions 48G that are formed on gate electrodes {(51, 55), (52, 56)}, and a top electrode contact metal-semiconductor alloy portion 48T that is formed on a top electrode (53, 55) of the capacitor structure (51, 64, 53, 55).

In one embodiment, a first source-side metal-semiconductor alloy portion 48S can be formed within the source-side opening 89S directly on a top surface of the first source region 36S, a first drain-side metal-semiconductor alloy portion 48D can be formed within the drain-side opening 89D directly on a top surface of the first drain region 36D, and a well contact metal-semiconductor alloy portion 48W can be formed on the well contact semiconductor region 38. The first source-side metal-semiconductor alloy portion 48S can be formed on an inner sidewall of the source-side dielectric spacer 78S. The first drain-side metal-semiconductor alloy portion 48D can be formed within the drain-side opening 89D directly on a top surface of the first drain region 36D on an inner sidewall of the drain-side dielectric spacer 78D. The well contact metal-semiconductor alloy portion 48W is formed on a sidewall of the well contact dielectric spacer 78W. The first gate metal-semiconductor alloy portion 48G can be formed on a top surface of the first gate electrode (52, 56) and is laterally bounded by an annular dielectric spacer 78A.

In one embodiment, the source-side dielectric spacer 78S can be located at a peripheral portion of the first source-side opening 89S, and the first source-side metal-semiconductor alloy portion 48S can be laterally bounded by an inner sidewall of the source-side dielectric spacer 78S. The drain-side dielectric spacer 78D can be located at a peripheral portion of the first drain-side opening 89D, and the first drain-side metal-semiconductor alloy portion 48D can be laterally bounded by an inner sidewall of the drain-side dielectric spacer 78D. A well contact dielectric spacer 78W can be located on an outer sidewall of the first gate dielectric 150P.

In one embodiment, a first field effect transistor (e.g., high voltage NMOS transistor) can be formed in the first device region (such as device region D), and a second field effect transistor (e.g., high voltage PMOS transistor) can be formed in the second device region (such as device region E). In one embodiment, a second source-side metal-semiconductor alloy portion 48S can be formed on a second source region 36 in the second device region (such as device region E), and a second drain-side metal-semiconductor alloy portion 48D can be formed on the second source region and the second drain region, respectively.

Unreacted portions of the metal or alloy can be removed selected to the various metal-semiconductor alloy portions 48. For example, a wet etch process that etches the at least one metal or alloy selective to a metal silicide material can be employed to remove the unreacted portions of the metal or alloy. The tops of the channels of the high voltage transistors may be recessed below the horizontal plane containing the tops of the channels of the low voltage transistors.

Figure 16:
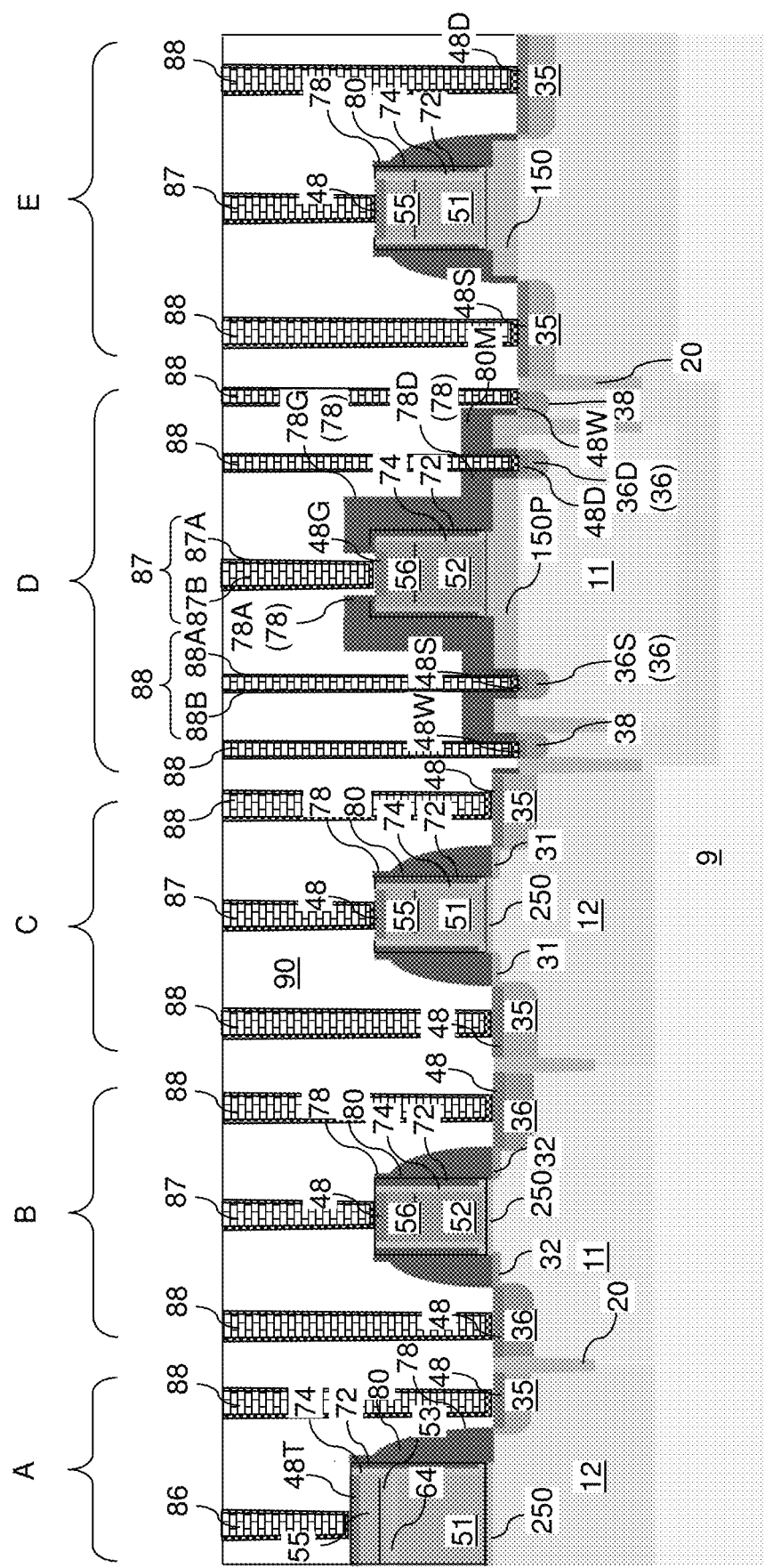
FIG. 16 is a vertical cross-sectional view of the first exemplary structure after formation of a contact-level dielectric layer and various contact via structures according to the first embodiment of the present disclosure.

Referring to FIG. 16, a contact-level dielectric layer 90 can be formed over the various metal-semiconductor alloy portions 48. The top surface of the contact-level dielectric layer 90 can be subsequently planarized, for example, by performing a chemical mechanical polishing (CMP) process. Various contact via cavities can be formed through the contact-level dielectric layer 90, and at least one metallic material can be deposited in the contact via cavities to form contact via structures (87, 88, 86). The contact via structures (87, 88, 86) can include active region contact via structures 88 that contact a respective one of the source-side metal-semiconductor alloy portions 48S, the drain-side metal-semiconductor alloy portions 48D, and the well contact metal-semiconductor alloy portion 48W, and are electrically connected to a respective one of the source/drain regions (35, 36) and the well contact semiconductor region 38. Further, the contact via structures (87, 88, 86) can include gate contact via structures 87 that contact a respective one of gate-side metal-semiconductor alloy portions 48G and are electrically connected to a respective one of the gate electrodes {(51, 55), (52, 56)}. In addition, the contact via structures (87, 88, 86) can include a top electrode contact via structure 86 that contacts a metal-semiconductor alloy portion 48T that contacts a top surface of the top electrode (53, 55) of the capacitor structure in device region A. Each of the contact via structures (87, 88, 86) may comprise a respective metallic liner (87A or 88A) and a respective fill material portion (87B or 88B).

Referring collectively to FIGS. 1-16 and according to various embodiments of the present disclosure, a semiconductor structure including a first field effect transistor formed in a first device region (such as device region D) is provided. The first field effect transistor comprises a first doped well 11 located within a substrate and embedding a first source region 36S and a first drain region 36D; a first gate dielectric 150P, a first gate electrode (52, 56), and a dielectric capping mask 80M overlying the first doped well 11, wherein the dielectric capping mask 80M comprises a vertically-extending portion that laterally surrounds the first gate electrode (52, 56), a top portion that overlies a peripheral region of a top surface of the first gate electrode (52, 56), and a horizontally-extending portion that contacts a top surface of the first gate dielectric 150P outside an area of the first gate electrode (52, 56); a source-side opening 89S extending through the first gate dielectric 150P and the horizontally-extending portion of the dielectric capping mask 80M and overlying the first source region 36S; a drain-side opening 89D extending through the first gate dielectric 150P and the horizontally-extending portion of the dielectric capping mask 80M and overlying the first drain region 36D; a first source-side metal-semiconductor alloy portion 48S contacting a top surface of the first source region 36S and located within the source-side opening 89S; and a first drain-side metal-semiconductor alloy portion 48D contacting a top surface of the first drain region 36D and located within the drain-side opening 89D.

In one embodiment, the first field effect transistor comprises: a source-side dielectric spacer 78S located at a peripheral portion of the first source-side opening 89S, wherein the first source-side metal-semiconductor alloy portion 48S is laterally bounded by an inner sidewall of the source-side dielectric spacer 78S; and a drain-side dielectric spacer 78D located at a peripheral portion of the first drain-side opening 89D, wherein the first drain-side metal-semiconductor alloy portion 48D is laterally bounded by an inner sidewall of the drain-side dielectric spacer 78D.

In one embodiment, the first field effect transistor comprises: a second doped well 12 laterally surrounding and forming a p-n junction at an interface with the first doped well 11; a well contact semiconductor region 38 overlying the second doped well 12; and a well contact metal-semiconductor alloy portion 48W contacting the well contact semiconductor region 38.

In one embodiment, the first field effect transistor comprises a well contact dielectric spacer 78W located on an outer sidewall of the first gate dielectric 150P; and the well contact metal-semiconductor alloy portion 48W contacts the well contact dielectric spacer 78W. In one embodiment, the well contact dielectric spacer 78W, the source-side dielectric spacer 78S, and the drain-side dielectric spacer 78D have a same material composition and a same lateral thickness.

In one embodiment, the top portion of the dielectric capping mask 80M comprises an opening within an area of the first gate electrode (52, 56); an annular dielectric spacer 78A contacts a sidewall of the opening within the top portion of the dielectric capping mask 80M; and a first gate metal-semiconductor alloy portion 48 is located on a top surface of the first gate electrode (52, 56) and is laterally bounded by the annular dielectric spacer 78A.

In one embodiment, an outer sidewall of the first gate dielectric 150P is vertically coincident with an outer sidewall of the dielectric capping mask 80M; a first inner sidewall of the first gate dielectric 150P laterally surrounds the source-side opening 89S and is vertically coincident with a first inner sidewall of the dielectric capping mask 80; and a second inner sidewall of the first gate dielectric 150P laterally surrounds the drain-side opening 89D and is vertically coincident with a second inner sidewall of the dielectric capping mask 80M.

In one embodiment, the semiconductor structure further comprises a second field effect transistor located in a second device region such as device region E. The second field effect transistor comprises: a second doped well 12 located within the substrate and embedding a second source region 35 and a second drain region 35; a second gate dielectric 150, a second gate electrode (51, 55), and a sidewall spacer 80 overlying the second doped well 12; a dielectric spacer 78 laterally surrounding the sidewall spacer 80; a second source-side metal-semiconductor alloy portion 48S contacting a top surface of the second source region 35 and contacting the dielectric spacer 78; and a second drain-side metal-semiconductor alloy portion 48D contacting a top surface of the second drain region 35 and contacting the dielectric spacer 78.

In one embodiment, a top periphery of the first source region 36S may be laterally offset outward from a bottom periphery of the source-side dielectric spacer 78S by a uniform lateral offset distance, which may be the sum of the lateral thickness of the source-side dielectric spacer 78S and a lateral straggle distance of the implanted ions that form the first source region 36S. Thus, the source-side metal-semiconductor alloy portion 48S is self-aligned to the first source region 36S. A top periphery of the first drain region 36D may be laterally offset outward from a bottom periphery of the drain-side dielectric spacer 78D by a uniform lateral offset distance, which may be the sum of the lateral thickness of the drain-side dielectric spacer 78D and a lateral straggle distance of the implanted ions that form the first drain region 36D. Thus, the drain-side metal-semiconductor alloy portion 48D is self-aligned to the first drain region 36D.

Figure 17:
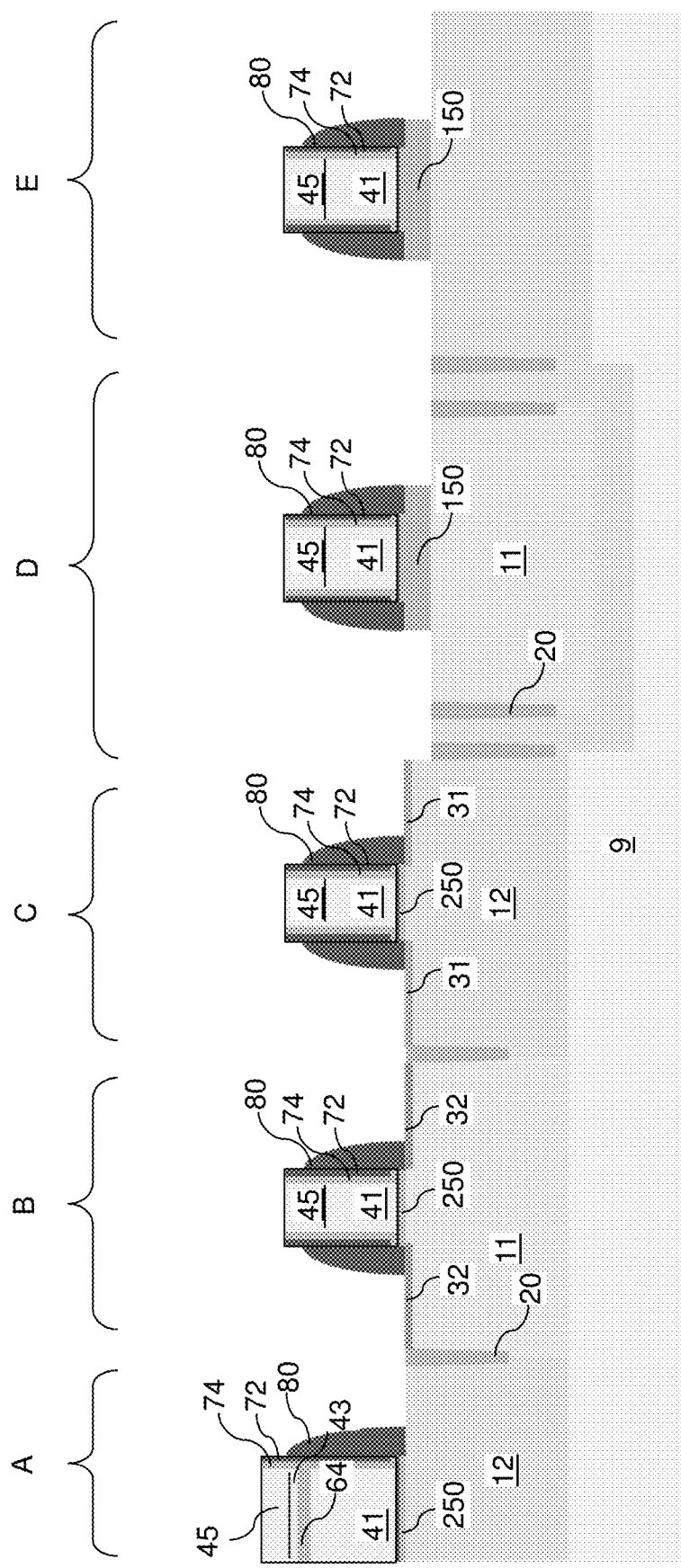
FIG. 17 is a vertical cross-sectional view of a second exemplary structure after formation of dielectric gate liners, source/drain extension regions, sidewall spacers, and gate dielectrics according to the second embodiment of the present disclosure.

Referring to FIG. 17, a second exemplary structure according to the second embodiment of the present disclosure can be derived from the first exemplary structure illustrated in FIG. 10. The dielectric capping mask layer 80L of FIG. 10 is referred to as a conformal sidewall spacer layer in the second exemplary structure. Generally, a first doped well 11 and a second doped well 12 can be formed within a substrate, and a first gate dielectric layer 150L and a second gate dielectric layer 250L can be formed on the top surfaces of the first doped well 11 and the second doped well 12. Gate electrodes (41, 45) can be formed over the first gate dielectric layer 150L and the second gate dielectric layer 250L. The second gate dielectric layer 250L may be patterned into second-thickness gate dielectrics 250 which are thinner than the first gate dielectric layer 150L. Dielectric gate liners (72, 74) can be formed by deposition and anisotropic etch of dielectric gate liner layers (72L, 74L). The conformal sidewall spacer layer can be formed over the gate electrodes (41, 45) and the first gate dielectric layer 150L.

An anisotropic etch process can be performed without employing any patterned photoresist layer. The anisotropic etch process removes horizontally-extending unmasked portions of the conformal sidewall spacer layer (which may be the same as the dielectric capping mask layer 80L in the first exemplary structure) and the first gate dielectric layer 150L. Vertically-extending remaining portions of the conformal sidewall spacer layer comprise sidewall spacers 80. Each sidewall spacer 80 laterally surrounds a respective gate electrode (41, 45) or a respective capacitor structure (41, 64, 43, 45).

A portion of the conformal sidewall spacer layer that remains around a first gate electrode (41, 45) in a first device region (such as device region D) comprises a first sidewall spacer 80. Each patterned portion of the first gate dielectric layer 150L underlying a combination of a gate electrode (41, 45) and a sidewall spacer 80 comprises a first-thickness gate dielectric 150 having a first thickness greater than the second thickness of the second-thickness gate dielectrics 250. A portion of the first gate dielectric layer 150L that is not masked by the first gate electrode (41, 45) and the first sidewall spacer 80 comprise a first gate dielectric 150, which is one of the first-thickness gate dielectrics 150. Each patterned portion of the second gate dielectric layer 250L underlying a combination of a gate electrode (41, 45) and a sidewall spacer 80 comprises a second-thickness gate dielectric 250 having a second thickness that is less than the first thickness.

In one embodiment, a surface (such as a top surface) of the first doped well 11 is physically exposed upon patterning the dielectric capping mask layer 80L and the gate dielectric layer 150L, for example, in the first device region (such as device region D). In one embodiment, a surface (such as a top surface) of the second doped well 12 is physically exposed upon patterning the dielectric capping mask layer 80L and the gate dielectric layer 150L, for example, in the second device region (such as device region E). A first gate dielectric 150, a first gate electrode (41, 45), and a first sidewall spacer 80 can be formed over the first doped well 11 in a first device region (such as device region D), and a second gate dielectric 150, a second gate electrode (41, 45), and a second sidewall spacer 80 can be formed over the substrate in a second device region (such as device region E).

Figure 18:
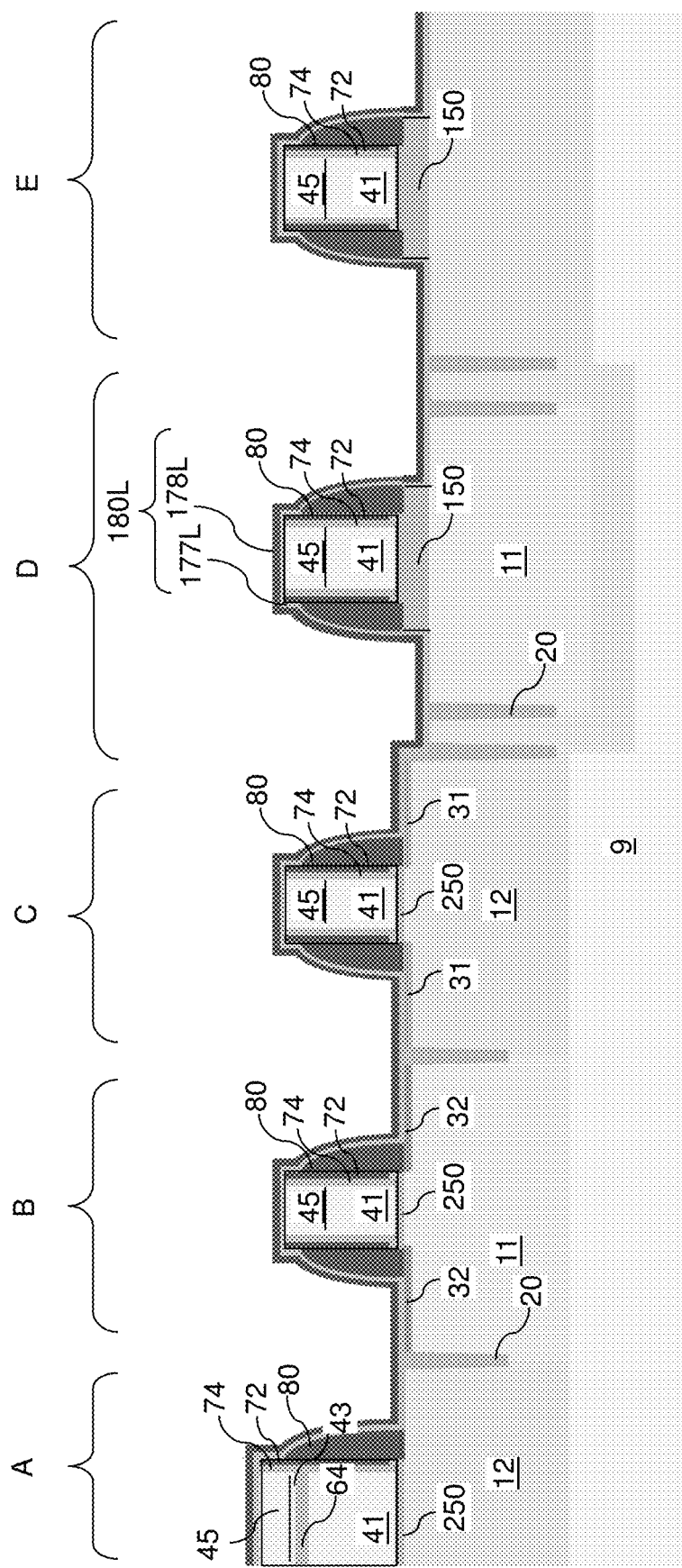
FIG. 18 is a vertical cross-sectional view of a second exemplary structure after formation of a dielectric capping mask layer according to the second embodiment of the present disclosure.

Referring to FIG. 18, a dielectric capping mask layer 180L can be deposited over the gate electrodes (41, 45) and the sidewall spacers 80. In one embodiment, the dielectric capping mask layer 180L may comprise a layer stack including a first dielectric capping mask sublayer 177L and a second dielectric capping mask sublayer 178L. In an illustrative example, the first dielectric capping mask sublayer 177L may comprise a silicon oxide layer having a thickness in a range from 6 nm to 100 nm, such as from 12 nm to 50 nm, and the second dielectric capping mask sublayer 178L may comprise a silicon nitride layer having a thickness in a range from 6 nm to 100 nm, such as from 12 nm to 50 nm. The first dielectric capping mask sublayer 177L and the second dielectric capping mask sublayer 178L may be deposited by performing a respective conformal deposition process such as a chemical vapor deposition process.

Figure 19:
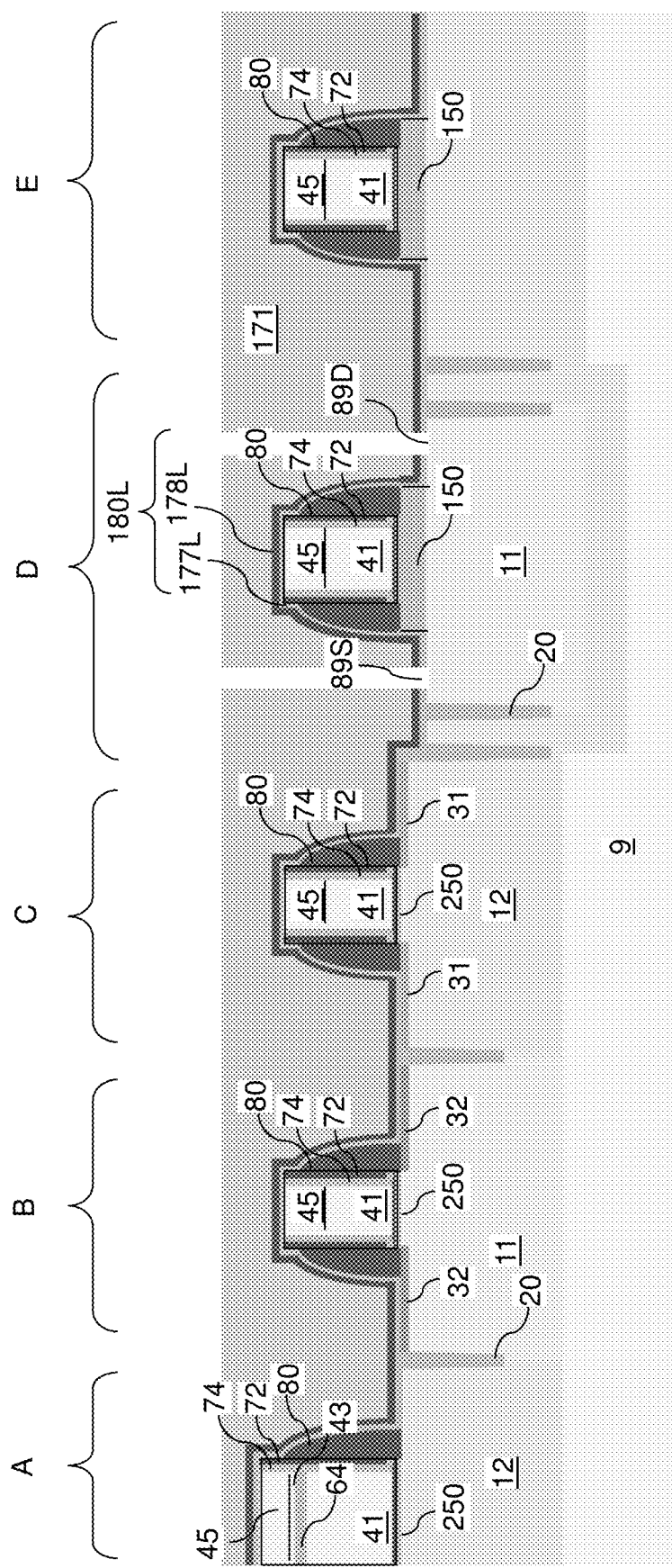
FIG. 19 is a vertical cross-sectional view of a second exemplary structure after formation of openings through the dielectric capping mask layer according to the second embodiment of the present disclosure.

Referring to FIG. 19, a first photoresist layer 171 can be applied over the second exemplary structure, and can be lithographically patterned to form a pair of openings located on opposite sides of a gate electrode (41, 45) in a first device region (such as device region D). An anisotropic etch process can be performed to transfer the pattern in the first photoresist layer 171 through horizontally-extending portions of the dielectric capping mask layer 180L. A source-side opening 89S and a drain-side opening 89D can be formed through a horizontally-extending portion of the dielectric capping mask layer 180L that contact the first doped well 11. The first photoresist layer 171 can be removed, for example, by ashing.

Figure 20:
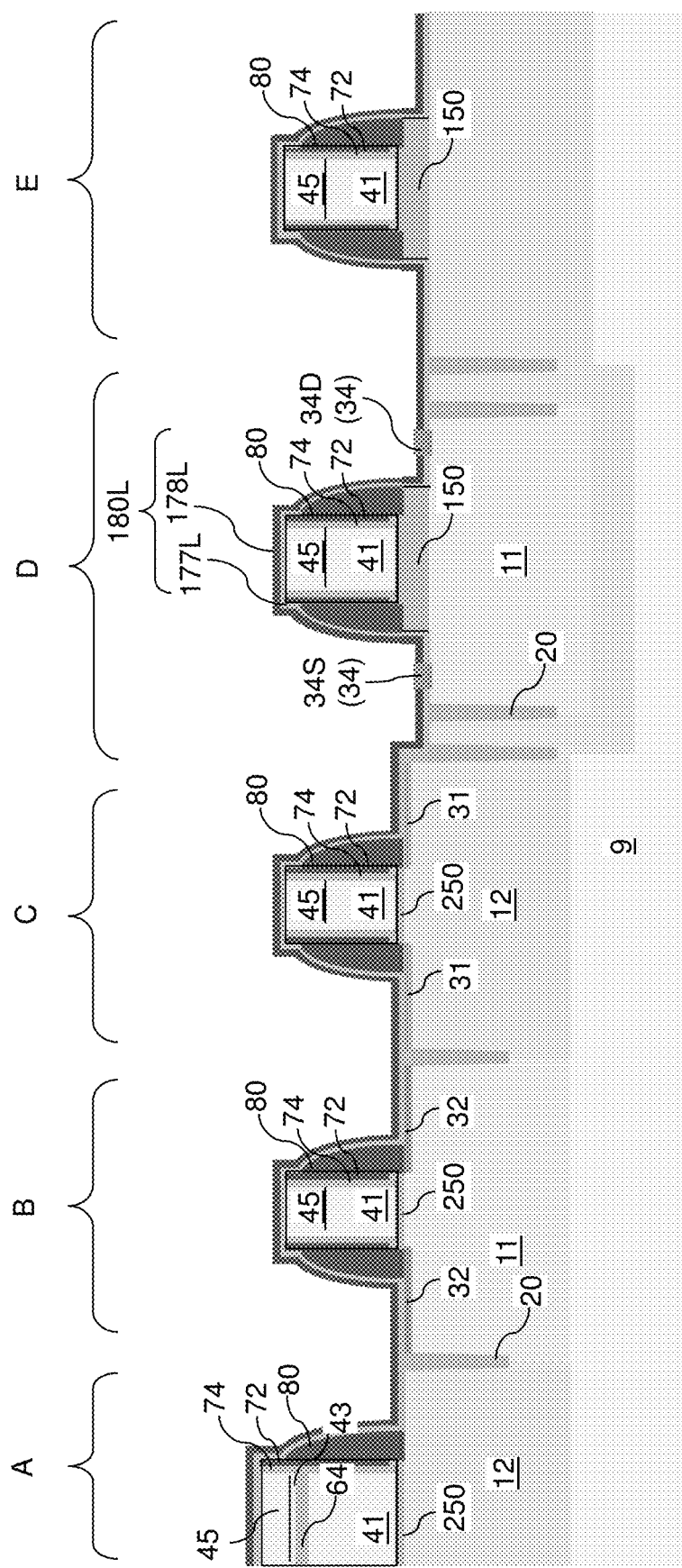
FIG. 20 is a vertical cross-sectional view of the second exemplary structure after formation of source/drain regions according to the second embodiment of the present disclosure.

Referring to FIG. 20, a selective epitaxy process can be performed to selectively grow a semiconductor material from the physically exposed surfaces of the first doped well 11 within the source-side opening 89S and within the drain-side opening 89D. The selective epitaxy process grows a single crystalline semiconductor material, such as single crystalline silicon, from the single crystalline semiconductor surfaces of the first doped well 11 while suppressing growth of any semiconductor material from the physically exposed surfaces of the dielectric capping mask layer 180L. The second exemplary structure can be placed in a vacuum-tight process chamber, and a semiconductor-containing precursor gas and an etchant gas can be concurrently or alternately flowed into the process chamber to effect the selective epitaxy process. Exemplary semiconductor-containing precursor gases comprise silane, dichlorosilane, trichlorosilane, disilane, digermane, etc. An exemplary etchant gas is hydrogen chloride. Epitaxial raised source and drain regions 34 can be formed in the source-side opening 89S and within the drain-side opening 89D. The source and drain regions 34 can include a first source region 34S that is formed within the volume of the source-side opening 89S, and a first drain region 34D that is formed within the volume of the drain-side opening 89D. The first source region 34S is a raised source region having a bottom surface in contact with a first portion of the top surface of the first doped well 11, and the first drain region 34D is a raised drain region having a bottom surface in contact with a second portion of the top surface of the first doped well 11.

In one embodiment, the selective epitaxy process can grow a doped semiconductor material having a doping of the second conductivity type by flowing a dopant gas during the selective epitaxy process. If the second conductivity type is n-type, the dopant gas may comprise phosphine, arsine, or stibine. If the second conductivity type is p-type, the dopant gas may comprise diborane. The first source and drain regions (34S, 34D) can include dopants of the second conductivity type at an average atomic concentration in a range from $1.0 \times 10^{19}/\text{cm}^3$ to $2.0 \times 10^{21}/\text{cm}^3$, such as from $2.0 \times 10^{20}/\text{cm}^3$ to $1.0 \times 10^{21}/\text{cm}^3$, although lesser and greater average atomic concentrations can also be employed. The top surfaces of the first source region 34S and the first drain region 34D may be located at, above, or below, the horizontal plane including a top surface of a horizontally-extending portion of the dielectric capping mask layer 180L that contacts the first doped well 11 in the first device region. Generally, the first source region 34S and the first drain region 34D can be formed by selectively growing portions of a doped semiconductor material within the source-side opening 89S and the drain-side opening 89D, respectively.

Figure 21:
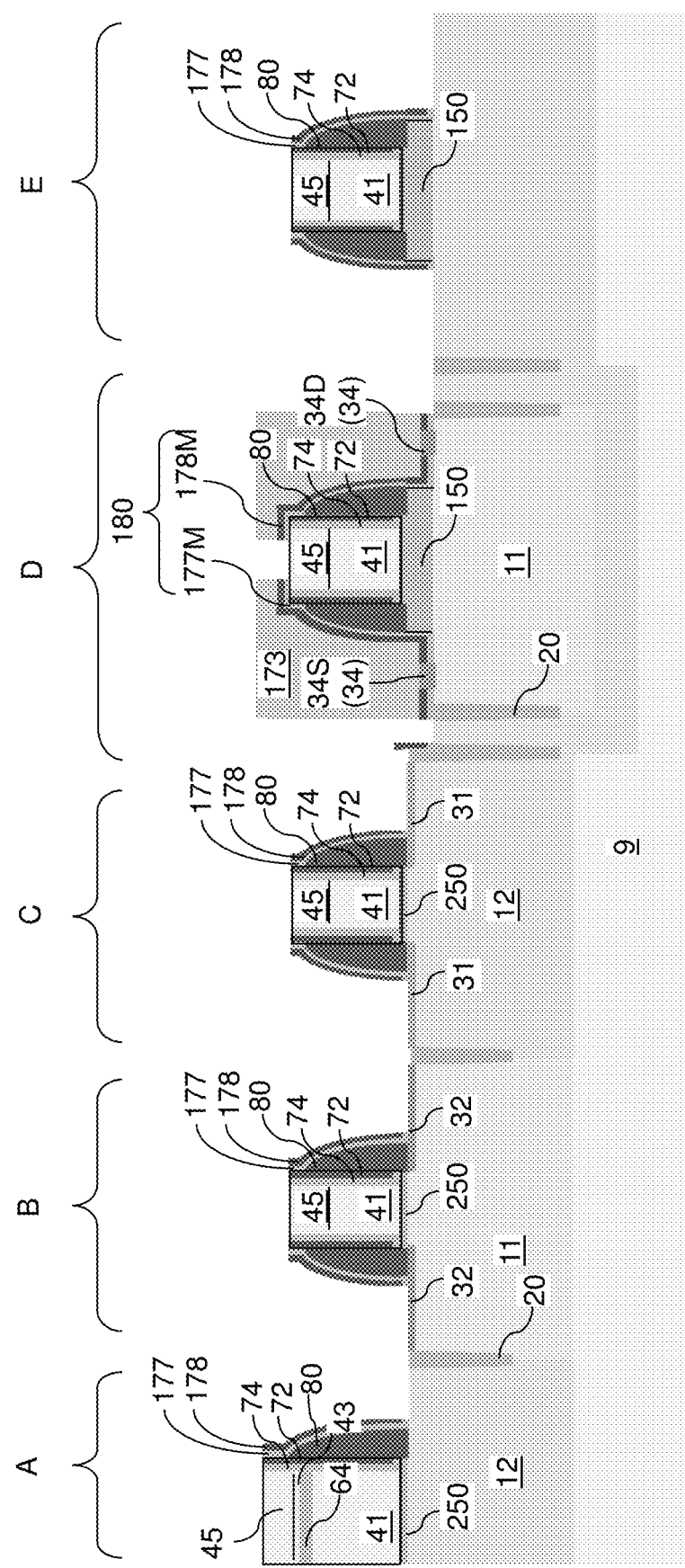
FIG. 21 is a vertical cross-sectional view of a second exemplary structure after patterning the dielectric capping mask layer into a dielectric capping mask and dielectric spacers according to the second embodiment of the present disclosure.

Referring to FIG. 21, a second photoresist layer 173 can be applied over the second exemplary structure, and can be lithographically patterned to cover the first device region (such as device region D) without covering other device regions (such as device regions A, B, C, and E). The patterned second photoresist layer 173 overlies a predominant portion of the first device region (such as device region D), and does not overlie the second device region (such as device region E). The pattern in the second photoresist layer 173 can have an opening within an area that overlies the gate electrode (41, 45) in the first device region. An anisotropic etch process can be performed to remove horizontally-extending portions of the dielectric capping mask layer 180L that are not covered by the second photoresist layer 173. The dielectric capping mask layer 180L can be anisotropically etched employing the patterned second photoresist layer 173 as an etch mask.

Remaining portions of the dielectric capping mask layer 180L after the anisotropic etch process include a dielectric capping mask 180 and dielectric spacers (177, 178). The dielectric capping mask 180 is formed within the area in which the patterned second photoresist layer 173 is present. The dielectric capping mask 180 may include a layer stack of a first dielectric capping mask sublayer 177M and a second dielectric capping mask sublayer 178M. Each dielectric spacer (177, 178) may include a first dielectric spacer sublayer 177 and a second dielectric spacer sublayer 178.

In one embodiment, the first source region 34S can be located within the source-side opening 89S in the dielectric capping mask 180, and can provide a first p-n junction with the first doped well 11 at a horizontal plane including an interface between the top surface of the first doped well 11 and the bottom surface of the dielectric capping mask 180. In one embodiment, the first drain region 34D can be located within the drain-side opening 89D in the dielectric capping mask 180, and can provide a second p-n junction with the first doped well 11 at the horizontal plane including an interface between the top surface of the first doped well 11 and the bottom surface of the dielectric capping mask 180. Thus, the first p-n junction and the second p-n junction can be located within a horizontal plane including an interface between the first doped well 11 and the dielectric capping mask 180. In one embodiment, the first doped well 11 comprises a first single crystalline semiconductor material, and the first source region 34S and the first drain region 34D comprise a respective second single crystalline semiconductor material that is epitaxially aligned to the first single crystalline semiconductor material. The second photoresist layer 173 can be removed, for example, by ashing.

Figure 22:
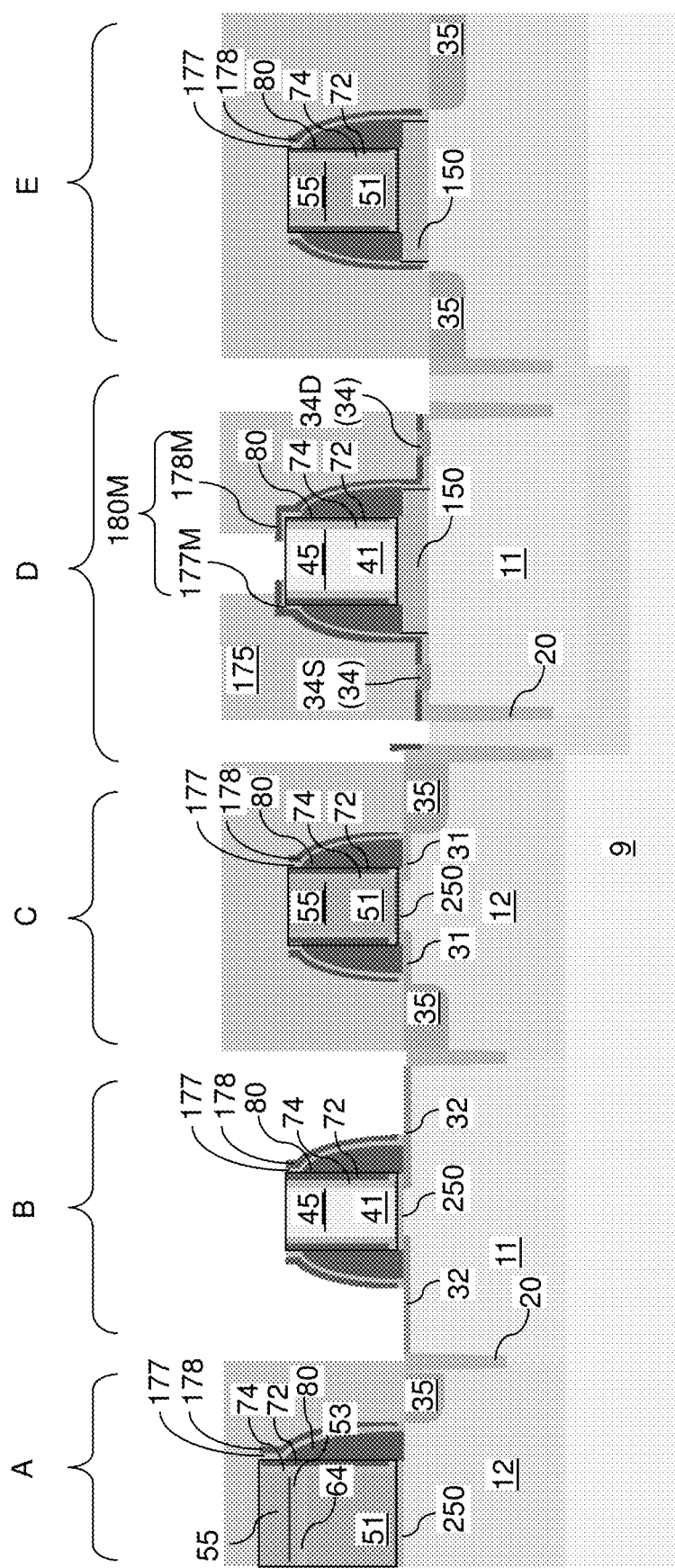
FIG. 22 is a vertical cross-sectional view of a second exemplary structure after formation of first-conductivity-type source/drain regions and formation of a patterned implantation mask according to the second embodiment of the present disclosure.

Referring to FIG. 22, a third ion implantation mask layer (not illustrated) can be formed above the second exemplary structure to cover all device regions other than device regions (such as device region A, device region C, and device region E) in which the capacitor structure and the first-conductivity type field effect transistors are to be subsequently formed. The third ion implantation mask layer can include openings within the device regions (such as device region A, device region C, and device region E) in which the capacitor structure and the first-conductivity type field effect transistors are to be subsequently formed. A third ion implantation process can be performed to form first-conductivity-type source/drain regions 35 having a doping of the first conductivity type in upper portions of the second doped well 12 having a doping of the second conductivity type. The first-conductivity-type source/drain regions 35 may incorporate segments of volumes of the first-conductivity-type source/drain extension regions 31 as formed at the processing steps of FIG. 9. In case the gate electrodes (41, 45) that are not masked by the third ion implantation mask layer include a semiconductor material, the unmasked gate electrodes (41, 45) can be converted into first-conductivity-type doped semiconductor gate electrodes (51, 55) including doped semiconductor materials having a doping of the first conductivity type. Specifically, each unmasked bottom gate electrode portion 41 may be converted into a first-conductivity-type bottom gate electrode portion 51, and each unmasked top gate electrode portion 45 may be converted into a first-conductivity-type top gate electrode portion 44. The bottom electrode 41 of the capacitor structure can be converted into a first-conductivity-type bottom electrode 51, and the top electrode (43, 45) of the capacitor structure can be converted into a first-conductivity-type top electrode (53, 55). The first source/drain regions 35 can include dopants of the first conductivity type at an average atomic concentration in a range from $1.0 \times 10^{19}/cm^3$ to $2.0 \times 10^{21}/cm^3$, such as from $2.0 \times 10^{20}/cm^3$ to $1.0 \times 10^{21}/cm^3$, although lesser and greater average atomic concentrations can also be employed. The third ion implantation mask layer can be subsequently removed, for example, by ashing.

A fourth ion implantation mask layer 175 can be formed above the second exemplary structure to cover all device regions other than device regions (such as device region B and device region D) in which the second-conductivity type field effect transistors are to be subsequently formed. The fourth ion implantation mask layer 175 can include openings within the device regions (such as device region B and device region D) in which the second-conductivity type field effect transistors are to be subsequently formed. In one embodiment, the fourth ion implantation mask layer 175 can cover the first source region 34S and the first drain region 34D, and can have an opening within an area that overlies the first gate electrode (41, 45) in the first device region (such as device region D). Further, a top surface of the second doped well 12 can be physically exposed in a peripheral area of the first device region.

Figure 23:
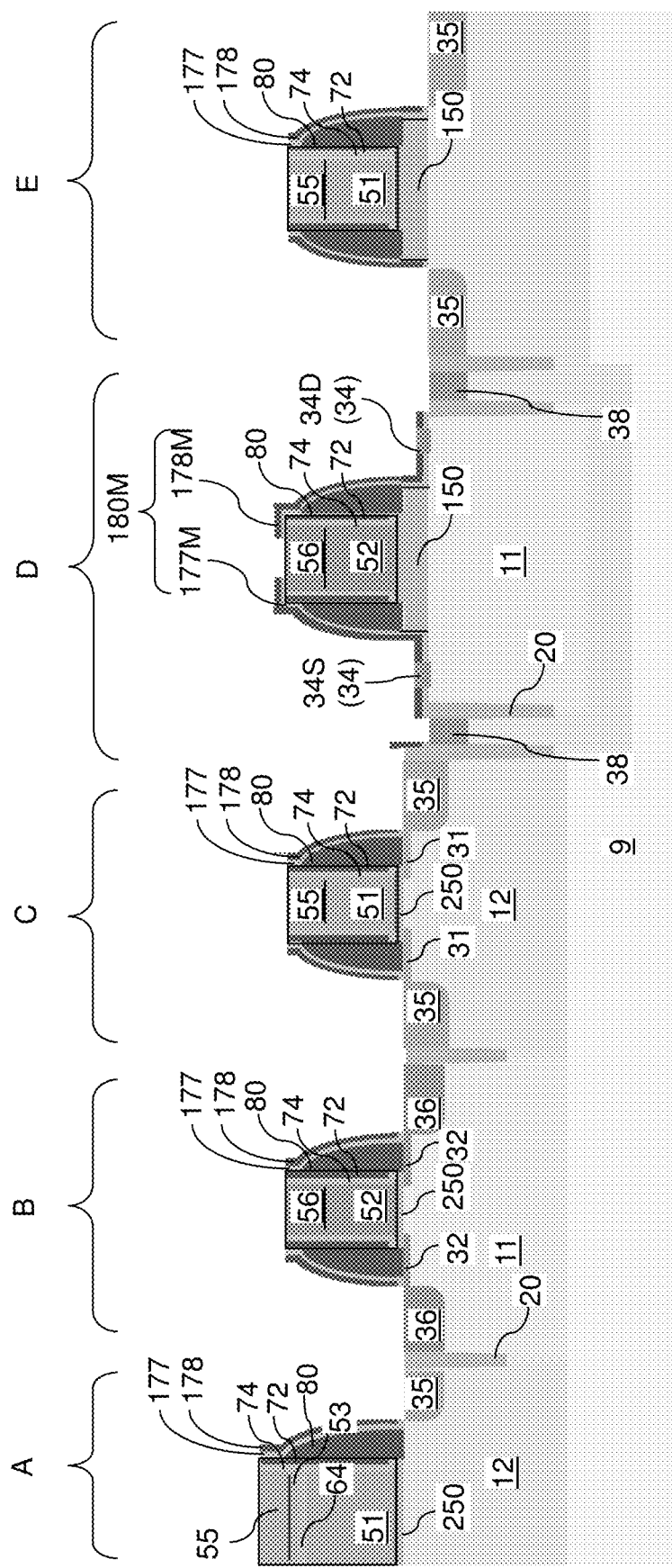
FIG. 23 is a vertical cross-sectional view of a second exemplary structure after formation of second-conductivity-type source/drain regions and removal of the patterned implantation mask according to the second embodiment of the present disclosure.

Referring to FIG. 23, a fourth ion implantation process can be performed while the fourth ion implantation mask layer 175 is present to form second-conductivity-type source/drain regions 36 having a doping of the second conductivity type in upper portions of the first doped wells 11 having a doping of the first conductivity type. The second-conductivity-type source/drain regions 36 may incorporate segments of volumes of the second-conductivity-type source/drain extension regions 32 as formed at the processing steps of FIG. 9. Well contact semiconductor regions 38 can be formed within physically exposed portions of the second doped well 12 within the first device region (such as device region D). In case the gate electrodes (41, 45) that are not masked by the fourth ion implantation mask layer 175 include a semiconductor material, the unmasked gate electrodes (41, 45) can be converted into second-conductivity-type doped semiconductor gate electrodes (52, 56) including doped semiconductor materials having a doping of the second conductivity type. Specifically, each unmasked bottom gate electrode portion 41 may be converted into a second-conductivity-type bottom gate electrode portion 52, and each unmasked top gate electrode portion 45 may be converted into a second-conductivity-type top gate electrode portion 56. The second source/drain regions 36 and the well contact semiconductor regions 38 can include dopants of the second conductivity type at an average atomic concentration in a range from $1.0 \times 10^{19}/cm^3$ to $2.0 \times 10^{21}/cm^3$, such as from $2.0 \times 10^{20}/cm^3$ to $1.0 \times 10^{21}/cm^3$, although lesser and greater average atomic concentrations can also be employed. The fourth ion implantation mask layer 175 can be subsequently removed, for example, by ashing.

Figure 24:
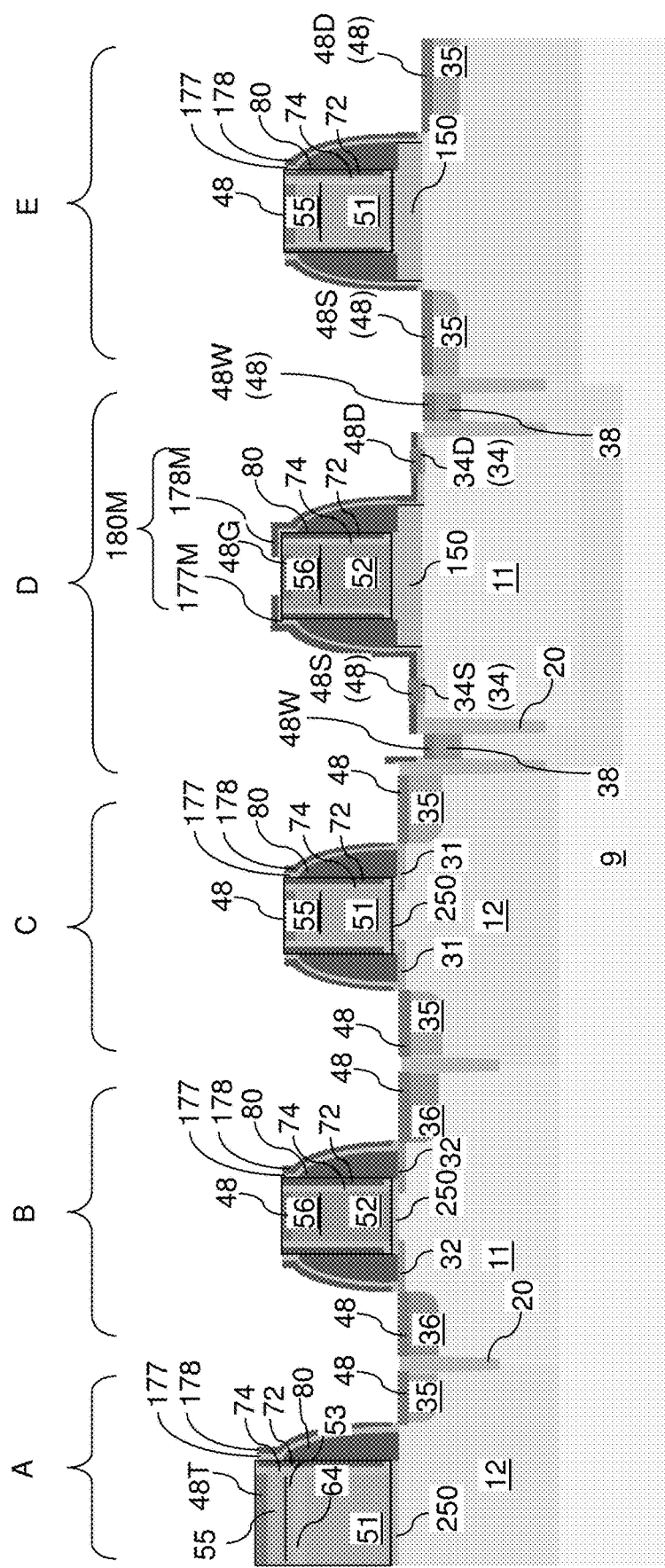
FIG. 24 is a vertical cross-sectional view of the second exemplary structure after formation of metal-semiconductor alloy portions according to the second embodiment of the present disclosure.

Referring to FIG. 24, at least one metal or metal alloy that forms a metal-semiconductor alloy (such as a metal silicide) upon reaction with a semiconductor material can be deposited over the second exemplary structure. The at least one elemental metal may include titanium, tantalum, tungsten, cobalt, nickel, platinum, and alloys thereof, such as nickel-platinum. A thermal anneal process can be performed to induce formation of a metal-semiconductor alloy between the at least one metal or metal alloy and the underlying semiconductor material portions to form various metal-semiconductor alloy portions 48. The underlying semiconductor material portions include the well contact semiconductor regions 38, the source/drain regions 34 located within openings in the dielectric capping mask 180, the source/drain regions (35, 36) that do not contact the dielectric capping mask 180, the gate electrodes {(51, 55), (52, 56)}, and the top electrode (53, 55) of the capacitor structure.

The metal-semiconductor alloy portions 48 may comprise source-side metal-semiconductor alloy portions 48S that are formed on source regions (34, 35, 36), drain-side metal-semiconductor alloy portions 48D that are formed on drain regions (34, 35, 36), well contact metal-semiconductor alloy portions 48W that are formed on the well contact semiconductor regions 38, gate contact metal-semiconductor alloy portions 48G that are formed on gate electrodes {(51, 55), (52, 56)}, and a top electrode contact metal-semiconductor alloy portion 48T that is formed on a top electrode (53, 55) of the capacitor structure (51, 64, 53, 55).

In one embodiment, a first source-side metal-semiconductor alloy portion 48S can be formed within the source-side opening 89S in the dielectric capping mask 180 directly on a top surface of the first source region 34S, a first drain-side metal-semiconductor alloy portion 48D can be formed within the drain-side opening 89D in the dielectric capping mask 180 directly on a top surface of the first drain region 34D, and a well contact metal-semiconductor alloy portion 48W can be formed on the well contact semiconductor region 38.

Unreacted portions of the metal or metal alloy can be removed selected to the various metal-semiconductor alloy portions 48. For example, a wet etch process that etches the at least one metal or metal alloy selective to a metal silicide material can be employed to remove the unreacted portions of the at least one metal or metal alloy.

Generally, the first source-side metal-semiconductor alloy portion 48S and the first drain-side metal-semiconductor alloy portion 48D can be formed in a first device region (such as device region D) by depositing first portions of a metallic material on the first raised source region 34S and the first raised drain region 34D and inducing formation of first metal-semiconductor alloy portions. A second source-side metal-semiconductor alloy portion 48S and a second drain-side metal-semiconductor alloy portion 48D can be formed in a second device region (such as device region E) by depositing second portions of the metallic material on the second source region 35 and the second drain region 35 and inducing formation of second metal-semiconductor alloy portions.

In one embodiment, remaining portions of the first raised source region 34S and the first raised drain region 34D after formation of the first source-side metal-semiconductor alloy portion 48S and the first drain-side metal-semiconductor alloy portion 48D may be located entirely within the source-side opening 89S and within the drain-side opening 89D, respectively. The first source-side metal-semiconductor alloy portion 48S contacts a top surface of the first raised source region 34S and can be located within the source-side opening 89S in the dielectric capping mask 180, and the first drain-side metal-semiconductor alloy portion 48D can contact a top surface of the first raised drain region 34D and located within the drain-side opening 89D in the dielectric capping mask 180.

In one embodiment, a peripheral sidewall of the first source-side metal-semiconductor alloy portion 48S and a peripheral sidewall of the first raised source region 34S are vertically coincident with each other and contact a first sidewall of the dielectric capping mask 180 around the source-side opening 89S. A peripheral sidewall of the first drain-side metal-semiconductor alloy portion 48D and a peripheral sidewall of the first raised drain region 34D are vertically coincident with each other and contact a second sidewall of the dielectric capping mask 180 around the drain-side opening 89D. In one embodiment, an interface between the first raised source region 34S and the source-side metal semiconductor alloy portion 48S and an interface between the first raised drain region 34D and the drain-side metal semiconductor alloy portion 48D are located between a first horizontal plane including a bottom surface of the horizontally-extending portion of the dielectric capping mask 180 and a top surface of the horizontally-extending portion of the dielectric capping mask 180.

Figure 25:
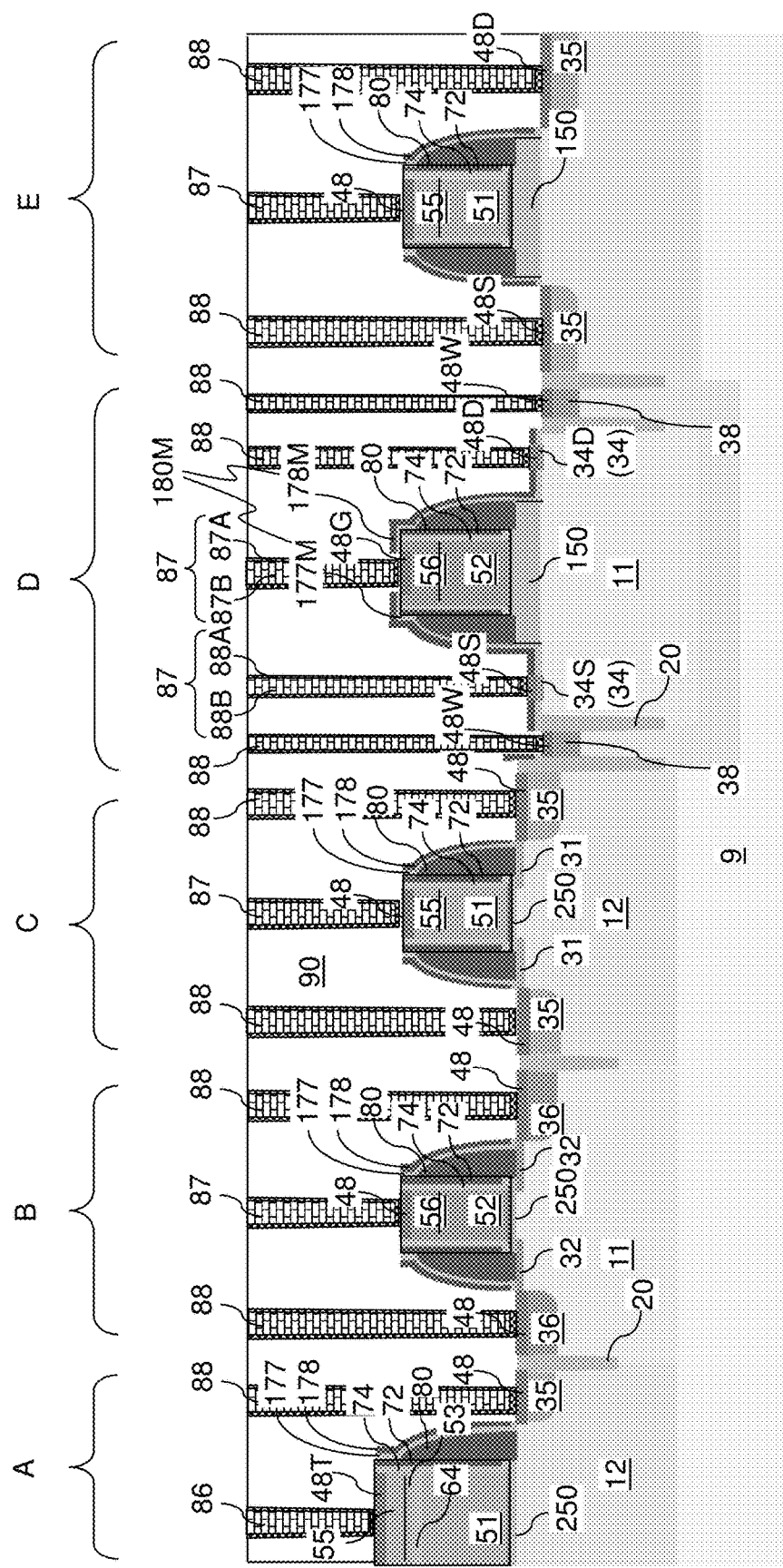
FIG. 25 is a vertical cross-sectional view of the second exemplary structure after formation of a contact-level dielectric layer and various contact via structures according to the second embodiment of the present disclosure.

Referring to FIG. 25, a contact-level dielectric layer 90 can be formed over the various metal-semiconductor alloy portions 48. The top surface of the contact-level dielectric layer 90 can be subsequently planarized, for example, by performing a chemical mechanical polishing (CMP) process. Various contact via cavities can be formed through the contact-level dielectric layer 90, and at least one metallic material can be deposited in the contact via cavities to form contact via structures (87, 88, 86). The contact via structures (87, 88, 86) can include active region contact via structures 88 that contact a respective one of the source-side metal-semiconductor alloy portions 48S, the drain-side metal-semiconductor alloy portion 48Ds, and the well contact metal-semiconductor alloy portions 48W, and are electrically connected to a respective one of the source/drain regions (34, 35, 36) and the well contact semiconductor region 38. Further, the contact via structures (87, 88, 86) can include gate contact via structures 87 that contact a respective one of gate-side metal-semiconductor alloy portions 48G and are electrically connected to a respective one of the gate electrodes {(51, 55), (52, 56)}. In addition, the contact via structures (87, 88, 86) can include a top electrode contact via structure 86 that contacts a metal-semiconductor alloy portion 48T that contacts a top surface of the top electrode (53, 55). Each of the contact via structures (87, 88, 86) may comprise a respective metallic liner (87A or 88A) and a respective fill material portion (87B or 88B).

Referring collectively to FIGS. 1-10 and 17-25 and according to various embodiments of the present disclosure, a semiconductor structure including a first field effect transistor formed in a first device region (such as device region D) is provided. The first field effect transistor comprises: a first doped well 11 located within a substrate; a first gate dielectric 150, a first gate electrode (52, 56), and a first sidewall spacer 80 that overlie the first doped well 11; a dielectric capping mask 180M comprising a vertically-extending portion that laterally surrounds the first gate electrode (52, 56), a top portion that overlies a peripheral region of a top surface of the first gate electrode (52, 56), and a horizontally-extending portion that overlies the first doped well 11 outside an area of the first gate dielectric 150, wherein the dielectric capping mask 180M comprises a source-side opening 89S and a drain-side opening 89D; a raised first source region 34S located within the source-side opening 89S in the dielectric capping mask 180 and providing a first p-n junction with the first doped well 11; and a raised first drain region 34D located within the drain-side opening 89D in the dielectric capping mask 180 and providing a second p-n junction with the first doped well 11.

In one embodiment, the semiconductor structure further comprises: a first source-side metal-semiconductor alloy portion 48S contacting a top surface of the source region 34S and located within the source-side opening 89S; and a first drain-side metal-semiconductor alloy portion 48D contacting a top surface of the drain region 34D and located within the drain-side opening 89D.

In one embodiment, a peripheral sidewall of the first source-side metal-semiconductor alloy portion 48S and a peripheral sidewall of the first source region 34S are vertically coincident with each other and contact a first sidewall of the dielectric capping mask 180M around the source-side opening 89S; and a peripheral sidewall of the first drain-side metal-semiconductor alloy portion 48D and a peripheral sidewall of the first drain region 34D are vertically coincident with each other and contact a second sidewall of the dielectric capping mask 180 around the drain-side opening 89D.

In one embodiment, the first p-n junction and the second p-n junction are located within a horizontal plane including an interface between the first doped well 11 and the dielectric capping mask 180M. In one embodiment, the first doped well 11 comprises a first single crystalline semiconductor material; and the first source region 34S and the first drain region 34D comprise a respective second single crystalline semiconductor material that is epitaxially aligned to the first single crystalline semiconductor material.

In one embodiment, an interface between the first source region 34S and the source-side metal semiconductor alloy portion 48S and an interface between the first drain region 34D and the drain-side metal semiconductor alloy portion 48D are located between a first horizontal plane including a bottom surface of the horizontally-extending portion of the dielectric capping mask 180M and a top surface of the horizontally-extending portion of the dielectric capping mask 180M.

In one embodiment, the first field effect transistor further comprises: a second doped well 12 laterally surrounding, and forming a p-n junction at an interface with, the first doped well 11; a well contact semiconductor region 38 overlying the second doped well 12; and a well contact metal-semiconductor alloy portion 48 contacting the well contact semiconductor region 38, wherein an interface between the well contact semiconductor region 38 and the well contact metal-semiconductor alloy portion 48 are located below a horizontal plane including bottom surfaces of the first source region 34S and the first drain region 34D.

Figure 26:
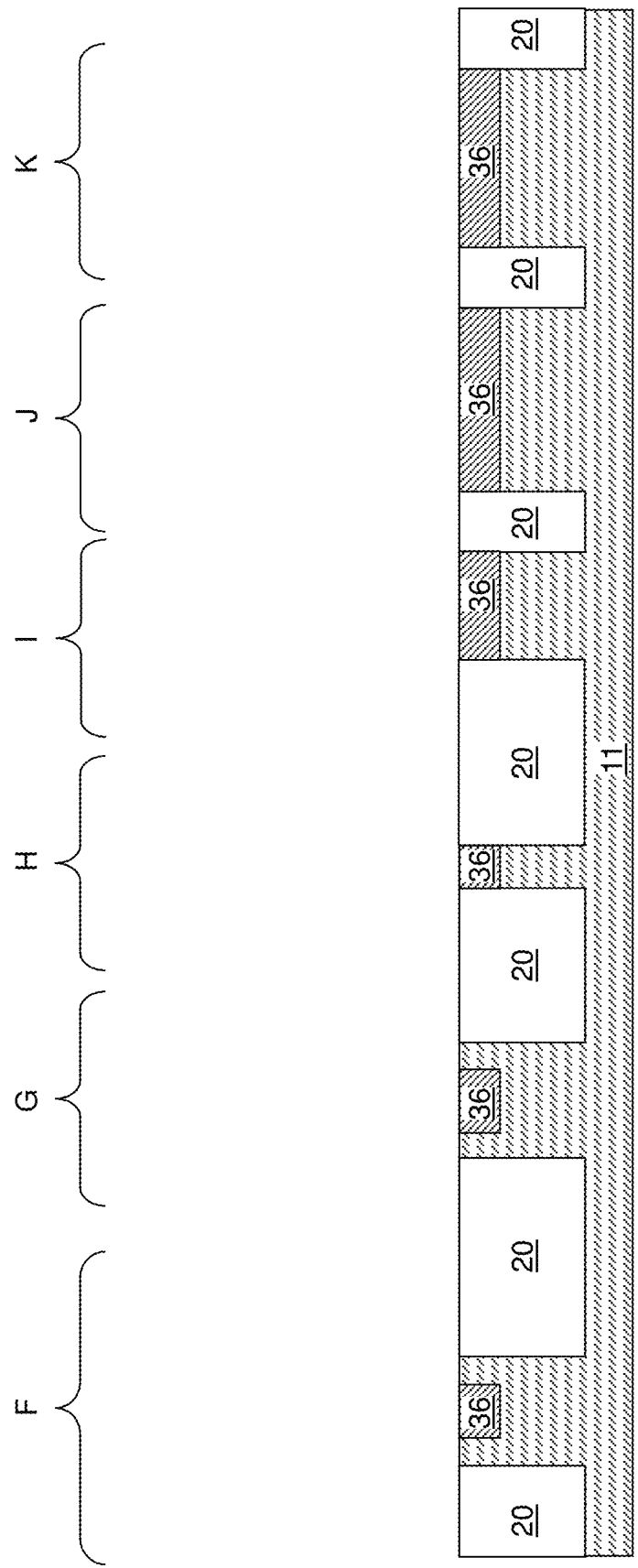
FIG. 26 is a vertical cross-sectional view of a third exemplary structure after formation of gate structures and buried source/drain regions according to a third embodiment of the present disclosure.

Referring to FIG. 26, a third exemplary structure according to a third embodiment of the present disclosure is illustrated after formation of gate structures and source/drain regions 36. The third exemplary structure may be derived from the first exemplary structure of FIG. 12 by forming a sidewall spacer 80 in lieu of a dielectric capping mask 80M. The view in FIG. 26 is rotated by 90 degrees with respect to the view in FIG. 12. In other words, the view in FIG. 26 is perpendicular to the source to drain direction of the transistors, while the view in FIG. 12 parallel to the to the source to drain direction of the transistors. Alternatively, the third exemplary structure may be derived from the second exemplary structure of FIG. 23 by omitting formation of the dielectric capping mask 180M and the dielectric spacers (177, 178).

Figure 36:
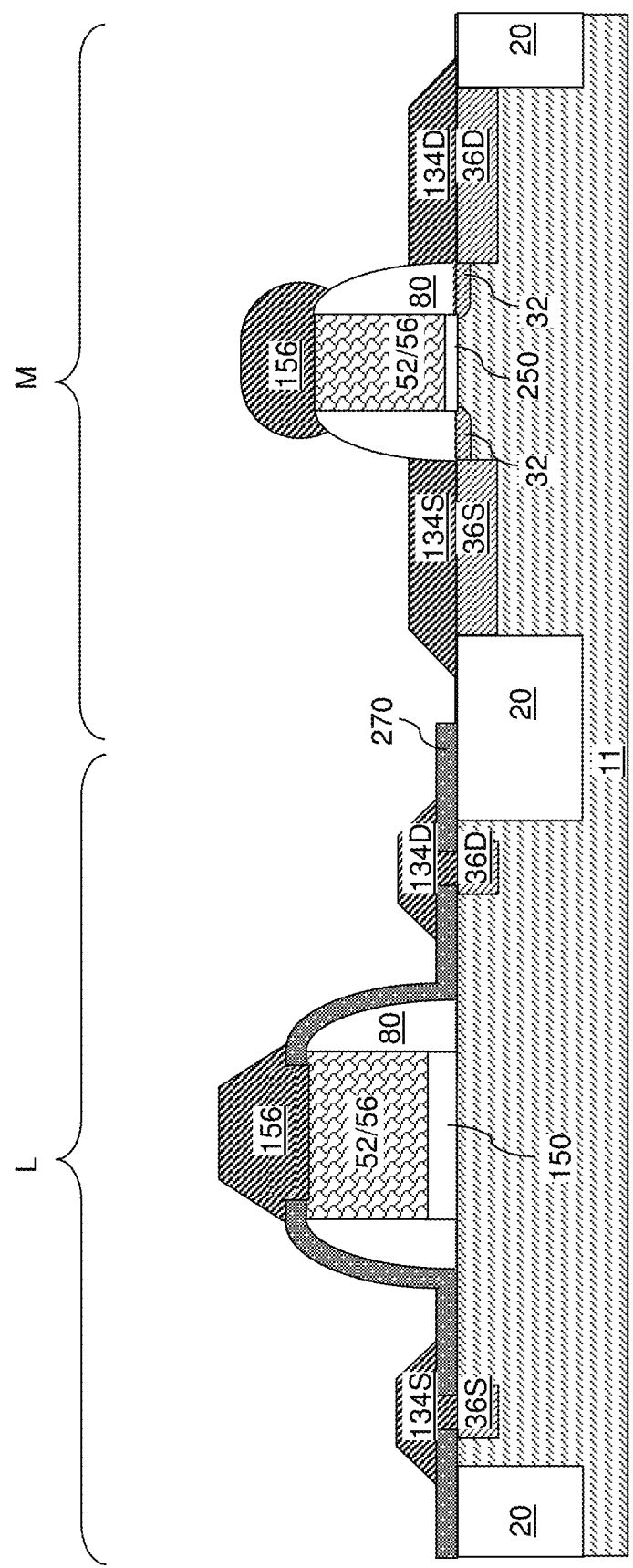
FIG. 36 is a vertical cross-sectional view of a configuration of the third exemplary structure at the processing steps of FIG. 28.

Multiple device regions (F, G, H, I, J, K) are illustrated in FIG. 26, which may differ from each other by the width of a respective active region in which source/drain regions (35, 36) and channel regions are formed. While the devices in FIG. 36 are shown as containing only second-conductivity-type source/drain regions 36, it is understood that first-conductivity-type source/drain regions 35 can be formed in additional device regions outside of the plane of FIG. 26. Generally, the source/drain regions (35, 36) may have various widths, and may, or may not, contact a sidewall of an adjacent shallow trench isolation structure 20. The device regions may correspond to the following transistors: high voltage NMOS transistors in device regions F and G, sense amplifier driving line (SADL) NMOS transistors (e.g., peripheral transistors of a memory array) in device regions H and I, low voltage NMOS transistor in device region J, and a resistor in device region K. In the resistor device region K, the doped region(s) (35, 36) may comprise doped contact regions rather than source/drain regions.

The source/drain regions (35, 36) that are present at this processing step can have top surfaces within a horizontal plane including a top surface of a first doped well 11 or within a horizontal plane including a top surface of a second doped well 12. As such, in the third embodiment, the source/drain regions (35, 36) at the processing steps of FIG. 26 are herein referred to as buried source/drain regions (35, 36). In one embodiment, the first doped well 11 may comprise a first single crystalline semiconductor material, and each buried source region (35, 36) and each buried drain region (35, 36) may comprise a second single crystalline semiconductor material and may be epitaxially aligned to the first single crystalline semiconductor material. Generally, the buried source/drain regions (35, 36) can be formed by employing masked ion implantation processes that employ a respective implantation mask which defines areas to be implanted with electrical dopants.

Figure 27:
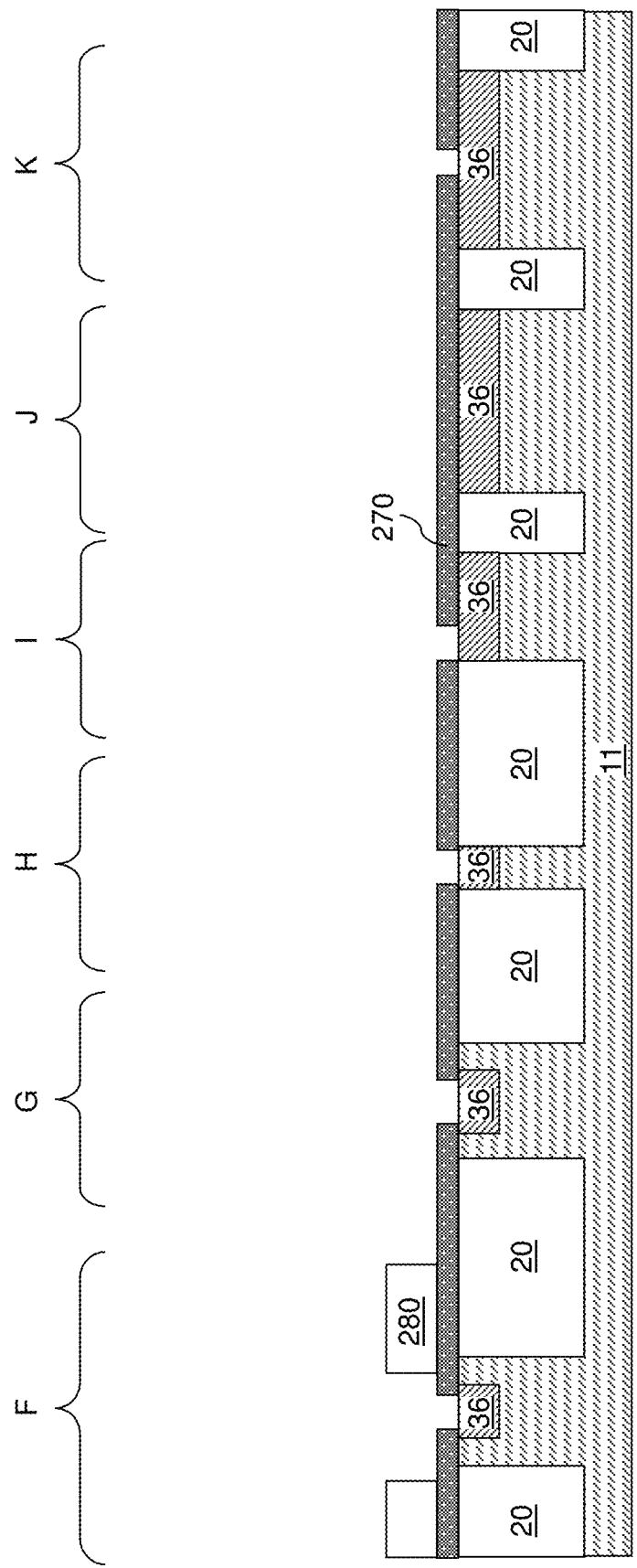
FIG. 27 is a vertical cross-sectional view of the third exemplary structure after formation of at least one dielectric capping mask according to the third embodiment of the present disclosure.

Referring to FIG. 27, at least one dielectric capping mask (270, 280) can be formed over the doped wells (11, 12), the buried source/drain regions (35, 36), and the shallow trench isolation structures 20. Each of the at least one dielectric capping mask (270, 280) can be formed by deposition and patterning of a respective dielectric capping mask layer including a respective dielectric material. For example, the at least one dielectric capping mask (270, 280) may comprise a first dielectric capping mask 270 that is formed directly on the top surface of the doped wells (11, 12), the buried source/drain regions (35, 36), and the shallow trench isolation structures 20 and over the gate structures. Further, the at least one dielectric capping mask (270, 280) may comprise a second dielectric capping mask 280 that is formed over the first dielectric capping mask 270. In an illustrative example, the first dielectric capping mask 270 may comprise a first dielectric material such as silicon nitride, and may have a thickness in a range from 5 nm to 100 nm, such as from 10 nm to 50 nm, and the second dielectric capping mask 280, if present, may comprise a second dielectric material such as silicon oxide, and may have a thickness in a range from 5 nm to 100 nm, such as from 10 nm to 50 nm.

In one embodiment, the first dielectric capping mask 270 may include vertically-extending portions that laterally surround a respective gate electrode {(51, 55), (52, 56)}, top portions that overlies a peripheral region of a top surface of the respective gate electrode {(51, 55), (52, 56)}, and horizontally-extending portions that contacts top surfaces of the first doped well 11 and a second doped well 12 and contact top surfaces of the buried source/drain regions (35, 36). The horizontally-extending portions of the first dielectric capping mask 270 include openings for enabling a selective epitaxy process in a subsequent processing step. A top surface of a respective second-conductivity-type buried source/drain region 36 can be physically exposed within each opening in the first dielectric capping mask 270. Optionally, a second dielectric capping mask 280 may be formed over the first dielectric capping mask 270. Openings can be formed through horizontally-extending portions of the second dielectric capping mask 280. Each opening through the first dielectric capping mask 270 can be located within a respective opening through the second dielectric capping mask 280.

In one embodiment, the openings in first dielectric capping mask 270 may be formed over the buried source/drain regions 36 in all device regions F, G, H, I and K except the device region J (e.g., the low voltage transistor device region, in which the buried source/drain region 36 is covered by the first dielectric capping mask 270. Furthermore, the second dielectric capping mask 280 may be formed only in device region F (e.g., one of the high voltage transistor device regions). Furthermore, the opening in the second dielectric capping mask 280 formed over the buried source/drain region 36 in device region F may be wider than the underlying opening in first dielectric capping mask 270 formed over the same buried source/drain region 36 in the same device region F.

Figure 28:
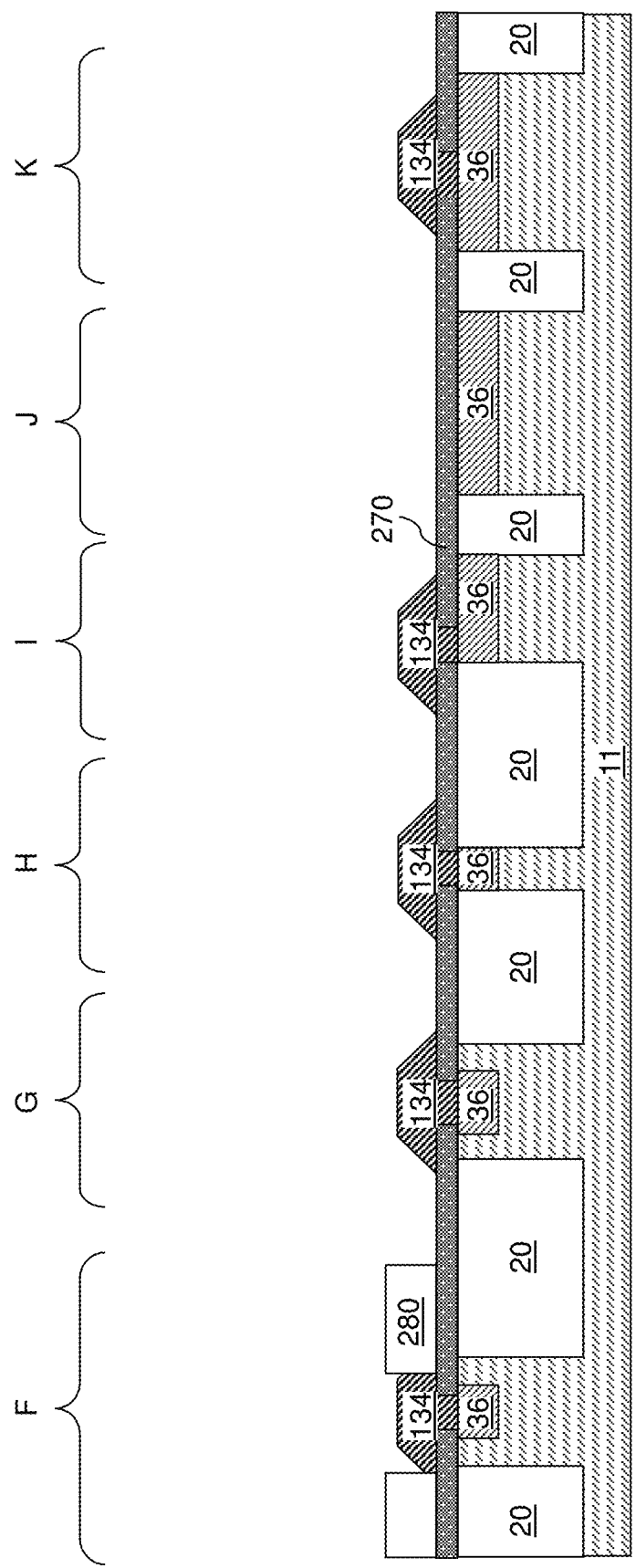
FIG. 28 is a vertical cross-sectional view of a third exemplary structure after formation of raised source/drain regions according to the third embodiment of the present disclosure.

Referring to FIG. 28, a selective epitaxy process can be performed to grow a single crystalline semiconductor material through, and over the openings in the first dielectric capping mask 270. The selective epitaxy process selectively grow the single crystalline semiconductor material from the physically exposed surfaces of the buried source/drain regions 36. The selective epitaxy process grows a single crystalline semiconductor material, such as silicon, having a doping of the second conductivity type from physically exposed surfaces of the second-conductivity-type buried source/drain regions 36 while suppressing growth of any semiconductor material from the physically exposed surfaces of the dielectric capping masks (270, 280). The third exemplary structure can be placed in a vacuum-tight process chamber, and a semiconductor-containing precursor gas and an etchant gas can be concurrently or alternately flowed into the process chamber to effect the selective epitaxy process. Exemplary semiconductor-containing precursor gases comprise silane, dichlorosilane, trichlorosilane, disilane, digermane, etc. An exemplary etchant gas is hydrogen chloride. Raised source/drain regions 134 having a doping of the second conductivity type can be formed through, and above, the openings in the first dielectric capping mask 270 and within the openings in the second dielectric capping mask 280 (if present). Generally, the second dielectric capping mask 280 may be employed to limit the lateral extent of the raised source/drain regions 134 in the high voltage transistor device region F.

In one embodiment, the selective epitaxy process can grow a doped semiconductor material having a doping of the second conductivity type by flowing a dopant gas during the selective epitaxy process. If the second conductivity type is n-type, the dopant gas may comprise phosphine, arsine, or stibine. If the second conductivity type is p-type, the dopant gas may comprise diborane. The raised source/drain regions 134 can include dopants of the second conductivity type at an average atomic concentration in a range from $1.0 \times 10^{19}/\text{cm}^3$ to $2.0 \times 10^{21}/\text{cm}^3$, such as from $2.0 \times 10^{20}/\text{cm}^3$ to $1.0 \times 10^{21}/\text{cm}^3$, although lesser and greater average atomic concentrations can also be employed.

The raised source/drain regions 134 comprise raised source regions that function as a portion of a respective source region and raised drain regions that function as a portion of a respective drain region. The openings in the dielectric capping masks (270, 280) comprise source-side opening through which raised source regions are grown and drain-side openings through which raised drain regions are grown. Portions of a semiconductor material can be grown through, and above, the source-side openings and the drain-side openings in the dielectric capping masks (270, 280).

The third exemplary structure can comprise a first raised source region and a first raised drain region that is formed in a first device region, which may be, for example, device region F, device region G, device region H, device region I, or device region K. The raised source/drain regions 134 may be omitted in device region J (i.e., the low voltage transistor device region). Portions of the semiconductor material of the first raised source region and the first raised drain region are grown from physically exposed surfaces of the single crystalline semiconductor material of the buried source/drain regions 36 by a selective epitaxy process. Portions of the semiconductor material of the first raised source region and the first raised drain region can be grown over, and on, a top surface of the horizontally-extending portion of the first dielectric capping mask 270. The first raised source region 134 can contact a top surface of the first buried source region 36, and can comprise a portion located within the source-side opening of the first dielectric capping mask 270, and the first raised drain region 134 can contact a top surface of the first buried drain region 36 and can comprise a portion located within the drain-side opening of the first dielectric capping mask 270.

In one embodiment, the first doped well 11 can comprise a first single crystalline semiconductor material, and the buried source/drain regions 36 can comprise a second single crystalline semiconductor material in epitaxial alignment with the first single crystalline semiconductor material. The first raised source region 134 and the first raised drain region 134 can comprise a third single crystalline semiconductor material, and can be epitaxially aligned to the first buried source region 36 or the first buried drain region 36. A horizontal interface between the first raised source region 134 and the first buried source region 36 and a horizontal interface between the first raised drain region 134 and the first buried drain region 36 may be located within a horizontal plane including a top surface of the first doped well 11.

According to an embodiment of the present disclosure, the first raised source region 134 comprises a horizontally-extending portion contacting a first segment of a top surface of the horizontally-extending portion of the first dielectric capping mask 270, and the first raised drain region 134 comprises a horizontally-extending portion contacting a second segment of the top surface of the horizontally-extending portion of the first dielectric capping mask 270. In one embodiment, a top periphery of the first buried source region 36 is located entirely within a periphery of the first raised source region 134 in a plan view (such as a top-down view) along a direction that is perpendicular to a top surface of the substrate, and a top periphery of the first buried drain region 36 is located entirely within a periphery of the first raised drain region 134 in the plan view.

In the high voltage transistor device region F, the raised source/drain regions 134 may extend over the shallow trench isolation structure 20 in one direction and have their lateral extent limited by the first dielectric capping mask 270 in an opposite direction (e.g., in the direction toward the adjacent high voltage transistor device region G).

Additional dielectric capping masks (not shown) and an additional selective epitaxy process may be employed to grow raised source/drain regions having a doping of the first conductivity type from first-conductivity-type buried source/drain regions (not shown). Alternatively, the selective epitaxy process may grow undoped semiconductor materials, and masked ion implantation processes may be performed to introduce first-conductivity-type dopants or second-conductivity-type dopants into different subsets of the epitaxially grown semiconductor material portions, thereby forming raised source/drain regions 134 having a doping of the second conductivity type and forming additional raised source/drain regions (not shown) having a doping of the first conductivity type.

Figure 29:
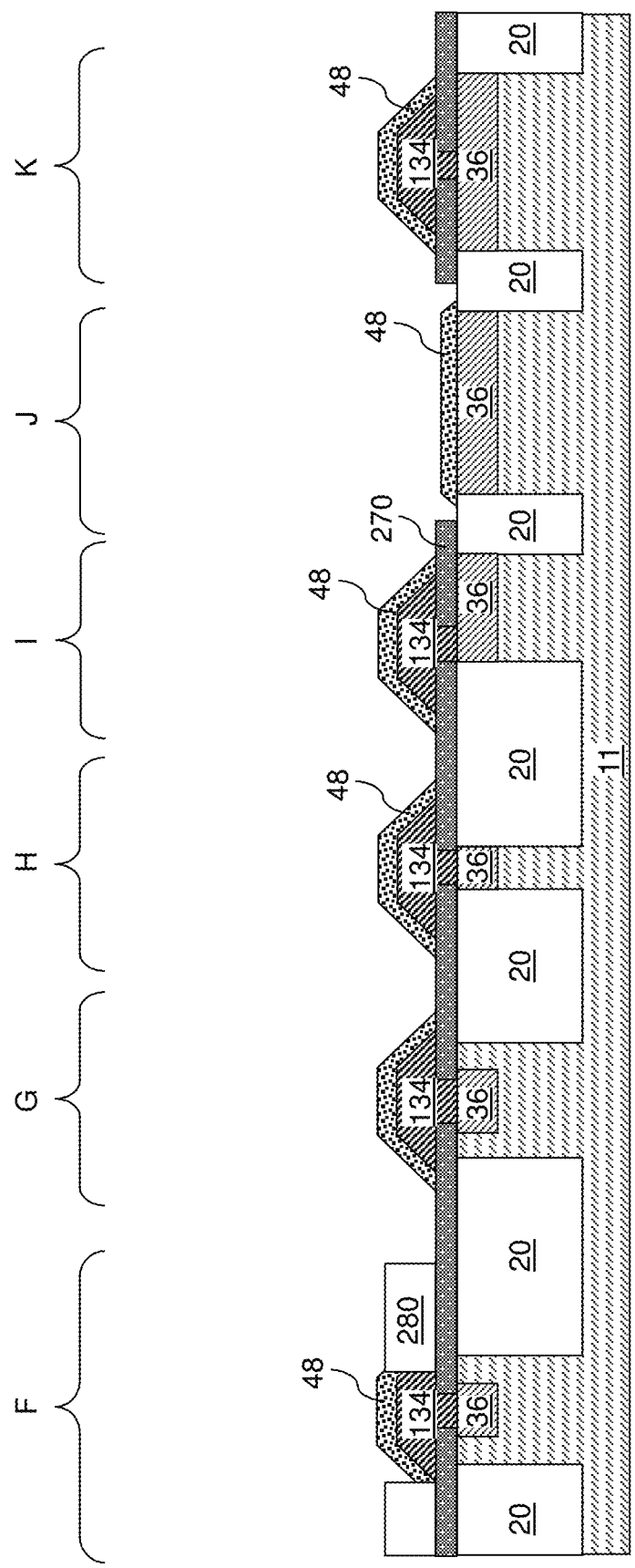
FIG. 29 is a vertical cross-sectional view of a third exemplary structure after formation of metal-semiconductor alloy portions according to the third embodiment of the present disclosure.

Referring to FIG. 29, the dielectric capping masks (270, 280) may be patterned to physically expose one or more buried source/drain regions 36 and/or doped semiconductor material portions. For example, the first dielectric capping mask 270 may be removed by photolithography and etching in the low voltage transistor device region J to exposed to buried source/drain region 36 in device region J.

The processing steps of FIG. 15 or FIG. 24 can then be performed to form various meal-semiconductor alloy portions 48, such as platinum nickel silicide portions 48. The metal-semiconductor alloy portions 48 may comprise source-side metal-semiconductor alloy portions that are formed on raised source regions (which are a first subset of the raised source/drain regions 134) in device regions F-I or on the buried source/drain regions 36 in device region J, drain-side metal-semiconductor alloy portions that are formed on raised drain regions (which are a second subset of the raised source/drain regions 134) in device regions F-I or on the buried source/drain regions 36 in device region J, well contact metal-semiconductor alloy portions that are formed on the well contact semiconductor regions 38, gate contact metal-semiconductor alloy portions that are formed on gate electrodes {(51, 55), (52, 56)}, and a top electrode contact metal-semiconductor alloy portion that is formed on a top electrode (53, 55) of the capacitor structure (51, 64, 53, 55).

A first source region can include a combination of a first buried source region 36 and a first raised source region 134 in device regions F-I. A first drain region can comprise a combination of a first buried drain region 36 and a first raised drain region 134 in device regions F-I. In one embodiment, a first source-side metal-semiconductor alloy portion 48 and a first drain-side metal-semiconductor alloy portion 48 can be formed in a first device region (e.g., device regions F-I) by depositing first portions of a metallic material on the first raised source region 134 and the first raised drain region 134 and inducing formation of first metal-semiconductor alloy portions 48. The first source-side metal-semiconductor alloy portion 48 is electrically connected to the first source region and comprises a portion that overlies the source-side opening in the first dielectric capping mask 270. The first drain-side metal-semiconductor alloy portion 48 is electrically connected to the first drain region and comprises a portion that overlies the drain-side opening in the first dielectric capping mask 270. In the low voltage transistor device region J, the metal-semiconductor alloy portion 48 is formed in direct contact with the buried source/drain regions 36.

A portion of the first doped well 11 can embed the first buried source region 36 and the first buried drain region 36, and is laterally surrounded by a shallow trench isolation structure 20. In one embodiment, at least one of the first raised source region 134 and the first raised drain region 134 comprises a portion having an areal overlap with the shallow trench isolation structure 20. In other words, a periphery of the first raised source region 134 and/or a periphery of the first raised drain region 134 may have an overlap with the shallow trench isolation structure 20, such as in device region F.

In one embodiment, each of the first source-side metal-semiconductor alloy portion 48 and the first drain-side metal-semiconductor alloy portion 48 comprises a central region that is vertically spaced from the horizontally-extending portion of the first dielectric capping mask 270, and comprises a peripheral region contacting a respective annular surface segment of the top surface of the first dielectric capping mask 270.

Figure 30:
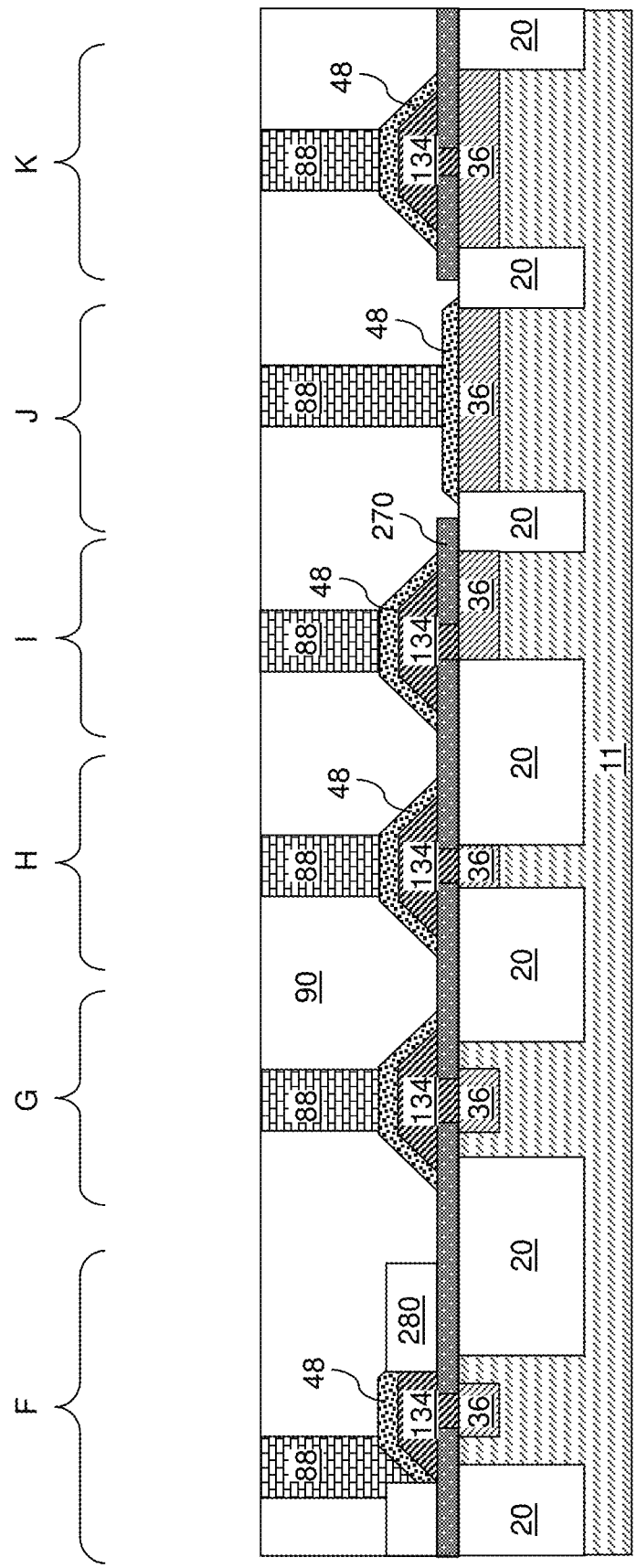
FIG. 30 is a vertical cross-sectional view of the third exemplary structure after formation of a contact-level dielectric layer and various contact via structures according to the third embodiment of the present disclosure.

Referring to FIG. 30, the processing steps of FIG. 16 or the processing steps of FIG. 25 can be performed to form a contact-level dielectric layer 90 and various contact via structures (87, 88, 86). The contact via structures (87, 88, 86) can include active region contact via structures 88 that contact a respective one of the source-side metal-semiconductor alloy portions 48, the drain-side metal-semiconductor alloy portions 48, and the well contact metal-semiconductor alloy portion 48, and are electrically connected to a respective one of the source/drain regions (35, 36) and the well contact semiconductor region 38. Further, the contact via structures (87, 88, 86) can include gate contact via structures 87 that contact a respective one of gate-side metal-semiconductor alloy portions and are electrically shored to a respective one of the gate electrodes {(51, 55), (52, 56)}. In addition, the contact via structures (87, 88, 86) can include a top electrode contact via structure 86 that contacts a metal-semiconductor alloy portion 48 that contacts a top surface of the top electrode (53, 55). Each of the contact via structures (87, 88, 86) may comprise a respective metallic liner (87A or 88A) and a respective fill material portion (87B or 88B).

Figure 31:
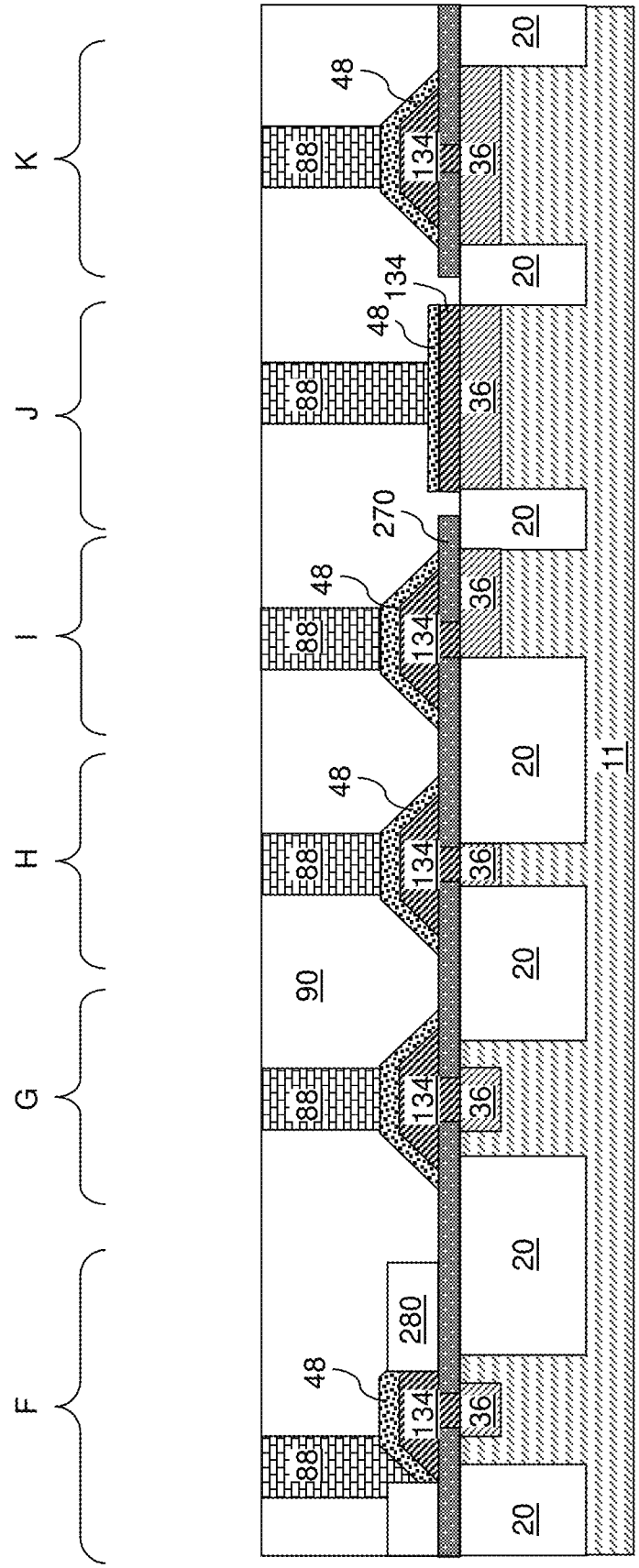
FIG. 31 is a vertical cross-sectional view of a first alternative configuration of the third exemplary structure according to the third embodiment of the present disclosure.

Referring to FIG. 31, a first alternative configuration of the third exemplary structure is illustrated, which can be derived from the third exemplary structure illustrated in FIG. 30 by also forming the raised source and drain regions 134 in the low voltage transistor device region J at the same time as forming the raised source and drain regions 134 in the other device regions. In this configuration, the respective metal-semiconductor alloy portions 48 contacts the raised source and drain regions 134 in the device region J.

Figure 32A:
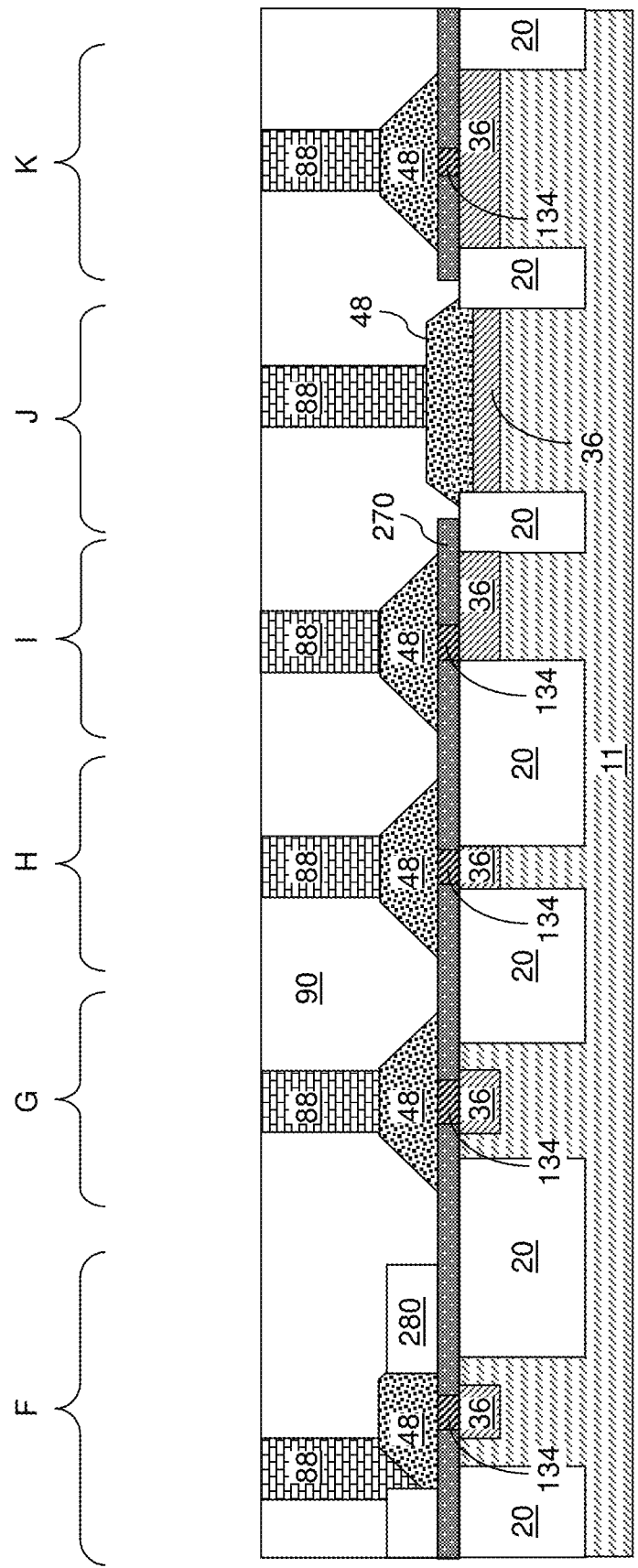
FIGS. 32A and 32B are vertical cross-sectional views of second and third alternative configurations of the third exemplary structure according to the third embodiment of the present disclosure.

Referring to FIG. 32A, a second alternative configuration of the third exemplary structure is illustrated, which can be derived from the third exemplary structure illustrated in FIG. 30 by increasing the thickness of metal-semiconductor alloy portions 48. For example, the thickness of the metallic material (such as at least metal or alloy) for forming a metal-semiconductor alloy can be increased, and the duration of the anneal time can be increased so that the thickness of the metal-semiconductor alloy portions 48 is increased. In one embodiment, the thickness of the metal-semiconductor alloy portions 48 can be increased such that all portions of the doped semiconductor material of the raised source/drain regions 134 overlying the horizontal plane including the top surface of the first dielectric capping mask 270 are consumed during the silicidation reaction. Raised source/drain regions 134 can be present within openings through the first dielectric capping mask 270.

Figure 32B:
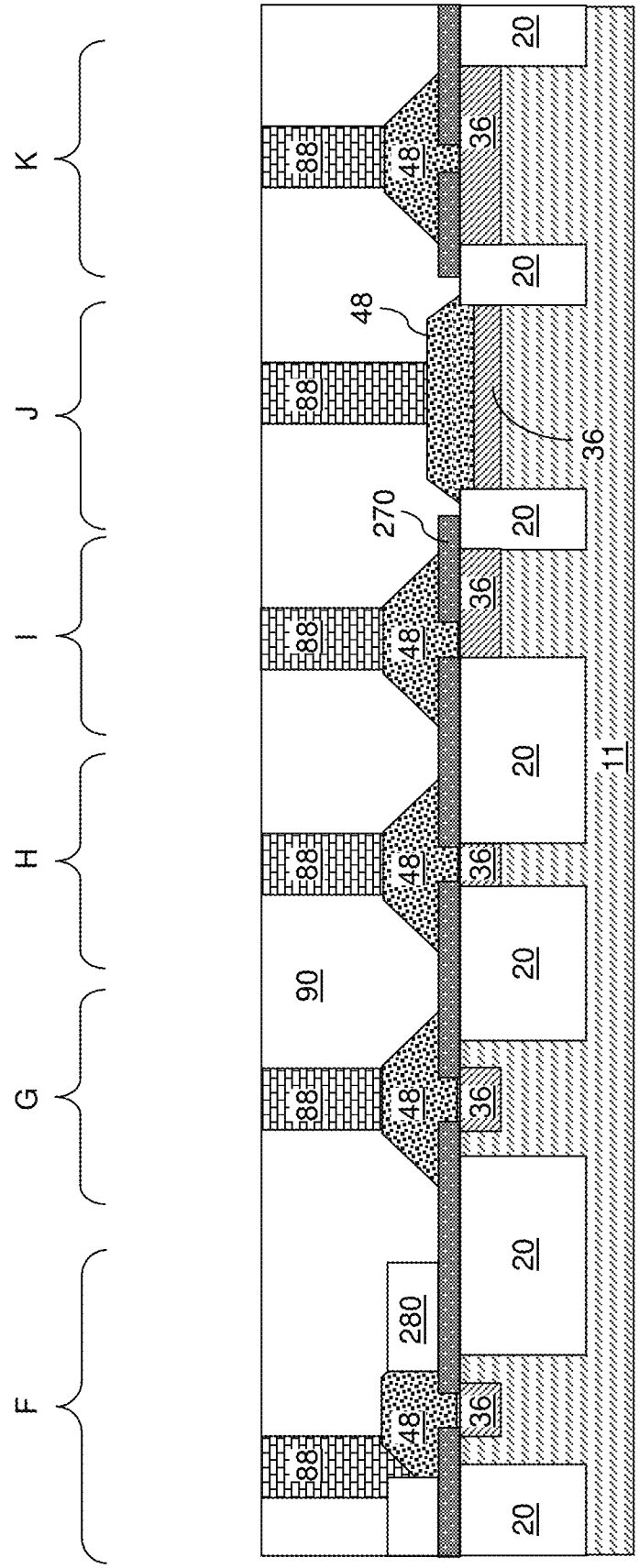

Referring to FIG. 32B, a third alternative configuration of the third exemplary structure is illustrated, which can be derived from the third exemplary structure illustrated in FIG. 30 by increasing the thickness of metal-semiconductor alloy portions 48. For example, the thickness of the metallic material (such as at least one metal or alloy) for forming a metal-semiconductor alloy can be increased, and the duration of the anneal time can be increased so that the entirety of the raised source/drain regions 134 is consumed during formation of the metal-semiconductor alloy portions 48. In this case, downward-protruding portions of the metal-semiconductor alloy portions 48 can be present within openings through the first dielectric capping mask 270. In one embodiment, a first source-side metal-semiconductor alloy portion 48 comprises a portion located within a source-side opening in the first dielectric capping mask 270 and can contact a first buried source region 36, and a first drain-side metal-semiconductor alloy portion 48 comprises a portion located within a drain-side opening in the first dielectric capping mask 270 and contacting a first buried drain region 36.

Figure 33:
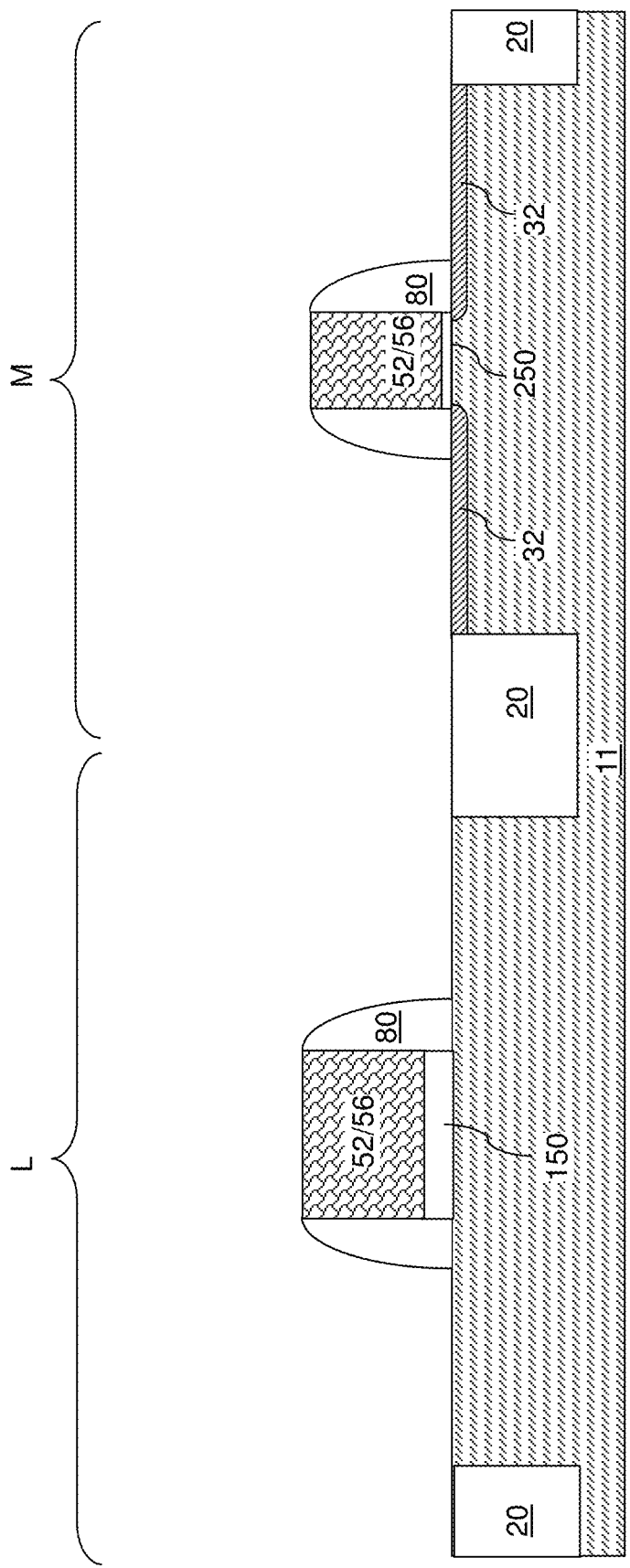
FIG. 33 is a vertical cross-sectional view of a configuration for forming the third exemplary structure of FIG. 26 after formation of gate structures and source/drain extension regions according to the third embodiment of the present disclosure.

Referring to FIG. 33, an exemplary structure for forming the third exemplary structure of FIG. 26 is illustrated after formation of gate structures (150 or 250, 52/56, 80) and source/drain extension regions 32 according to the third embodiment of the present disclosure. Generally, a first doped well 11 can be formed within a substrate. The first doped well 11 comprises a first single crystalline semiconductor material. A shallow trench isolation structure 20 can be formed in an upper portion of the substrate around a portion of the first doped well 11 within a first device region such as a high voltage transistor device region L. A first gate dielectric (such as a first-thickness gate dielectric 150), a first gate electrode (52, 56), and a first sidewall spacer 80 can be formed over the first doped well 11 within a first device region (such as device region L). A second gate dielectric 250 (which may be a second-thickness gate dielectric having a lower thickness than the first-thickness gate dielectric 150), a second gate electrode (52, 56), and a second sidewall spacer 80 can be formed over the substrate within a second device region (such as a low voltage transistor device region M) that is laterally spaced from the first device region. The width of the gate electrode (52, 56) in the high voltage transistor device region L may be greater than the width of the gate electrode (52, 56) in the low voltage transistor device region M.

Figure 34:
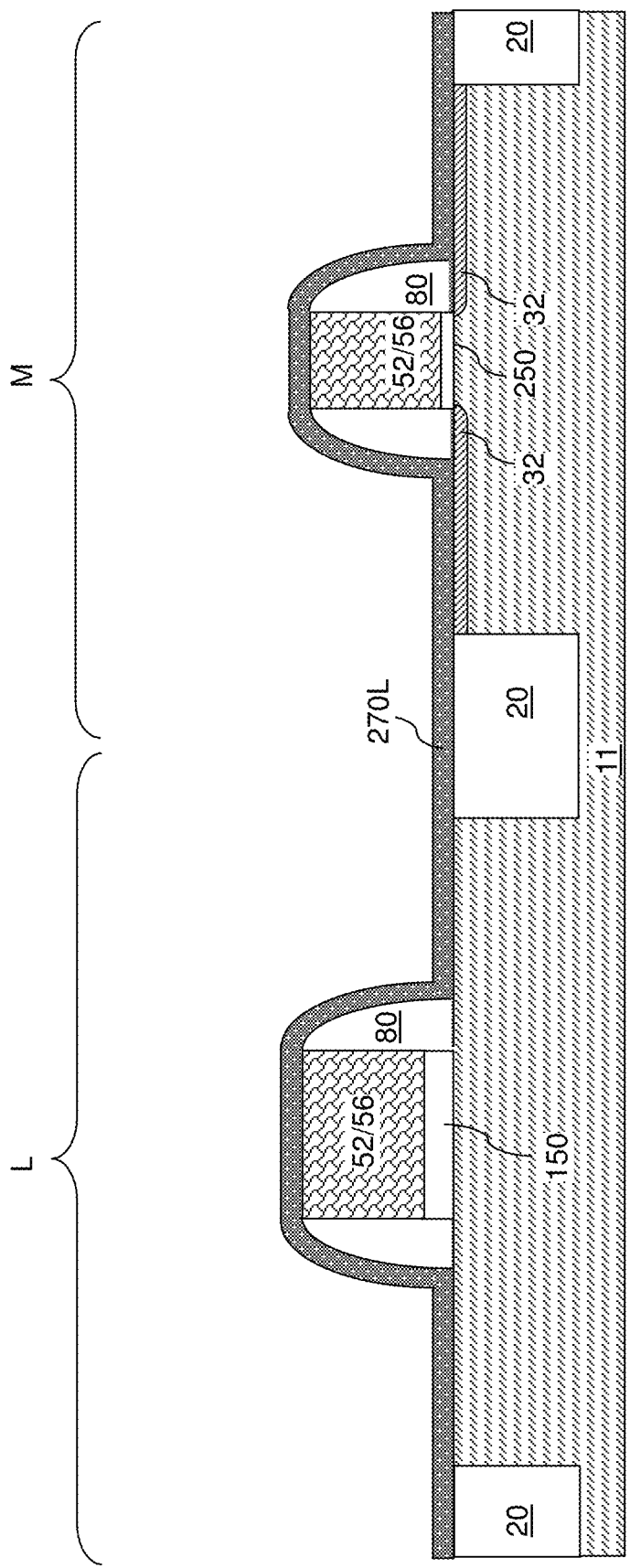
FIG. 34 is a vertical cross-sectional view of the configuration for forming the third exemplary structure of FIG. 26 after formation of a first dielectric capping mask layer according to the third embodiment of the present disclosure.

Referring to FIG. 34, a first dielectric capping mask layer 270L can be formed over the first gate electrode (52, 56), the second gate electrode (52, 56), and the first doped well 11. The first dielectric capping mask 270 as described above comprises a patterned portion of the first dielectric capping mask layer 270L.

Figure 35:
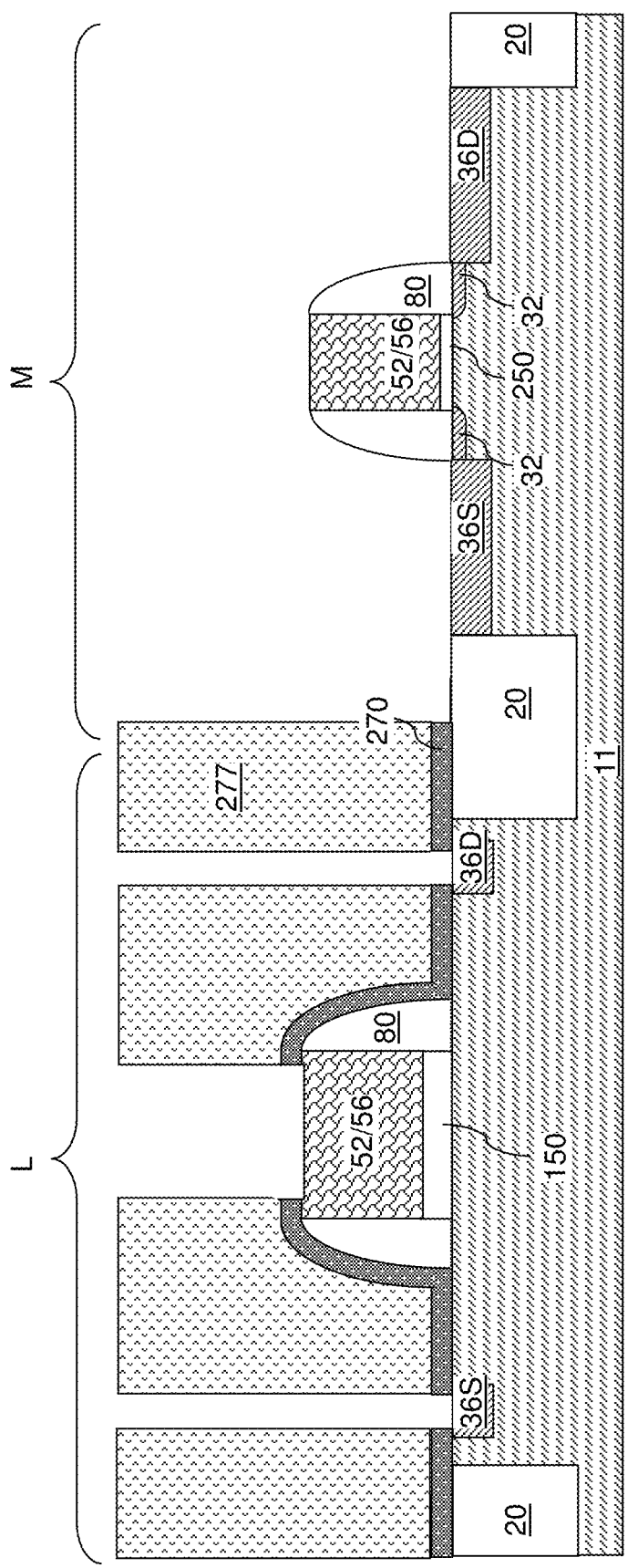
FIG. 35 is a vertical cross-sectional view of the configuration for forming the third exemplary structure of FIG. 26 after patterning the first dielectric capping mask layer according to the third embodiment of the present disclosure.

Referring to FIG. 35, a photoresist layer 277 can be applied over the first dielectric capping mask layer 270, and can be lithographically patterned to cover some device regions (such as device region L) without covering some other device regions (such as device region M). The photoresist layer 277 includes openings in area that overlie each gate electrode (52, 56)) within the covered device regions. Further, the photoresist layer 277 can include openings in areas in which buried source/drain regions 36 are to be subsequently formed. An etch process can be performed to remove unmasked portions of the first dielectric capping mask layer 270L. The remaining portions of the first dielectric capping mask layer 270L comprise a first dielectric capping mask 270. In one embodiment, the first dielectric capping mask 270 covers a predominant portion of a first device region, and the first dielectric capping mask layer 270L can be removed from a second device region.

In one embodiment, the first dielectric capping mask 270 comprises a vertically-extending portion that laterally surrounds the first gate electrode (52, 56), a top portion that overlies a peripheral region of a top surface of the first gate electrode (52, 56), and a horizontally-extending portion that overlies the first doped well 11 outside an area of the first gate dielectric 150. A source-side opening and a drain-side opening can be formed in the first device region (such as device region L) through a horizontally-extending portion of the first dielectric capping mask 270, which contacts the first doped well 11.

Dopants of the second conductivity type can be implanted through the source-side opening and the drain-side opening in upper portions of the first doped well 11 to form a first buried source region 36S and a first buried drain region 36D. The upper periphery of the first buried source region 36S can be self-aligned to the source-side opening, and can be laterally offset outward by a uniform lateral offset distance from the periphery of the source-side opening. The upper periphery of the first buried drain region 36D can be self-aligned to the drain-side opening, and can be laterally offset outward by a uniform lateral offset distance from the periphery of the drain-side opening.

A second buried source region 36S and a second buried drain region 36D can be formed within a second device region (such as device region M) by implantation of dopants of the second conductivity type into portions of the first doped well 11 that are not masked by the first dielectric capping mask 270 and the gate structure (52, 56, 80). The photoresist layer 277 can be subsequently removed, for example, by ashing.

Referring to FIG. 36, a second dielectric capping mask 280 (not illustrated) may be optionally formed. A selective epitaxy process can be performed to form raised source/drain regions 134 and raised gate regions 156. The raised source/drain regions 134 can include a doped semiconductor material having a doping of the same conductivity type as the buried source/drain regions 36. For example, the raised source/drain regions 134 can include a doped semiconductor material having a doping of the second conductivity type. The raised source/drain regions 134 and the raised gate regions 156 can be simultaneously formed by the selective epitaxy process. The process parameters of the selective epitaxy process at the processing steps of FIG. 36 may be the same as the process parameters of the selective epitaxy process at the processing steps of FIG. 20. The third exemplary structure illustrated in FIG. 28 can be provided after the processing steps of FIG. 36.

In one embodiment, a first raised source region 134S and a first raised drain region 134D can be formed in the first device region (such as device region L) by selectively growing first portions of a semiconductor material through, and above, the source-side opening and the drain-side opening in the first dielectric capping mask 270, respectively. The first portions of the semiconductor material of the first raised source region 134S and the first raised drain region 134D can be grown from physically exposed surfaces of the first single crystalline semiconductor material of the buried source/drain regions 36 by a selective epitaxy process. In one embodiment, the first portions of the semiconductor material of the first raised source region 134S and the first raised drain region 134D can be grown over, and on, a top surface of the horizontally-extending portion of the first dielectric capping mask 270.

In one embodiment, a second buried source region 36S and a second buried drain region 36D may be formed within areas of the second device region (such as device region M) that is not covered by the second gate electrode (52, 56) and the second sidewall spacer 80 in the second device region. A second raised source region 134S and a second raised drain region 134D can be formed by selectively growing second portions of the semiconductor material from top surfaces of the second buried source region 36S and the second buried drain region 36D.

Figure 37:
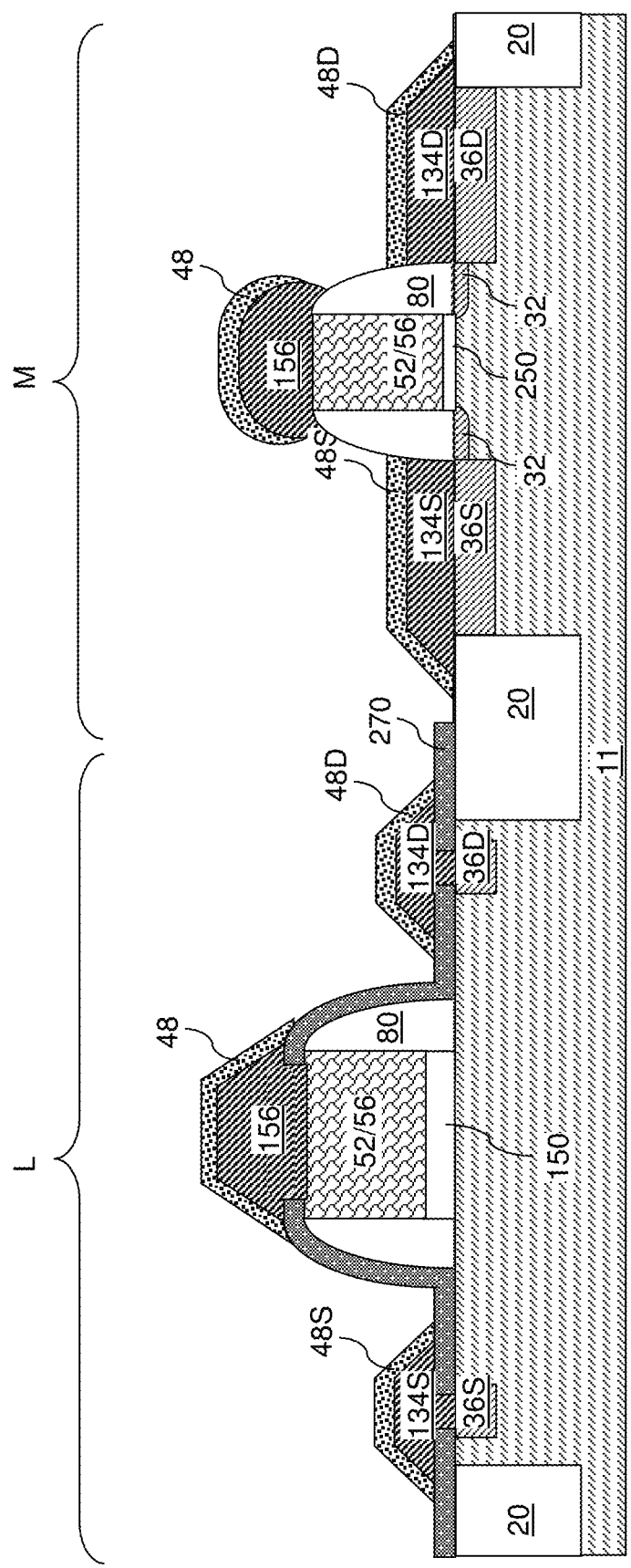
FIG. 37 is a vertical cross-sectional view of a configuration of the third exemplary structure at the processing steps of FIG. 29.

Referring to FIG. 37, the processing steps of FIG. 29 can be performed to form various metal-semiconductor alloy portions 48. A first source-side metal-semiconductor alloy portion 48S and a first drain-side metal-semiconductor alloy portion 48D can be formed in the first device region (such as device region L) by depositing first portions of a metallic material on the first raised source region 134S and the first raised drain region 134D and inducing formation of first metal-semiconductor alloy portions. A second source-side metal-semiconductor alloy portion 48S and a second drain-side metal-semiconductor alloy portion 48D can be formed in the second device region (such as device region M) by depositing second portions of the metallic material on the second raised source region 134S and the second raised drain region 134D and inducing formation of second metal-semiconductor alloy portions.

Figure 38:
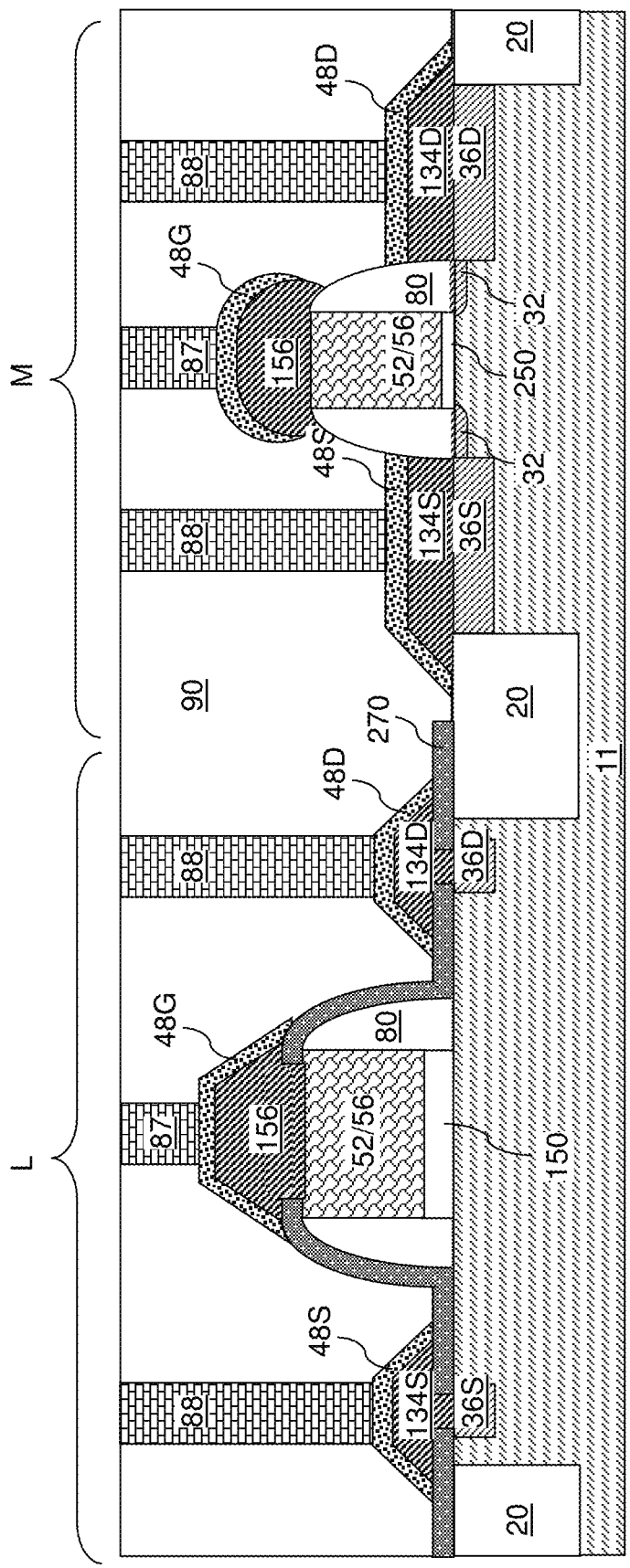
FIG. 38 is a vertical cross-sectional view of a configuration of the third exemplary structure at the processing steps of FIG. 30.

Referring to FIG. 38, the processing steps of FIG. 30 can be performed to form a contact-level dielectric layer 90 and various contact via structures 88.

Figure 39A:
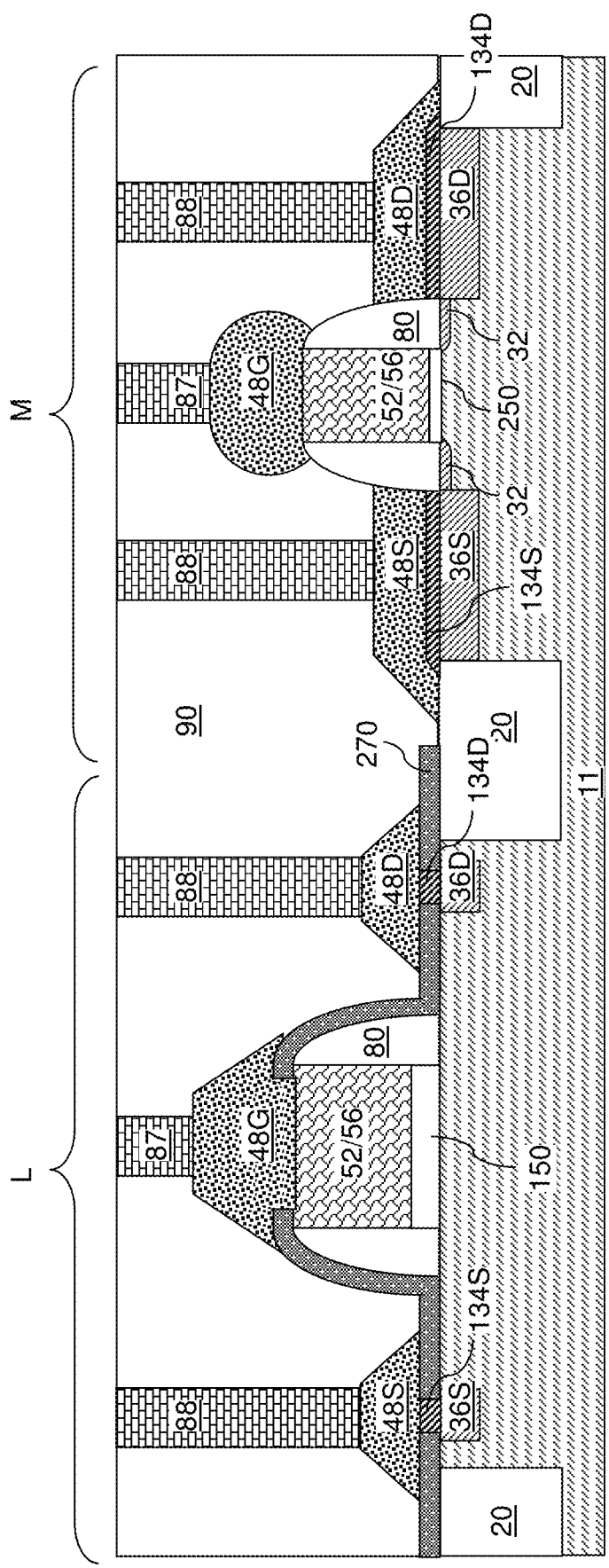
FIG. 39A is a vertical cross-sectional view of the second alternative configuration of the third exemplary structure at the processing steps of FIG. 32A.

Referring to FIG. 39A, a first alternative configuration of the third exemplary structure is illustrated, which can be another portion of the third exemplary structure illustrated in FIG. 32A.

Figure 39B:
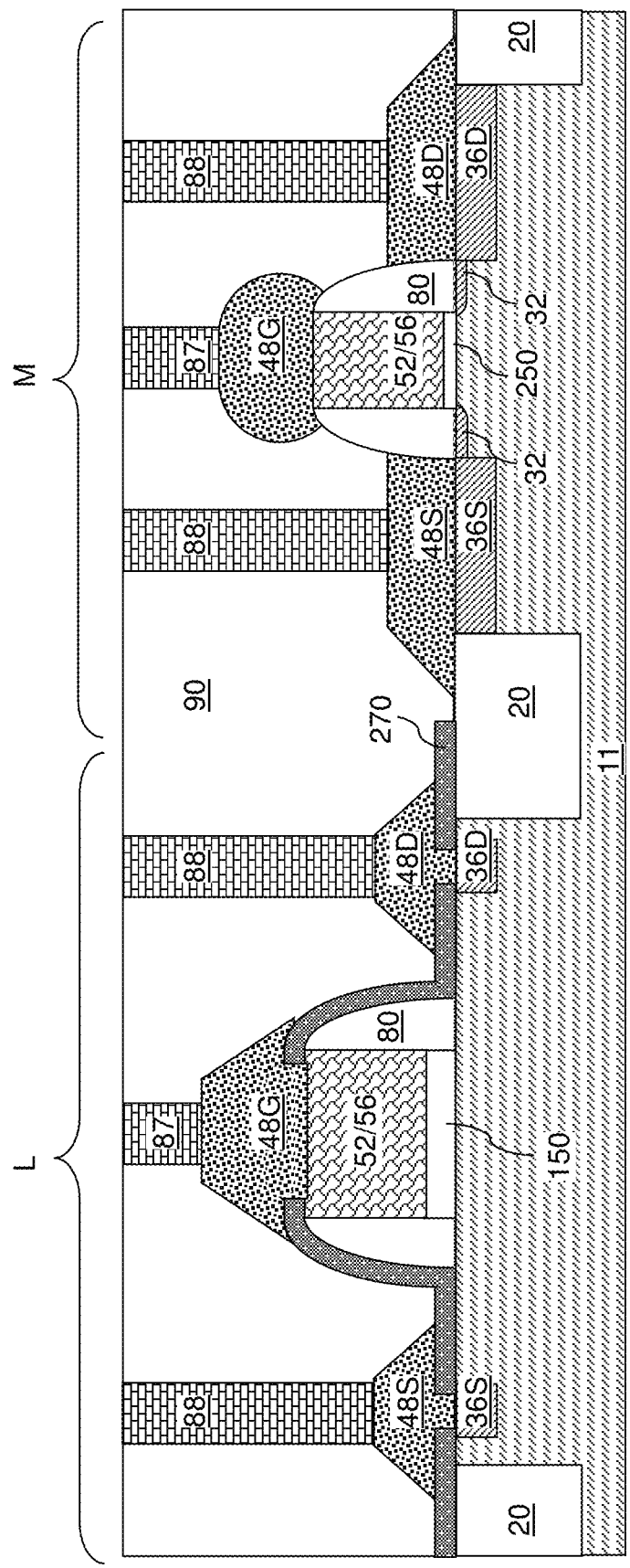
FIG. 39B is a vertical cross-sectional view of the third alternative configuration of the third exemplary structure at the processing steps of FIG. 32B.

Referring to FIG. 39B, a second alternative configuration of the third exemplary structure is illustrated, which can be another portion of the third exemplary structure illustrated in FIG. 32B.

Figure 40:
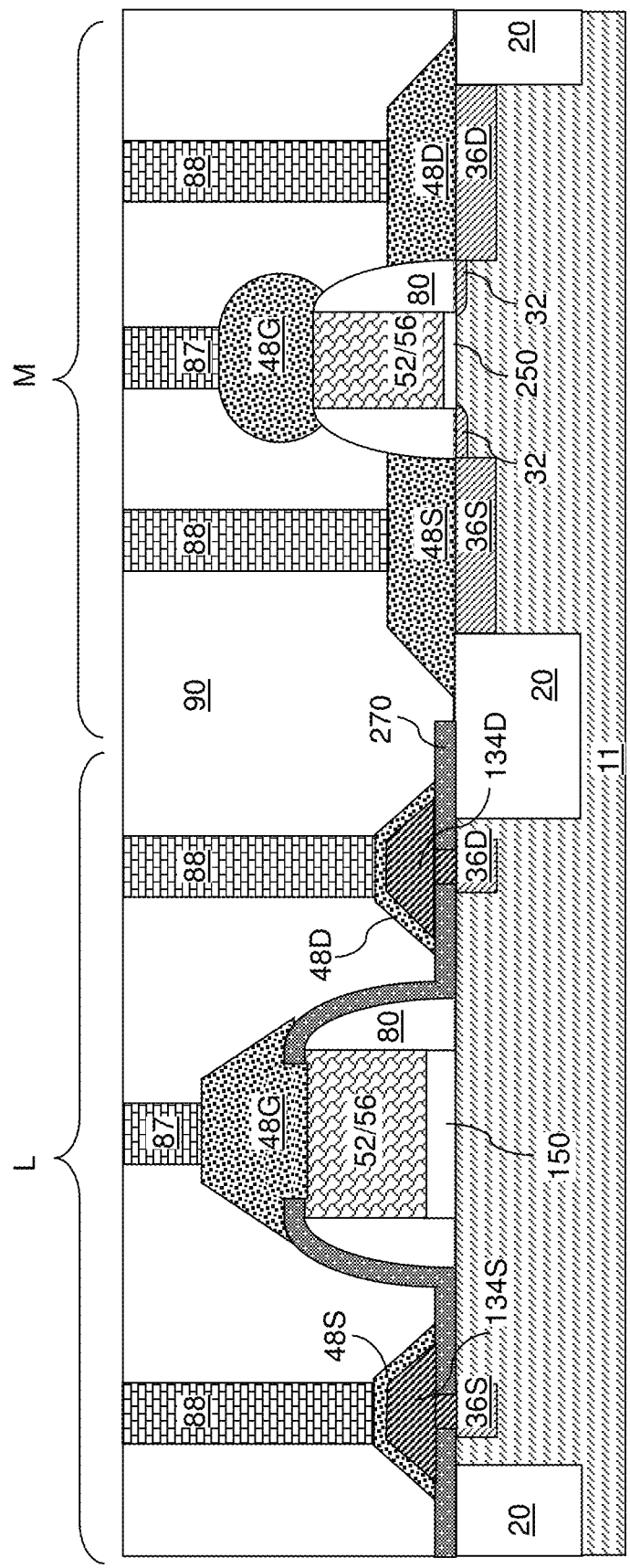
FIG. 40 is a vertical cross-sectional view of another alternative configuration of the third exemplary structure.

Referring to FIG. 40, a third alternative configuration of the third exemplary structure is illustrated, in which portions of the raised source region 134S and the second raised drain region 134D are retained under the first source-side metal-semiconductor alloy portion 48S and the first drain-side metal-semiconductor alloy portion 48D in the first device region L, while the raised source/drain regions 134 in the second device region M, and the raised gate regions 156 in both device regions L and M are entirely consumed during formation of the respective metal-semiconductor alloy portions 48 (i.e., 48S, 48D, 48G).

Figure 41:
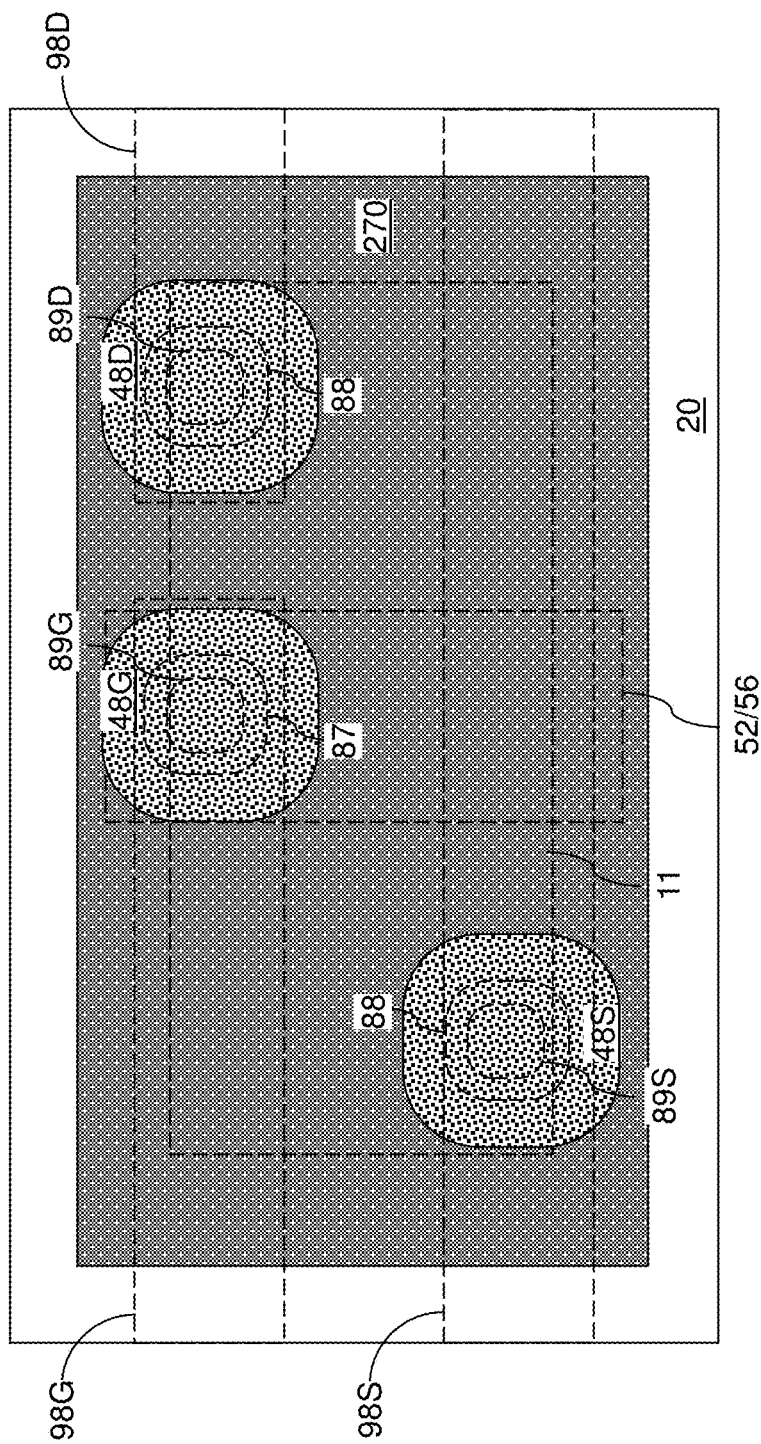
FIG. 41 is a first exemplary layout for the third exemplary structure according to an embodiment of the present disclosure.

FIG. 41 is a first exemplary layout for the third exemplary structure according to an embodiment of the present disclosure. The first dielectric capping mask 270 can have a source-side opening 89S through which a raised source region 134S or a source-side metal-semiconductor alloy portion 48S vertically extends, and can have a drain-side opening 89D through which a raised drain region 134D or a drain-side metal-semiconductor alloy portion 48D vertically extends. Further, the first dielectric capping mask 270 can have gate opening 89G through which a raised gate region 156 or a gate-side metal-semiconductor alloy portion 48G vertically extends.

Active region contact via structures 88 can contact a respective one of the source-side metal-semiconductor alloy portion 48S and the drain-side metal-semiconductor alloy portion 48D. A gate contact via structure 87 can contact the gate-side metal-semiconductor alloy portion 48G. A line-level dielectric layer can be formed over the contact-level dielectric layer 90, and a gate connection line 98G can be formed on a top surface of the gate contact via structure 87, a source connection line 98S can be formed on a top surface of a source-side active region contact via structure 88, and a drain connection line 98D can be formed on a top surface of a drain-side active region contact via structure 88.

Figure 42:
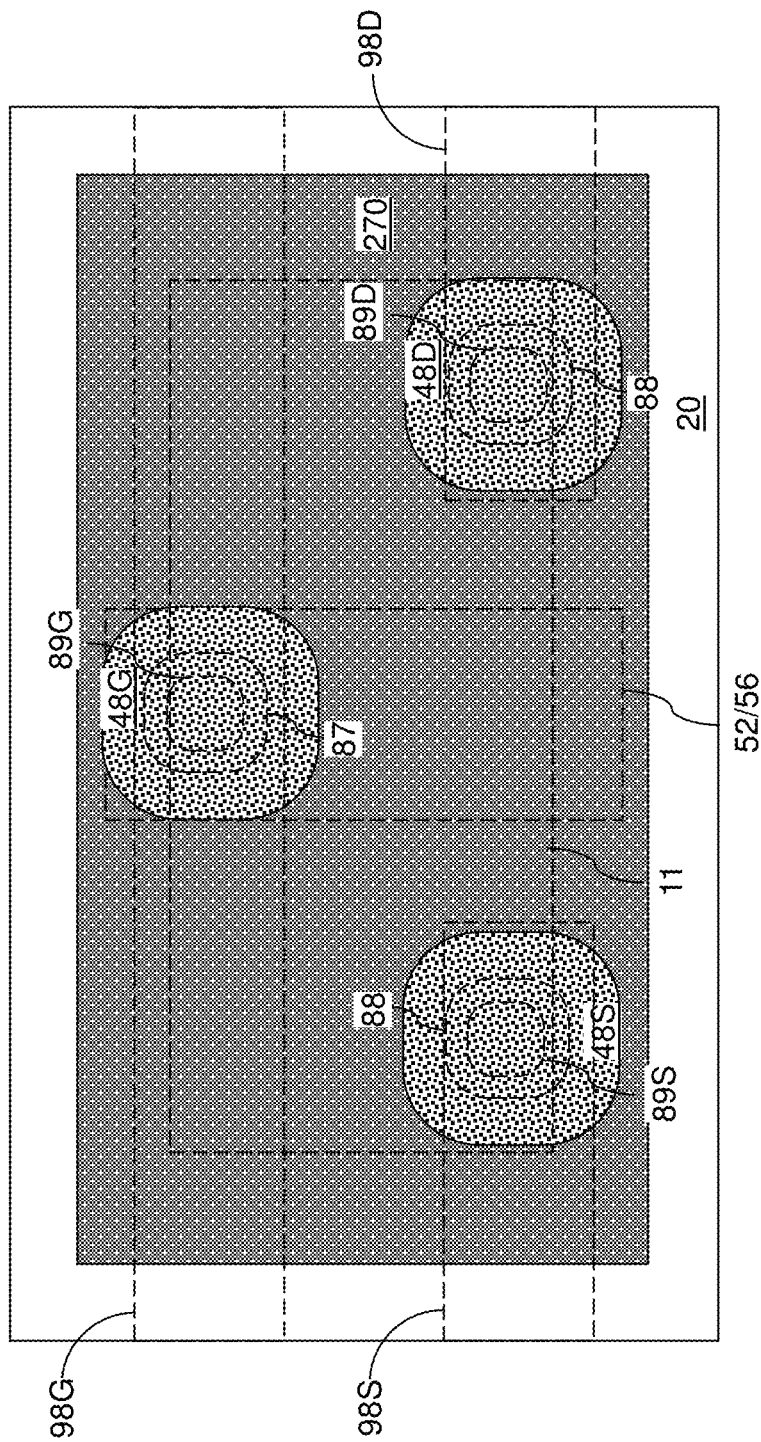
FIG. 42 is a second exemplary layout for the third exemplary structure according to an embodiment of the present disclosure.

FIG. 42 is a second exemplary layout for the third exemplary structure according to an embodiment of the present disclosure. The second exemplary layout can be derived from the first exemplary layout by changing positions and sizes of the contact via structures (87, 88) and the gate connection line 98G, the source connection line 98S, and the drain connection line 98D.

Figure 43A:
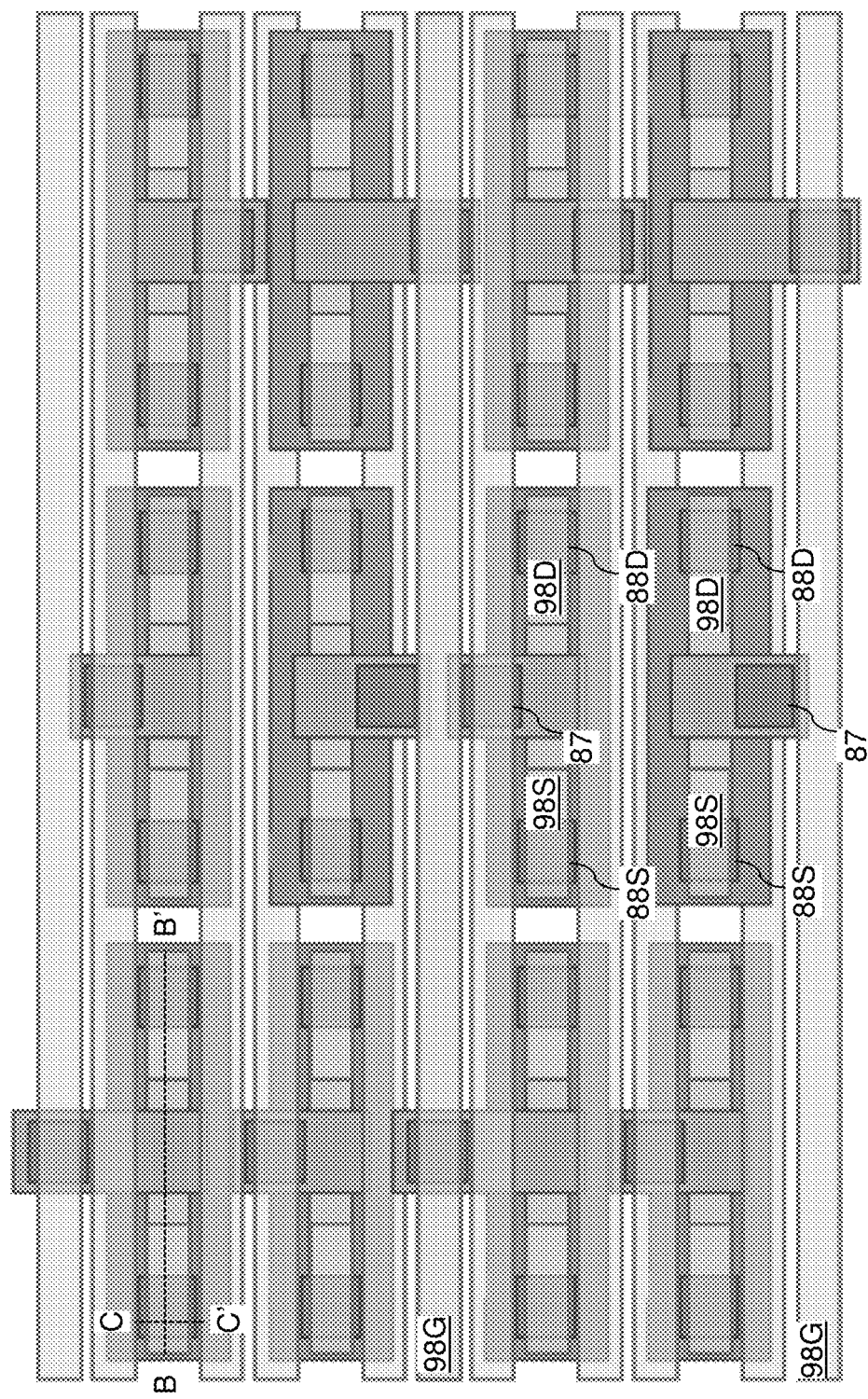
FIG. 43A is a third exemplary layout for the third exemplary structure according to an embodiment of the present disclosure.
Figure 43B:
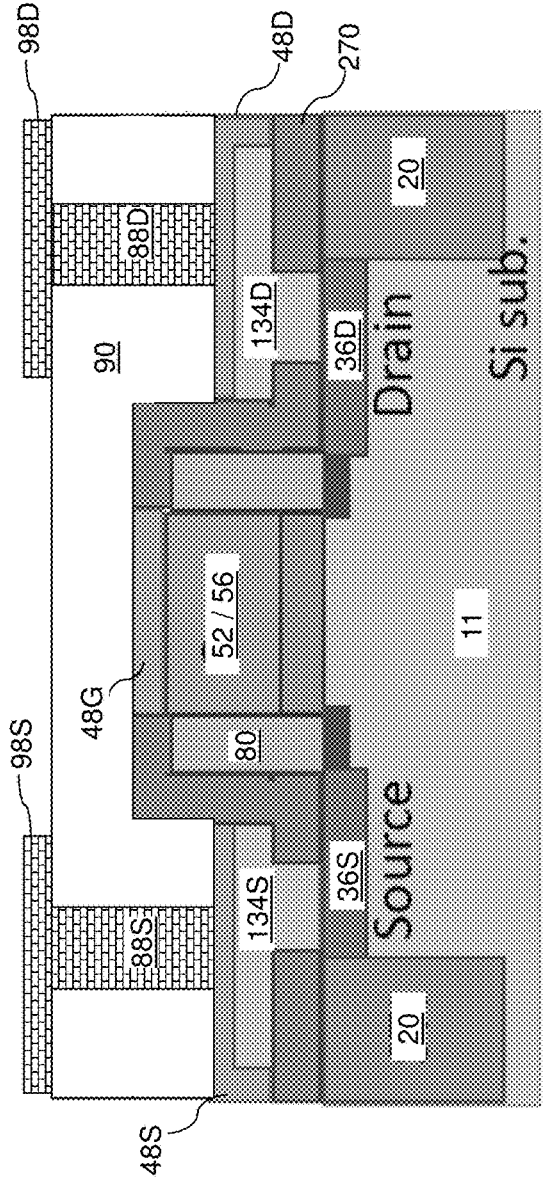
FIGS. 43B and 43C are respective vertical cross-sectional views along lines B-B' and C-C' in FIG. 43A.
Figure 43C:
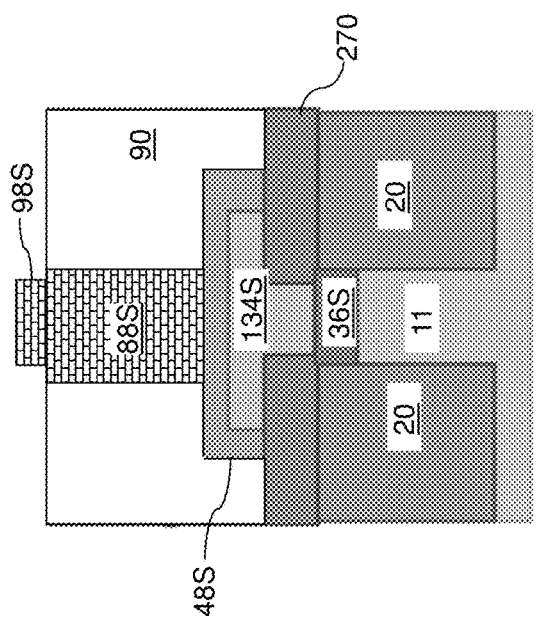

FIG. 43A is a third exemplary layout for the third exemplary structure according to an embodiment of the present disclosure. FIGS. 43B and 43C are respective vertical cross-sectional views along lines B-B' and C-C' in FIG. 43A. In the third exemplary layout, multiple instances of the first exemplary layout or the second exemplary layout may be repeated along two horizontal directions to provide a two-dimensional array sharing common gate connection lines 98G. Source and drain contact via structures (88S, 88D) can contact a respective one of the source-side metal-semiconductor alloy portion 48S and the drain-side metal-semiconductor alloy portion 48D.

A unit cell may be rotated as needed to provide a more compact layout. Alternative layouts may also be employed.

Referring to all drawings and according to various embodiments of the present disclosure, a semiconductor structure including a first field effect transistor is provided. The first field effect transistor comprises: a first doped well 11 located within a substrate and embedding a first buried source region 36S and a first buried drain region 36D; a first gate dielectric 150 and a first gate electrode (52, 56) overlying the first doped well 11; a dielectric capping mask 270 including a vertically-extending portion that laterally surrounds the first gate electrode (52, 56), a top portion that overlies a peripheral region of a top surface of the first gate electrode (52, 56), and a horizontally-extending portion that contacts a top surface of the first doped well 11 and comprises a source-side opening 89S overlying the first buried source region 36S and a drain-side opening 89D overlying the first buried drain region 36D; a first source-side metal-semiconductor alloy portion 48S electrically connected to the first buried source region 36S, and having a larger horizontal cross-sectional area than the first buried source region 36S; and a first drain-side metal-semiconductor alloy portion 48D electrically connected to the first buried drain region 36D, and having a larger horizontal cross-sectional area than the first buried drain region 36D.

In one embodiment, the first field effect transistor further comprises: a first raised source region 134S contacting a top surface of the first buried source region 36S and comprising a portion located within the source-side opening 89S; and a first raised drain region 134D contacting a top surface of the first buried drain region 36D and comprising a portion located within the drain-side opening 89D.

In one embodiment, the first doped well 11 comprises a first single crystalline semiconductor material; the first buried source region 36S and the first buried drain region 36D comprise a second single crystalline semiconductor material and are epitaxially aligned to the first single crystalline semiconductor material; and the first raised source region 134S and the first raised drain region 134D comprise a third single crystalline semiconductor material and are epitaxially aligned to the first buried source region 36S or the first buried drain region 36D.

In one embodiment, a horizontal interface between the first raised source region 134S and the first buried source region 36S and a horizontal interface between the first raised drain region 134D and the first buried drain region 36D are located within a horizontal plane including a top surface of the first doped well 11.

In one embodiment, the first raised source region 134S comprises a horizontally-extending portion contacting a first segment of a top surface of the horizontally-extending portion of the dielectric capping mask 270; and the first raised drain region 134D comprises a horizontally-extending portion contacting a second segment of the top surface of the horizontally-extending portion of the dielectric capping mask 270.

In one embodiment, the raised source region 134S has a larger horizontal cross-sectional area than the first buried source region 36S; the raised drain region 134D has a larger horizontal cross-sectional area than the first buried drain region 36D; a top periphery of the first buried source region 36S is located entirely within a periphery of the first raised source region 134S in a plan view along a direction that is perpendicular to a top surface of the substrate; and a top periphery of the first buried drain region 36D is located entirely within a periphery of the first raised drain region 134D.

In one embodiment, a shallow trench isolation structure 20 can laterally surround a portion of the first doped well 11. At least one of the first source-side metal-semiconductor alloy portion 48S, the first drain-side metal-semiconductor alloy portion 48D, the first raised source region 134S or the first raised drain region 134D comprises a portion having an areal overlap with the shallow trench isolation structure 20 in the plan view.

In one embodiment, each of the first source-side metal-semiconductor alloy portion 48S and the first drain-side metal-semiconductor alloy portion 48D comprises a central region that is vertically spaced from the horizontally-extending portion of the dielectric capping mask layer 270, and comprises a peripheral region contacting a respective annular surface segment of the top surface of the dielectric capping mask layer 270.

In one embodiment, the first source-side metal-semiconductor alloy portion 48S comprises a portion located within the source-side opening 89S and contacting the first buried source region 36S; and the first drain-side metal-semiconductor alloy portion 48D comprises a portion located within the drain-side opening 89D and contacting the first buried drain region 36D.

In one embodiment, the semiconductor structure includes a second field effect transistor that comprises: a second buried source region 36S and a second buried drain region 36D embedded within the first doped well 11 or a second doped well 12 and having top surfaces within a horizontal plane that includes top surface of the first buried source region 36S and the first buried drain region 36D; a second source-side metal-semiconductor alloy portion 48S electrically connected to the second buried source region 36S and overlying the second buried source region 36S; and a second drain-side metal-semiconductor alloy portion 48D electrically connected to the second buried drain region 36D and overlying the second buried drain region 36D. In one embodiment, an entirety of a top surface of the second buried source region 36S contacts a raised source region 134S or the second source-side metal-semiconductor alloy portion 48S; and an entirety of a top surface of the second buried drain region 36D contacts a raised drain region 134D or the second drain-side metal-semiconductor alloy portion 48D.

The various embodiments of the present disclosure can be employed to provide self-aligned metal-semiconductor alloy portions (48S, 48D) that minimize overlay error between the various source/drain regions and the metal-semiconductor alloy portions (48S, 48D), and reduces the device area.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure including a first field effect transistor, the first field effect transistor comprising:
    a first doped well located within a substrate and embedding a first source region and a first drain region;
    a first gate dielectric, a first gate electrode, and a dielectric capping mask overlying the first doped well, wherein the dielectric capping mask comprises a vertically-extending portion that laterally surrounds the first gate electrode, a top portion that overlies a peripheral region of a top surface of the first gate electrode, and a horizontally-extending portion that contacts a top surface of the first gate dielectric outside an area of the first gate electrode;
    a source-side opening extending through the first gate dielectric and the horizontally-extending portion of the dielectric capping mask and overlying the first source region;
    a drain-side opening extending through the first gate dielectric and the horizontally-extending portion of the dielectric capping mask and overlying the first drain region;
    a first source-side metal-semiconductor alloy portion contacting a top surface of the first source region and located within the source-side opening; and
    a first drain-side metal-semiconductor alloy portion contacting a top surface of the first drain region and located within the drain-side opening.

2. The semiconductor structure of claim 1, wherein the first field effect transistor further comprises:
    a source-side dielectric spacer located at a peripheral portion of the first source-side opening, wherein the first source-side metal-semiconductor alloy portion is laterally bounded by an inner sidewall of the source-side dielectric spacer; and
    a drain-side dielectric spacer located at a peripheral portion of the first drain-side opening, wherein the first drain-side metal-semiconductor alloy portion is laterally bounded by an inner sidewall of the drain-side dielectric spacer.

3. The semiconductor structure of claim 2, wherein the first field effect transistor further comprises:
    a second doped well laterally surrounding and forming a p-n junction at an interface with the first doped well;
    a well contact semiconductor region overlying the second doped well; and
    a well contact metal-semiconductor alloy portion contacting the well contact semiconductor region.

4. The semiconductor structure of claim 3, wherein:
    the first field effect transistor further comprises a well contact dielectric spacer located on an outer sidewall of the first gate dielectric; and
    the well contact metal-semiconductor alloy portion contacts the well contact dielectric spacer.

5. The semiconductor structure of claim 4, wherein:
    the well contact dielectric spacer, the source-side dielectric spacer, and the drain-side dielectric spacer have a same material composition and a same lateral thickness;
    the first source-side metal-semiconductor alloy portion comprises platinum nickel silicide; and
    the first drain-side metal-semiconductor alloy portion comprises platinum nickel silicide.

6. The semiconductor structure of claim 2, wherein:
    the top portion of the dielectric capping mask comprises an opening within an area of the first gate electrode;
    an annular dielectric spacer contacts a sidewall of the opening within the top portion of the dielectric capping mask; and
    a first gate metal-semiconductor alloy portion is located on a top surface of the first gate electrode and is laterally bounded by the annular dielectric spacer.

7. The semiconductor structure of claim 1, wherein:
    an outer sidewall of the first gate dielectric is vertically coincident with an outer sidewall of the dielectric capping mask;
    a first inner sidewall of the first gate dielectric laterally surrounds the source-side opening and is vertically coincident with a first inner sidewall of the dielectric capping mask; and a second inner sidewall of the first gate dielectric laterally surrounds the drain-side opening and is vertically coincident with a second inner sidewall of the dielectric capping mask.

8. The semiconductor structure of claim 1, further comprising a second field effect transistor that comprises:
- a second doped well located within the substrate and embedding a second source region and a second drain region;
- a second gate dielectric, a second gate electrode, and a sidewall spacer overlying the second doped well;
- a dielectric spacer laterally surrounding the sidewall spacer;
- a second source-side metal-semiconductor alloy portion contacting a top surface of the second source region and contacting the dielectric spacer; and
- a second drain-side metal-semiconductor alloy portion contacting a top surface of the second drain region and contacting the dielectric spacer.

* * * * *